(12) United States Patent
Song

(10) Patent No.: US 12,248,762 B2
(45) Date of Patent: Mar. 11, 2025

(54) PROCESSING-IN-MEMORY (PIM) DEVICES

(71) Applicant: SK hynix Inc., Icheon-si (KR)

(72) Inventor: Choung Ki Song, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 1020 days.

(21) Appl. No.: 17/145,761

(22) Filed: Jan. 11, 2021

(65) Prior Publication Data

US 2021/0223996 A1  Jul. 22, 2021

Related U.S. Application Data

(63) Continuation-in-part of application No. 17/090,462, filed on Nov. 5, 2020, now Pat. No. 11,537,323.

(60) Provisional application No. 62/959,574, filed on Jan. 10, 2020, provisional application No. 62/959,593, filed on Jan. 10, 2020, provisional application No. 62/958,223, filed on Jan. 7, 2020.

(30) Foreign Application Priority Data

Jan. 17, 2020   (KR) ........................ 10-2020-0006902

(51) Int. Cl.
G06F 7/544       (2006.01)
(52) U.S. Cl.
CPC .................. *G06F 7/5443* (2013.01)
(58) Field of Classification Search
CPC ............... G06F 7/5443; G06F 17/16
See application file for complete search history.

(56) References Cited

U.S. PATENT DOCUMENTS

| 10,042,639 | B2 | 8/2018 | Gopal et al. | |
|---|---|---|---|---|
| 2007/0112446 | A1* | 5/2007 | Deveaux | G06F 8/60 700/83 |
| 2018/0121796 | A1 | 5/2018 | Deisher et al. | |
| 2019/0096453 | A1 | 3/2019 | Shin et al. | |
| 2020/0110705 | A1* | 4/2020 | Jo | G06F 12/0877 |
| 2020/0193277 | A1 | 6/2020 | Kwon | |
| 2020/0294575 | A1 | 9/2020 | O et al. | |
| 2021/0382691 | A1* | 12/2021 | Kim | G11C 7/1012 |

(Continued)

FOREIGN PATENT DOCUMENTS

| KR | 1020170097633 A | 8/2017 |
|---|---|---|
| KR | 1020190080120 A | 7/2019 |
| KR | 1020200066953 A | 6/2020 |

OTHER PUBLICATIONS

J. L. Hennessy and D. A. Patterson, Computer Architecture, Fifth Edition: A Quantitative Approach, 5th ed. San Francisco, CA, USA : Morgan Kaufmann Publishers Inc., 2011, p. 12. (Year: 2011).*

(Continued)

*Primary Examiner* — Michael D. Yaary
(74) *Attorney, Agent, or Firm* — WILLIAM PARK & ASSOCIATES LTD.

(57) ABSTRACT

A processing-in-memory device includes a data storage region and an arithmetic circuit. The data storage region includes a first memory bank in which first data is divided into a first portion and a second portion and stored, and a second memory bank in which second data is divided into a first portion and a second portion and stored. The arithmetic circuit performs multiplication/accumulation operations on the first data and the second data and outputs final MAC result data.

21 Claims, 49 Drawing Sheets

(56) References Cited

U.S. PATENT DOCUMENTS

2022/0164297 A1* 5/2022 Sity .................... G06F 12/0802

OTHER PUBLICATIONS

B. Xia, P. Liu, Q. Yao, "New method for high performance multiply-accumulator design", J. Zhejiang Univ. Sci. A 10(7), 2009, pp. 1067-1074. (Year: 2009).*
N.a., "Understanding Synchronous Dual-Port RAMs", Cypress Semiconductor Corporation, 2017, pp. 1-10. (Year: 2017).*

* cited by examiner

PROCESSING-IN-MEMORY (PIM) DEVICES

CROSS-REFERENCE TO RELATED APPLICATIONS

This is a continuation-in-part of U.S. patent application Ser. No. 17/090,462, filed Nov. 5, 2020, which claims the priority of provisional application No. 62/958,223, filed on Jan. 7, 2020, and Korean Application No. 10-2020-0006902, filed on Jan. 17, 2020, which are incorporated herein by reference in their entirety. This application also claims the priority of provisional application No. 62/959,574, filed on Jan. 10, 2020, and provisional application No. 62/959,593, filed on Jan. 10, 2020 which are incorporated herein by references in their entirety.

BACKGROUND

1. Technical Field

Various embodiments of the present disclosure relate to processing-in-memory (PIM) devices and, more particularly, to PIM devices performing a deterministic arithmetic operation.

2. Related Art

Recently, interest in artificial intelligence (AI) has been increasing not only in the information technology industry but also in the financial and medical industries. Accordingly, in various fields, artificial intelligence, more precisely, the introduction of deep learning, is considered and prototyped. One of backgrounds or causes of this widespread interest may be due to the improved performance of a processor performing arithmetic operations. To improve the performance of the artificial intelligence, t may be necessary to increase the number of layers constituting a neural network in the artificial intelligence to educate the artificial intelligence. This trend has continued in recent years, which has led to an exponential increase in the amount of computations required for the hardware that actually does the computations. Moreover, if the artificial intelligence employs a general hardware system including a memory and a processor which are separated from each other, the performance of the artificial intelligence may be degraded due to limitation of the amount of data communication between the memory and the processor. In order to solve this problem, a PIM device in which a processor and memory are integrated in one semiconductor chip has been used as a neural network computing device. Because the PIM device directly performs arithmetic operations in the PIM device, a data processing speed in the neural network may be improved.

SUMMARY

A processing-in-memory (PIM) device according to an aspect of the present disclosure may include a data storage region and an arithmetic circuit. The data storage region may include a first memory bank in which first data is divided into a first portion and a second portion and stored, and a second memory bank in which second data is divided into a first portion and a second portion and stored. The arithmetic circuit may be configured to perform multiplication/accumulation (MAC) operations on the first data and the second data and output final MAC result data. The arithmetic circuit may include a first multiplication-addition circuit configured to perform a first multiplication-addition operation on the first portion of the first data and the first portion of the second data to output first multiplication addition data, a second multiplication-addition circuit configured to perform a second multiplication-addition operation on the second portion of the first data and the second portion of the second data to output second multiplication addition data, and an adder configured to add the first multiplication addition data from the first multiplication-addition circuit and the second multiplication addition data from the second multiplication-addition circuit.

A processing-in-memory (PIM) device according to another aspect of the present disclosure may include a plurality of storage regions and a plurality of multiplication/accumulation (MAC) operators. The plurality of storage regions may include a first group of storage regions providing first data and a second group of storage regions providing second data. Each of the plurality of multiplication/accumulation (MAC) operators may be configured to perform MAC operations on the first data and the second data. A first storage region that is one of the first group of storage regions, a second storage region that is one of the second group of storage regions, and a first MAC operator that is one of the MAC operators may constitute a MAC unit. The first storage region may include a first left bank storing a first portion of the first data composed of the first portion and a second portion, and a first right bank storing the second portion of the first data. The second storage region may include a second left bank storing a first portion of the second data composed of the first portion and a second portion, and a second right bank storing the second portion of the second data. The first MAC operator may include a first multiplication-addition circuit configured to perform a first multiplication-addition operation on the first portion of the first data and the first portion of the second data to output first multiplication addition data, a second multiplication-addition circuit configured to perform a second multiplication-addition operation on the second portion of the first data and the second portion of the second data to output second multiplication addition data, an adder configured to add the first multiplication addition data from the first multiplication-addition circuit and the second multiplication addition data from the multiplication-addition to output third multiplication addition data, and an accumulator configured to accumulate and add the third multiplication addition data from the adder to output final MAC result data.

A processing-in-memory (PIM) device according to another aspect of the present disclosure may include a plurality of storage regions including a first group of storage regions providing first data and a second group of storage regions providing second data, and a plurality of multiplication/accumulation (MAC) operators performing MAC operations on the first data and the second data. A first storage region that is one of the first group of storage regions, a second storage region that is one of the second group of storage regions, and a first MAC operator that is one of the MAC operators may constitute a MAC unit. The first storage region may include a first left bank storing a first portion of the first data composed of the first portion and a second portion, and a first right bank storing the second portion of the first data. The second storage region may include a second left bank storing a first portion of the second data composed of the first portion and a second portion, and a second right bank storing the second portion of the second data. The first left bank and the second left bank are positioned in a first region, and the first right bank and the second right bank are positioned in a second region separated from the first region. The first MAC operator may include a first multiplication-addition circuit positioned in the first region and configured to output first multiplication addition data generated by performing a first multiplication-addition operation on the first portion of the first data and the first portion of the second data, a second multiplication-addition circuit positioned in the second region and configured to output second multiplication addition data generated by performing a second multiplication-addition operation on the second portion of the first data and the second portion of the second data, an adder positioned in the first region and configured to add the first multiplication addition data from the first multiplication-addition circuit and the second multiplication addition data from the second multiplication-addition circuit to output third multiplication addition data, and an accumulator positioned in the first region and configured to accumulate and add the third multiplication addition data from the adder to output final MAC result data.

A processing-in-memory (PIM) device according to another aspect of the present disclosure may include a data storage region configured to include a memory bank including a left bank storing a first portion of first data composed of the first portion and a second portion and a right bank storing the second portion of the first data, a first global buffer storing a first portion of second data composed of the first portion and a second portion, and a second global buffer storing the second portion of the second data, and an arithmetic circuit configured to perform a multiplication/accumulation (MAC) operation on the first data and the second data to output a MAC operation result. The arithmetic circuit may include a first multiplication-addition circuit configured to perform a first multiplication-addition operation on the first portion of the first data and the first portion of the second data to output first multiplication addition data, a second multiplication-addition circuit configured to perform a second multiplication-addition operation on the second portion of the first data and the second portion of the second data to output second multiplication addition data, an adder configured to add the first multiplication addition data from the first multiplication-addition circuit and the second multiplication addition data from the multiplication-addition to output third multiplication addition data, and an accumulator configured to accumulate and add the third multiplication addition data from the adder to output final MAC result data.

A processing-in-memory (PIM) device according to another aspect of the present disclosure may include a plurality of memory banks configured to include a left bank storing a first portion of first data composed of the first portion and a second portion and a right bank storing the second portion of the first data, a first global buffer configured to store a first portion of second data composed of the first portion and a second portion, a second global buffer configured to store the second portion of the second data, and a plurality of multiplication/accumulation (MAC) operators configured to perform a MAC operation on the first data and the second data. A first memory bank that is one of the memory banks and a first MAC operator that is one of the MAC operators may constitute a MAC unit. The left bank may be positioned in a first region, and the right bank may be positioned in a second region separated from the first region. The first MAC operator may include a first multiplication-addition circuit configured to perform a first multiplication-addition operation on the first portion of the first data and the first portion of the second data to output first multiplication addition data, a second multiplication-addition circuit configured to perform a second multiplication-addition operation on the second portion of the first data and the second portion of the second data to output second multiplication addition data, an adder configured to add the first multiplication addition data from the first multiplication-addition circuit and the second multiplication addition data from the multiplication-addition to output third multiplication addition data, and an accumulator configured to accumulate and add the third multiplication addition data from the adder to output final MAC result data.

A processing-in-memory (PIM) device according to another aspect of the present disclosure may include a data storage region in which first data and second data are separated into a first portion and a second portion, respectively, and stored, and an arithmetic circuit configured to perform multiplication/accumulation (MAC) operations on the first data and the second data. The arithmetic circuit may include a first MAC operator performing a first MAC operation on the first portion of the first data and the first portion of the second data to output first MAC result data, a second MAC operator performing a second MAC operation on the second portion of the first data and the second portion of the second data to output second MAC result data, and an addition circuit summing the first MAC result data from the first MAC operator and the second MAC result data from the second MAC operator to output third MAC result data.

BRIEF DESCRIPTION OF THE DRAWINGS

Certain features of the disclosed technology are illustrated by various embodiments with reference to the attached drawings.

DETAILED DESCRIPTION

In the following description of embodiments, it will be understood that the terms "first" and "second" are intended to identify elements, but not used to define a particular number or sequence of elements. In addition, when an element is referred to as being located "on," "over," "above," "under," or "beneath" another element, it is intended to mean relative positional relationship, but not used to limit certain cases for which the element directly contacts the other element, or at least one intervening element is present between the two elements. Accordingly, the terms such as "on," "over," "above," "under," "beneath," "below," and the like that are used herein are for the purpose of describing particular embodiments only and are not intended to limit the scope of the present disclosure. Further, when an element is referred to as being "connected" or "coupled" to another element, the element may be electrically or mechanically connected or coupled to the other element directly, or may be electrically or mechanically connected or coupled to the other element indirectly with one or more additional elements between the two elements. Moreover, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed. A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage may correspond to a signal having a logic "low" level. In an embodiment, the logic "high" level may be set as a voltage level which is higher than a voltage level of the logic "low" level. Meanwhile, logic levels of signals may be set to be different or opposite according to embodiment. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Various embodiments are directed to processing-in-memory (PIM) devices which are capable of performing a deterministic arithmetic operation at a high speed.

Figure 1:
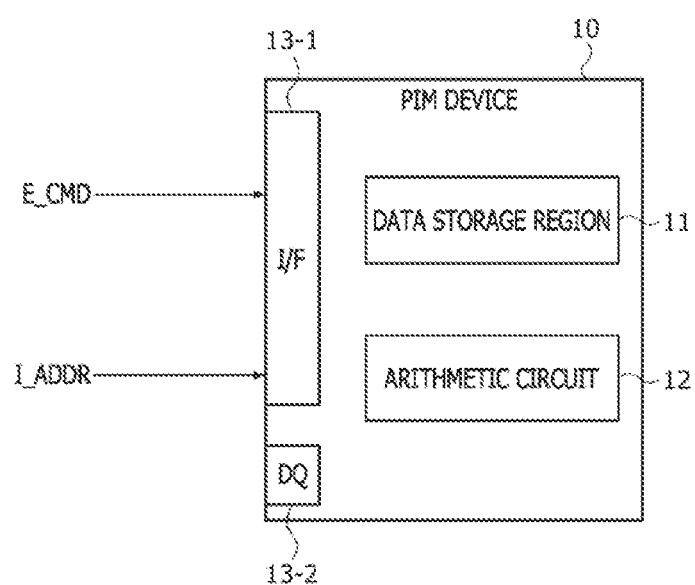
FIG. 1 is a block diagram illustrating a PIM device according to an embodiment of the present disclosure.

FIG. 1 is a block diagram illustrating a PIM device according to an embodiment of the present disclosure. As illustrated in FIG. 1, the PIM device 10 may include a data storage region 11, an arithmetic circuit 12, an interface (I/F) 13-1, and a data (DQ) input/output (I/O) pad 13-2. The data storage region 11 may include a first storage region and a second storage region. In an embodiment, the first storage region and the second storage region may be a first memory bank and a second memory bank, respectively. In another embodiment, the first data storage region and the second storage region may be a memory bank and buffer memory, respectively. The data storage region 11 may include a volatile memory element or a non-volatile memory element. For an embodiment, the data storage region 11 may include both a volatile memory element and a non-volatile memory element.

The arithmetic circuit 12 may perform an arithmetic operation on the data transferred from the data storage region 11. In an embodiment, the arithmetic circuit 12 may include a multiplying-and-accumulating (MAC) operator. The MAC operator may perform a multiplying calculation on the data transferred from the data storage region 11 and perform an accumulating calculation on the multiplication result data. After MAC operations, the MAC operator may output MAC result data. The MAC result data may be stored in the data storage region 11 or output from the PIM device 10 through the data I/O pad 13-2. In an embodiment, the arithmetic circuit 12 may perform additional operations, for example a bias addition operation and an active function operation, for a neural network calculation, for example, an arithmetic operation in a deep learning process. In another embodiment, the PIM device 10 may include a bias addition circuit and active function circuit separated from the arithmetic circuit 12.

The interface 13-1 of the PIM device 10 may receive an external command E_CMD and an input address I_ADDR from an external device. The external device may denote a host or a PIM controller coupled to the PIM device 10. Hereinafter, it may be assumed that the external command E_CMD transmitted to the PIM device 10 is a command requesting the MAC arithmetic operation. That is, the PIM device 10 may perform a MAC arithmetic operation in response to the external command E_CMD. The data I/O pad 13-2 of the PIM device 10 may function as a data communication terminal between a device external to the PIM device 10, for example the PIM controller or a host located outside the PIM system 1. Accordingly, data outputted from the host or the PIM controller may be inputted into the NM device 10 through the data I/O pad 13-2. Also, data outputted from the PIM device 10 may be inputted to the host or the PIM controller through the data I/O pad 13-2.

Figure 2:
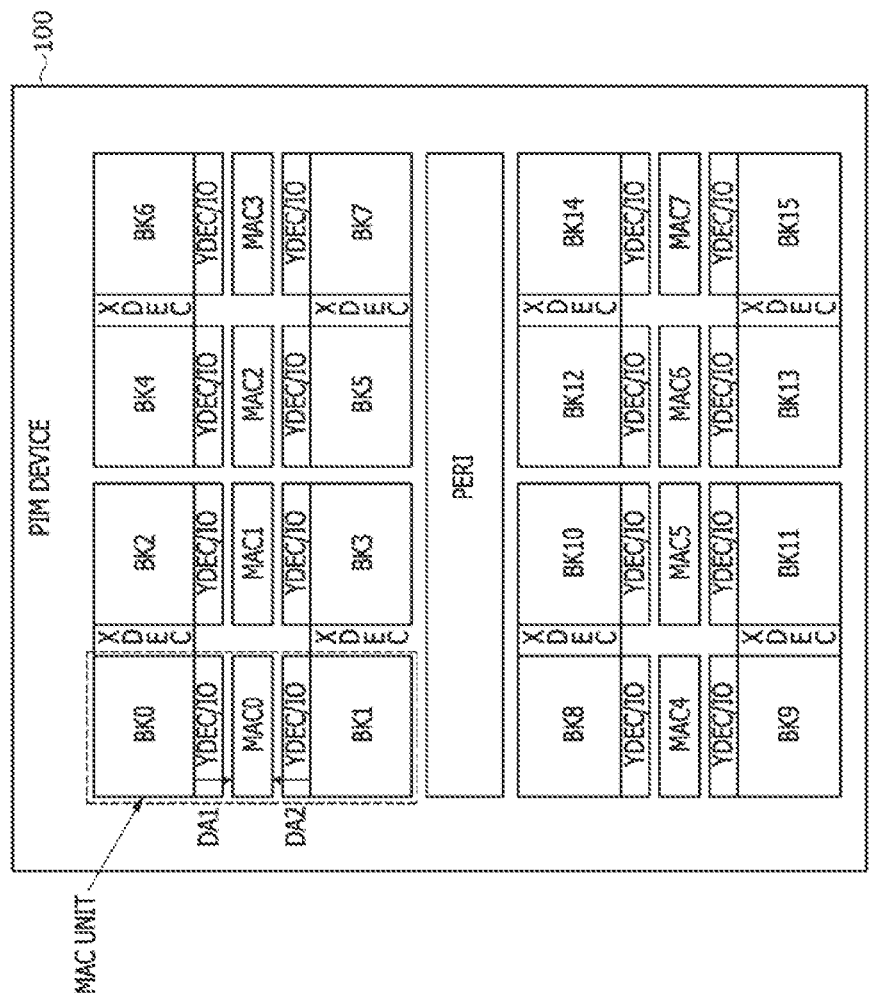
FIG. 2 is a schematic diagram illustrating a disposal structure between memory banks and multiplication/accumulation (MAC) operators included in a PIM device according to a first embodiment of the present disclosure.

In an embodiment, the PIM device 10 may operate in a memory mode or a MAC arithmetic mode. In the event that the PIM device 10 operates in the memory mode, the PIM device 10 may perform a data read operation or a data write operation for the data storage region 11. In the event that the PIM device 10 operates in the MAC arithmetic mode, the arithmetic circuit 12 of the PIM device 10 may receive first data and second data from the data storage region 11 to perform the MAC arithmetic operation. In the event that PIM device 10 operates in the MAC arithmetic mode, the PIM device 10 may also perform the data write operation for the data storage region 11 to execute the MAC arithmetic operation. The MAC arithmetic operation may be a deterministic arithmetic operation performed during a predetermined fixed time. The word "predetermined" as used herein with respect to a parameter, such as a predetermined fixed time or time period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm, FIG. 2 illustrates a disposal structure indicating placement of memory banks BK0, ..., and BK15 and MAC operators MAC0, ..., and MAC7 included in a PIM device 100 according to an embodiment of the present disclosure. In an embodiment, the memory banks BK0, ..., and BK15 and the MAC operators MAC0, ..., and MAC7 may be included in the data storage region and the arithmetic circuit of the PIM device 10 of FIG. 1, respectively. Referring to FIG. 2, the PIM device 100 may include a data storage region and an arithmetic circuit. In an embodiment, the data storage region may include the memory banks BK0, ..., and BK15. Although the present embodiment illustrates an example in which the data storage region includes the memory banks BK0, ..., and BK15, the memory banks BK0, ..., and BK15 are merely examples which are suitable for the data storage region. In some embodiments, the memory banks BK0, ..., and BK15 may be a memory region corresponding to a volatile memory device, for example, a DRAM device. In an embodiment, each of the memory banks BK0, ..., and BK15 may be a component unit which is independently activated and may be configured to have the same data bus width as data I/O lines in the PIM device 100. In an embodiment, the memory banks BK0, ..., and BK15 may operate through interleaving such that an active operation of any one of the memory banks is performed in parallel while another memory bank is selected. Although the present embodiment illustrates an example in which the PIM device 100 includes the memory banks BK0, ..., and BK15, the number of the memory banks is not limited to 16 and may be different in different embodiments. Each of the memory banks BK0, ..., and BK15 may include at least one cell array which includes memory unit cells located at cross points of a plurality of rows and a plurality of columns. The memory banks BK0, ..., and BK15 may include a first group of memory banks (e.g., odd-numbered memory banks BK0, BK2, ..., and BK14) and a second group of memory banks (e.g., even-numbered memory banks BK1, BK3, ..., and BK15).

A core circuit may be disposed to be adjacent to the memory banks BK0, ..., and BK15. The core circuit may include X-decoders XDECs and Y-decoders/IO circuits YDEC/IOs. An X-decoder XDEC may also be referred to as a word line decoder or a row decoder. In an embodiment, two odd-numbered memory banks arrayed to be adjacent to each other in one row among the odd-numbered memory banks BK0, BK2, ..., and BK14 may share one of the X-decoders XDECs with each other. For example, the first memory bank BK0 and the third memory bank BK2 adjacent to each other in a first row may share one of the X-decoders XDECs, and the fifth memory bank BK4 and the seventh memory bank BK6 adjacent to each other in the first row may also share one of the X-decoders XDECs. Similarly, two even-numbered memory banks arrayed to be adjacent to each other in one row among the even-numbered memory banks BK1, BK3, ..., and BK15 may share one of the X-decoders XDECs with each other. For example, the second memory bank BK1 and the fourth memory bank BK3 adjacent to each other in a second row may share one of the X-decoders XDECs, and the sixth memory bank BK5 and the eighth memory bank BK7 adjacent to each other in the second row may also share one of the X-decoders XDECs. The X-decoder XDEC may receive a row address from an address latch included in a peripheral circuit PERI and may decode the row address to select and enable one of rows (i.e., word lines) coupled to the memory banks adjacent to the X-decoder XDEC.

The Y-decoders/IO circuits YDEC/Itis may be disposed to be allocated to the memory banks BK0, ..., and BK15, respectively. For example, the first memory bank BK0 may be allocated to one of the Y-decoders/IO circuits YDEC/IOs, and the second memory bank BK1 may be allocated to another one of the Y-decoders/IO circuits YDEC/IOs, Each of the Y-decoders/IO circuits YDEC/IOs may include a Y-decoder YDEC and an I/O circuit IO. The Y-decoder YDEC may also be referred to as a bit line decoder or a column decoder. The Y-decoder YDEC may receive a column address from an address latch included in the peripheral circuit PERI and may decode the column address to select and enable at least one of columns (i.e., bit lines) coupled to the selected memory bank. Each of the I/O circuits may include an I/O sense amplifier for sensing and amplifying a level of a read datum outputted from the corresponding memory bank during a read operation and a write driver for driving a write datum during a write operation for the corresponding memory bank.

In an embodiment, the arithmetic circuit may include MAC operators MAC0, ..., and MAC7. Although the present embodiment illustrates an example in which the MAC operators MAC0, . . . , and MAC7 are employed as the arithmetic circuit, the present embodiment may be merely an example of the present disclosure. For example, in some other embodiments, processors other than the MAC operators MAC0, and MAC7 may be employed as the arithmetic circuit. The MAC operators MAC0, . . . , and MAC7 may be disposed such that one of the odd-numbered memory banks BK0, BK2, . . . , and BK14 and one of the even-numbered memory banks BK1, BK3, . . . , and BK15 share any one of the MAC operators MAC0, . . . , and MAC7 with each other. Specifically, one odd-numbered memory bank and one even-numbered memory bank arrayed in one column to be adjacent to each other may constitute a pair of memory banks sharing one of the MAC operators MAC0, . . . , and MAC7 with each other. One of the MAC operators MAC0, . . . , and MAC7 and a pair of memory banks sharing the one MAC operator with each other will be referred to as 'a MAC unit' hereinafter.

In an embodiment, the number of the MAC operators MAC0, . . . , and MAC7 may be equal to the number of the odd-numbered memory banks BK0, BK2, . . . , and BK14 or the number of the even-numbered memory banks BK1, BK3, . . . , and BK15. The first memory bank BK0, the second memory bank BK1, and the first MAC operator MAC0 between the first memory bank BK0 and the second memory bank BK1 may constitute a first MAC unit. In addition, the third memory bank BK2, the fourth memory bank BK3, and the second MAC operator MAC1 between the third memory bank BK2 and the fourth memory bank BK3 may constitute a second MAC unit. The first MAC operator MAC0 included in the first MAC unit may receive first data DA1 outputted from the first memory bank BK0 included in the first MAC unit and second data DA2 outputted from the second memory bank BK1 included in the first MAC unit. In addition, the first MAC operator MAC0 may perform a MAC arithmetic operation of the first data DA1 and the second data DA2. In the event that the PIM device 100 performs a neural network calculation, for example, an arithmetic operation in a deep learning process, one of the first data DA1 and the second data DA2 may be weight data and the other may be vector data. A configuration of any one of the MAC operators MAC0~MAC7 will be described in more detail hereinafter.

In the PIM device 100, the peripheral circuit PERI may be disposed in a region other than an area in which the memory banks BK0, BK1, . . . , and BK15, the MAC operators MAC0, . . . , and MAC7, and the core circuit are disposed. The peripheral circuit PERI may include a control circuit and a transmission path for a command/address signal, a control circuit and a transmission path for input/output of data, and a power supply circuit. The control circuit for the command/address signal may include a command decoder for decoding a command included in the command/address signal to generate an internal command signal, an address latch for converting an input address into a row address and a column address, a control circuit for controlling various functions of row/column operations, and a control circuit for controlling a delay locked loop (DLL) circuit. The control circuit for the input/output of data in the peripheral circuit PERI may include a control circuit for controlling a read/write operation, a read/write buffer, and an output driver. The power supply circuit in the peripheral circuit PERI may include a reference power voltage generation circuit for generating an internal reference power voltage and an internal power voltage generation circuit for generating an internal power voltage from an external power voltage.

The PIM device 100 according to the present embodiment may operate in any one mode of a memory mode and a MAC arithmetic mode. In the memory mode, the PIM device 100 may operate to perform the same operations as general memory devices. The memory mode may include a memory read operation mode and a memory write operation mode. In the memory read operation mode, the PIM device 100 may perform a read operation for reading out data from the memory banks BK0, BK1, . . . , and BK15 to output the read data, in response to an external request. In the memory write operation mode, the PIM device 100 may perform a write operation for storing data provided by an external device into the memory banks BK0, BK1, . . . , and BK15, in response to an external request.

In the MAC arithmetic mode, the PIM device 100 may perform the MAC arithmetic operation using the MAC operators MAC0, . . . and MAC7. Specifically, the PIM device 100 may perform the read operation of the first data DA1 for each of the odd-numbered memory banks BK0, BK2, . . . , and BK14 and the read operation of the second data DA2 for each of the even-numbered memory banks BK1, BK3, . . . , and BK15, for the MAC arithmetic operation in the MAC arithmetic mode. In addition, each of the MAC operators MAC0, . . . , and MAC7 may perform the MAC arithmetic operation of the first data DA1 and the second data DA2 which are read out of the memory banks to store a result of the MAC arithmetic operation into the memory bank or to output the result of the MAC arithmetic operation. In some cases, the PIM device 100 may perform a data write operation for storing data to be used for the MAC arithmetic operation into the memory banks before the data read operation for the MAC arithmetic operation is performed in the MAC arithmetic mode.

The operation mode of the PIM device 100 according to the present embodiment may be determined by a command which is transmitted from a host or a controller to the PIM device 100. In an embodiment, if a first external command requesting a read operation or a write operation for the memory banks BK0, BK1, . . . , and BK15 is inputted to the PIM device 100, the PIM device 100 may perform the data read operation or the data write operation in the memory mode. Meanwhile, if a second external command requesting a MAC calculation corresponding to the MAC arithmetic operation is inputted to the PIM device 100, the PIM device 100 may perform the MAC arithmetic operation.

The PIM device 100 may perform a deterministic MAC arithmetic operation. The term "deterministic MAC arithmetic operation" used in the present disclosure may be defined as the MAC arithmetic operation performed in the PIM device 100 during a predetermined fixed time. Thus, the host or the controller may always predict a point in time (or a clock) when the MAC arithmetic operation terminates in the PIM device 100 at a point in time when an external command requesting the MAC arithmetic operation is transmitted from the host or the controller to the PIM device 100. No operation for informing the host or the controller of a status of the MAC arithmetic operation is required while the PIM device 100 performs the deterministic MAC arithmetic operation. In an embodiment, a latency during which the MAC arithmetic operation is performed in the PIM device 100 may be fixed for the deterministic MAC arithmetic operation.

Figure 3:
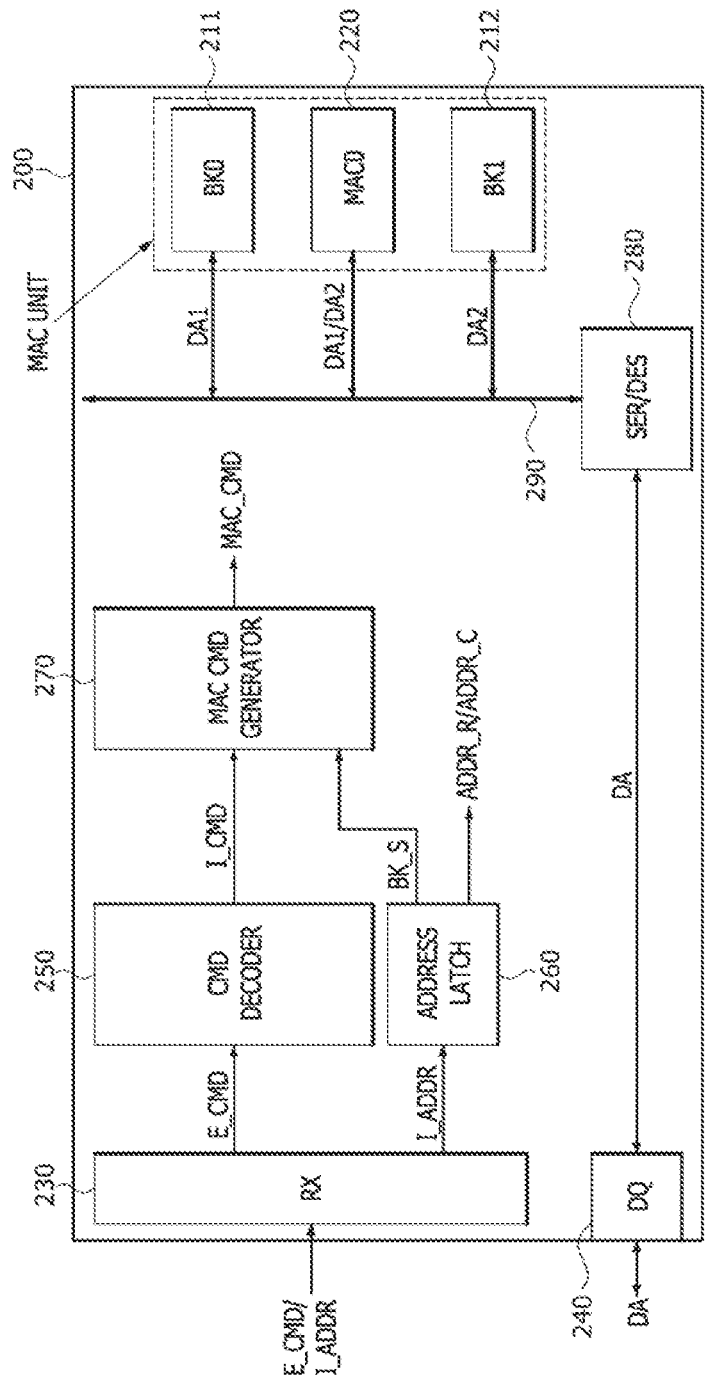
FIG. 3 is a block diagram illustrating a configuration of a PIM device according to the first embodiment of the present disclosure.
Figure 4:
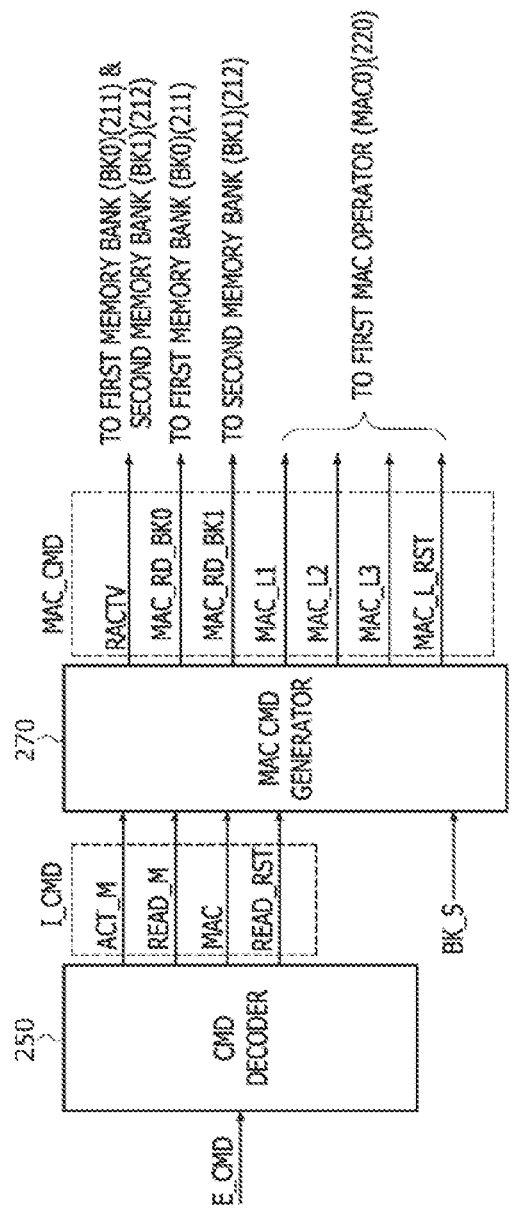
FIG. 4 illustrates internal command signals outputted from a command decoder and MAC command signals outputted from a MAC command generator in the PIM device of FIG. 3.

FIG. 3 is a block diagram illustrating a configuration of a PIM device 200 corresponding to the PIM device 100 illustrated in FIG. 3, and FIG. 4 illustrates an internal command signal I_CMD outputted from a command decoder 250 and a MAC command signal MAC_CMD outputted from a MAC command generator 270 included in the PIM device 200 of FIG. 3. FIG. 3 illustrates only the first memory bank (BK0) 211, the second memory bank (BK1) 212, and the first MAC operator (MAC0) 220 constituting the first MAC unit among the plurality of MAC units. However, FIG. 3 illustrates merely an example for simplification of the drawing. Accordingly, the following description for the first MAC unit may be equally applicable to the remaining MAC units. Referring to FIG. 3, the PIM device 200 may include a global I/O line (hereinafter, referred to as a 'GIO line') 290. The first memory bank (BK0) 211, the second memory bank (BK1) 212, and the first MAC operator (MAC0) 220 may communicate with each other through the GIO line 290. In an embodiment, the GIO line 290 may be disposed in the peripheral circuit PERI of FIG. 2.

The PIM device 200 may include a receiving driver (RX) 230, a data I/O circuit (DQ) 240, a command decoder 250, an address latch 260, a MAC command generator 270, and a serializer/deserializer (SER/DES) 280. The command decoder 250, the address latch 260, the MAC command generator 270, and the serializer/deserializer 280 may be disposed in the peripheral circuit PERI of the PIM device 100 illustrated in FIG. 2. The receiving driver 230 may receive an external command E_CMD and an input address I_ADDR from an external device. The external device may denote a host or a controller coupled to the PIM device 200. Hereinafter, it may be assumed that the external command E_CMD transmitted to the PIM device 200 is a command requesting the MAC arithmetic operation. That is, the PIM device 200 may perform the deterministic MAC arithmetic operation in response to the external command E_CMD. The data I/O circuit 240 may include an I/O pad. The data I/O circuit 240 may be coupled to data I/O line. The PIM device 200 may communicate with the external device through the data I/O circuit 240. The receiving driver 230 may separately output the external command E_CMD and the input address I_ADDR received from the external device. Data DA inputted to the PIM device 200 through the data I/O circuit 240 may be processed by the serializer/deserializer 280 and may be transmitted to the first memory bank (BK0) 211 and the second memory bank (BK1) 212 through the GIO line 290 of the PIM device 200. The data DA outputted from the first memory bank (BK0) 211, the second memory bank (BK1) 212, and the first MAC operator (MAC0) 220 through the GIO line 290 may be processed by the serializer/deserializer 280 and may be outputted to the external device through the data I/O circuit 240. The serializer/deserializer 280 may convert the data DA into parallel data if the data DA are serial data or may convert the data DA into serial data if the data DA are parallel data. For the data conversion, the serializer/deserializer 280 may include a serializer converting parallel data into serial data and a deserializer converting serial data into parallel data.

The command decoder 250 may decode the external command E_CMD outputted from the receiving driver 230 to generate and output the internal command signal I_CMD. As illustrated in FIG. 4, the internal command signal I_CMD outputted from the command decoder 250 may include first to fourth internal command signals. In an embodiment, the first internal command signal may be a memory active signal ACT_M, the second internal command signal may be a memory read signal READ_M, the third internal command signal may be a MAC arithmetic signal MAC, and the fourth internal command signal may be a result read signal READ_RST. The first to fourth internal command signals outputted from the command decoder 250 may be sequentially inputted to the MAC command generator 270.

In order to perform the deterministic MAC arithmetic operation of the PIM device 200, the memory active signal ACT_M, the memory read signal READ_M, the MAC arithmetic signal MAC, and the result read signal READ_RST outputted from the command decoder 250 may be sequentially generated at predetermined points in time (or clocks). In an embodiment, the memory active signal ACT_M, the memory read signal READ_M, the MAC arithmetic signal MAC, and the result read signal READ_RST may have predetermined latencies, respectively. For example, the memory read signal READ_M may be generated after a first latency elapses from a point in time when the memory active signal ACT_M is generated, the MAC arithmetic signal MAC may be generated after a second latency elapses from a point in time when the memory read signal READ_M is generated, and the result read signal READ_RST may be generated after a third latency elapses from a point in time when the MAC arithmetic signal MAC is generated. No signal is generated by the command decoder 250 until a fourth latency elapses from a point in time when the result read signal READ_RST is generated. The first to fourth latencies may be predetermined and fixed. Thus, the host or the controller outputting the external command E_CMD may predict the points in time when the first to fourth internal command signals constituting the internal command signal I_CMD are generated by the command decoder 250 in advance at a point in time when the external command E_CMD is outputted from the host or the controller.

The address latch 260 may convert the input address I_ADDR outputted from the receiving driver 230 into a bank selection signal BK_S and a row/column address ADDR_R/ADDR_C to output the bank selection signal BK_S and the row/column address ADDR_R/ADDR_C. The bank selection signal BK_S may be inputted to the MAC command generator 270. The row/column address ADDR_R/ADDR_C may be transmitted to the first and second memory banks 211 and 212. One of the first and second memory banks 211 and 212 may be selected by the bank selection signal BK_S. One of rows included in the selected memory bank and one of columns included in the selected memory bank may be selected by the row/column address ADDR_R/ADDR_C. In an embodiment, a point in time when the bank selection signal BK_S is inputted to the MAC command generator 270 may be the same moment as a point in time when the row/column address ADDR_R/ADDR_C is inputted to the first and second memory banks 211 and 212. In an embodiment, the point in time when the bank selection signal BK_S is inputted to the MAC command generator 270 and the point in time when the row/column address ADDR_R/ADDR_C is inputted to the first and second memory banks 211 and 212 may be a point in time when the MAC command is generated to read out data from the first and second memory banks 211 and 212 for the MAC arithmetic operation.

The MAC command generator 270 may output the MAC command signal MAC_CMD in response to the internal command signal I_CMD outputted from the command decoder 250 and the bank selection signal BK_S outputted from the address latch 260. As illustrated in FIG. 4, the MAC command signal MAC_CMD outputted from the MAC command generator 270 may include first to seventh MAC command signals. In an embodiment the first MAC command signal may be a MAC active signal RACTV, the second MAC command signal may be a first MAC read signal MAC_RD_BK0, the third MAC command signal may be a second MAC read signal MAC_RD_BK1, the fourth MAC command signal may be a first MAC input latch signal MAC_L1, the fifth MAC command signal may be a second MAC input latch signal MAC_L2, the sixth MAC command signal may be a MAC output latch signal MAC_L3, and the seventh MAC command signal may be a MAC result latch signal MAC_L_RST.

The MAC active signal RACTV may be generated based on the memory active signal ACT_M outputted from the command decoder 250. The first MAC read signal MAC_RD_BK0 may be generated in response to the memory read signal READ_M outputted from the command decoder 250 and the bank selection signal BK_S having a first level (e.g., a logic "low" level) outputted from the address latch 260. The first MAC input latch signal MAC_L1 may be generated at a point in time when a certain time elapses from a point in time when the first MAC read signal MAC_RD_BK0 is generated. For various embodiments, a certain time means a fixed time duration. The second MAC read signal MAC_RD_BK1 may be generated in response to the memory read signal READ_M outputted from the command decoder 250 and the bank selection signal BK_S having a second level (e.g., a logic "high" level) outputted from the address latch 260. The second MAC input latch signal MAC_L2 may be generated at a point in time when a certain time elapses from a point in time when the second MAC read signal MAC_RD_BK1 is generated. The MAC output latch signal MAC_L3 may be generated in response to the MAC arithmetic signal MAC outputted from the command decoder 250. Finally, the MAC result latch signal MAC_L_RST may be generated in response to the result read signal READ_RST outputted from the command decoder 250.

The MAC active signal RACTV outputted from the MAC command generator 270 may control an activation operation for the first and second memory banks 211 and 212. The first MAC read signal MAC_RD_BK0 outputted from the MAC command generator 270 may control a data read operation for the first memory bank 211. The second MAC read signal MAC_RD_BK1 outputted from the MAC command generator 270 may control a data read operation for the second memory bank 212. The first MAC input latch signal MAC_L1 and the second MAC input latch signal MAC_L2 outputted from the MAC command generator 270 may control an input data latch operation of the first MAC operator (MAC0) 220. The MAC output latch signal MAC_L3 outputted from the MAC command generator 270 may control an output data latch operation of the first MAC operator (MAC0) 220. The MAC result latch signal MAC_L_RST outputted from the MAC command generator 270 may control a reset operation of the first MAC operator (MAC0) 220.

As described above, in order to perform the deterministic MAC arithmetic operation of the NM device 200, the memory active signal ACT_M, the memory read signal READ_M, the MAC arithmetic signal MAC, and the result read signal READ_RST outputted from the command decoder 250 may be sequentially generated at predetermined points in time (or clocks), respectively. Thus, the MAC active signal RACTV, the first MAC read signal MAC_RD_BK0, the second MAC read signal MAC_RD_BK1, the first MAC input latch signal MAC_L1, the second MAC input latch signal MAC_L2, the MAC output latch signal MAC_L3, and the MAC result latch signal MAC_L_RST may also be generated and outputted from the MAC command generator 270 at predetermined points in time after the external command E_CMD is inputted to the PIM device 200, respectively. That is, a time period from a point in time when the first and second memory banks 211 and 212 are activated by the MAC active signal RACTV until a point in time when the first MAC operator (MAC0) 220 is reset by the MAC result latch signal MAC_L_RST may be predetermined, and thus the PIM device 200 may perform the deterministic MAC arithmetic operation.

Figure 5:
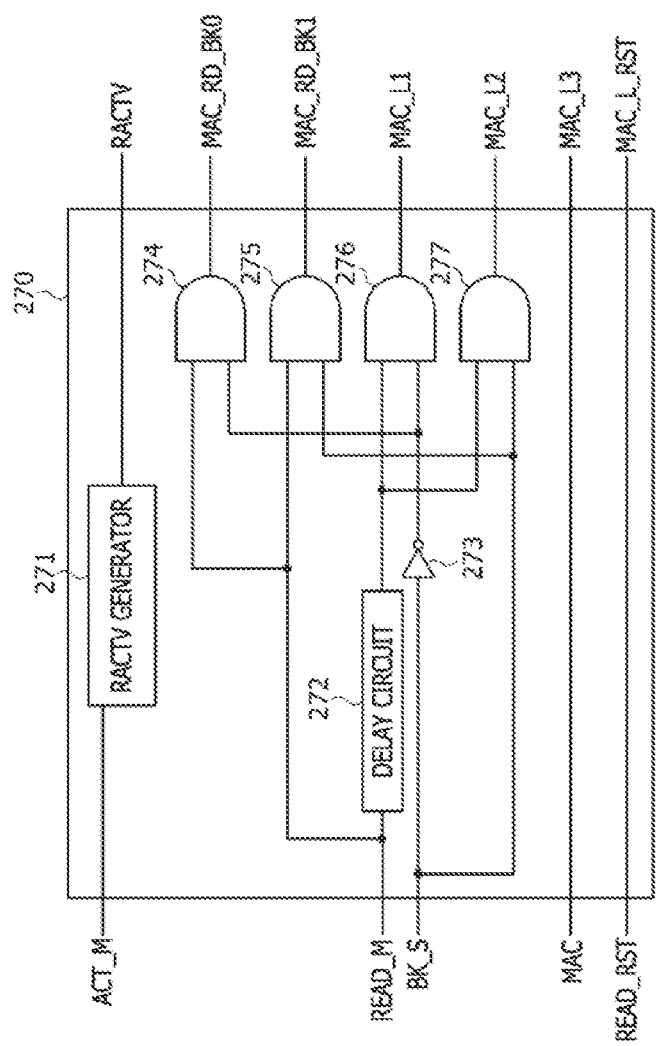
FIG. 5 illustrates an example of a configuration of a MAC command generator included in the PIM device of FIG. 3.

FIG. 5 illustrates an example of a configuration of the MAC command generator 270 included in the PIM device 200 illustrated in FIG. 3. Referring to FIG. 5, the MAC command generator 270 may sequentially receive the memory active signal ACT_M, the memory read signal READ_M, the MAC arithmetic signal MAC, and the result read signal READ_RST from the command decoder 250. In addition, the MAC command generator 270 may also receive the bank selection signal BK_S from the address latch 260. The MAC command generator 270 may output the MAC active signal RACTV, the first MAC read signal MAC_RD_BK0, the second MAC read signal MAC_RD_BK1, the first MAC input latch signal MAC_L1, the second MAC input latch signal MAC_L2, the MAC output latch signal MAC_L3, and the MAC result latch signal MAC_L_RST in series with certain time intervals. For an embodiment, a certain time interval is a time interval having a fixed duration.

In an embodiment, the MAC command generator 270 may be configured to include an active signal generator 271, a delay circuit 272, an inverter 273, and first to fourth AND gates 274, 275, 276, and 277. The active signal generator 271 may receive the memory active signal ACT_M to generate and output the MAC active signal RACTV. The MAC active signal RACTV outputted from the active signal generator 271 may be transmitted to the first and second memory banks 211 and 212 to activate the first and second memory banks 211 and 212. The delay circuit 272 may receive the memory read signal READ_M and may delay the memory read signal READ_M by a delay time DELAY_T to output the delayed signal of the memory read signal READ_M. The inverter 273 may receive the bank selection signal BK_S and may invert a logic level of the bank selection signal BK_S to output the inverted signal of the bank selection signal BK_S.

The first AND gate 274 may receive the memory read signal READ_M and an output signal of the inverter 273 and may perform a logical AND operation of the memory read signal READ_M and an output signal of the inverter 273 to generate and output the first MAC read signal MAC_RD_BK0. The second AND gate 275 may receive the memory read signal READ_M and the bank selection signal BK_S and may perform a logical AND operation of the memory read signal READ_M and the bank selection signal BK_S to generate and output the second MAC read signal MAC_RD_BK1. The third AND gate 276 may receive an output signal of the delay circuit 272 and an output signal of the inverter 273 and may perform a logical AND operation of the output signals of the delay circuit 272 and the inverter 273 to generate and output the first MAC input latch signal MAC_L1. The fourth AND gate 277 may receive an output signal of the delay circuit 272 and the bank selection signal BK_S and may perform a logical AND operation of the output signal of the delay circuit 272 and the bank selection signal BK_S to generate and output the second MAC input latch signal MAC_L2.

It may be assumed that the memory read signal READ_M inputted to the MAC command generator 270 has a logic "high" level and the bank selection signal BK_S inputted to the MAC command generator 270 has a logic "low" level. A level of the bank selection signal BK_S may change from a logic "low" level into a logic "high" level after a certain time elapses. When the memory read signal READ_M has a logic "high" level and the bank selection signal BK_S has a logic "low" level, the first AND gate 274 may output the first MAC read signal MAC_RD_BK0 having a logic "high" level and the second AND gate 275 may output the second MAC read signal MAC_RD_BK1 having a logic "low" level. The first memory bank 211 may transmit the first data DA1 to the first MAC operator 220 according to a control operation based on the first MAC read signal MAC_RD_BK0 having a logic "high" level. If a level transition of the bank selection signal BK_S occurs so that both of the memory read signal READ_M and the bank selection signal BK_S have a logic "high" level, the first AND gate 274 may output the first MAC read signal MAC_RD_BK0 having a logic "low" level and the second AND gate 275 may output the second MAC read signal MAC_RD_BK1 having a logic "high" level. The second memory bank 212 may transmit the second data DA2 to the first MAC operator 220 according to a control operation based on the second MAC read signal MAC_RD_BK1 having a logic "high" level.

Due to the delay time of the delay circuit 272, the output signals of the third and fourth AND gates 276 and 277 may be generated after the first and second MAC read signals MAC_RD_BK0 and MAC_RD_BK1 are generated. Thus, after the second MAC read signal MAC_RD_BK1 is generated, the third AND gate 276 may output the first MAC input latch signal MAC_L1 having a logic "high" level. The first MAC operator 220 may latch the first data DA1 in response to the first MAC input latch signal MAC_L1 having a logic "high" level. After a certain time elapses from a point in time when the first data DA1 are latched by the first MAC operator 220, the fourth AND gate 277 may output the second MAC input latch signal MAC_L2 having a logic "high" level. The first MAC operator 220 may latch the second data DA2 in response to the second MAC input latch signal MAC_L2 having a logic "high" level. The first MAC operator 220 may start to perform the MAC arithmetic operation after the first and second data DA1 and DA2 are latched.

The MAC command generator 270 may generate the MAC output latch signal MAC_L3 in response to the MAC arithmetic signal MAC outputted from the command decoder 250. The MAC output latch signal MAC_L3 may have the same logic level as the MAC arithmetic signal MAC. For example, if the MAC arithmetic signal MAC having a logic "high" level is inputted to the MAC command generator 270, the MAC command generator 270 may generate the MAC output latch signal MAC_L3 having a logic "high" level. The MAC command generator 270 may generate the MAC result latch signal MAC_L_RST in response to the result read signal READ_RST outputted from the command decoder 250. The MAC result latch signal MAC_L_RST may have the same logic level as the result read signal READ_RST. For example, if the result read signal READ_RST having a logic "high" level is inputted to the MAC command generator 270, the MAC command generator 270 may generate the MAC result latch signal MAC_L_RST having a logic "high" level.

Figure 6:
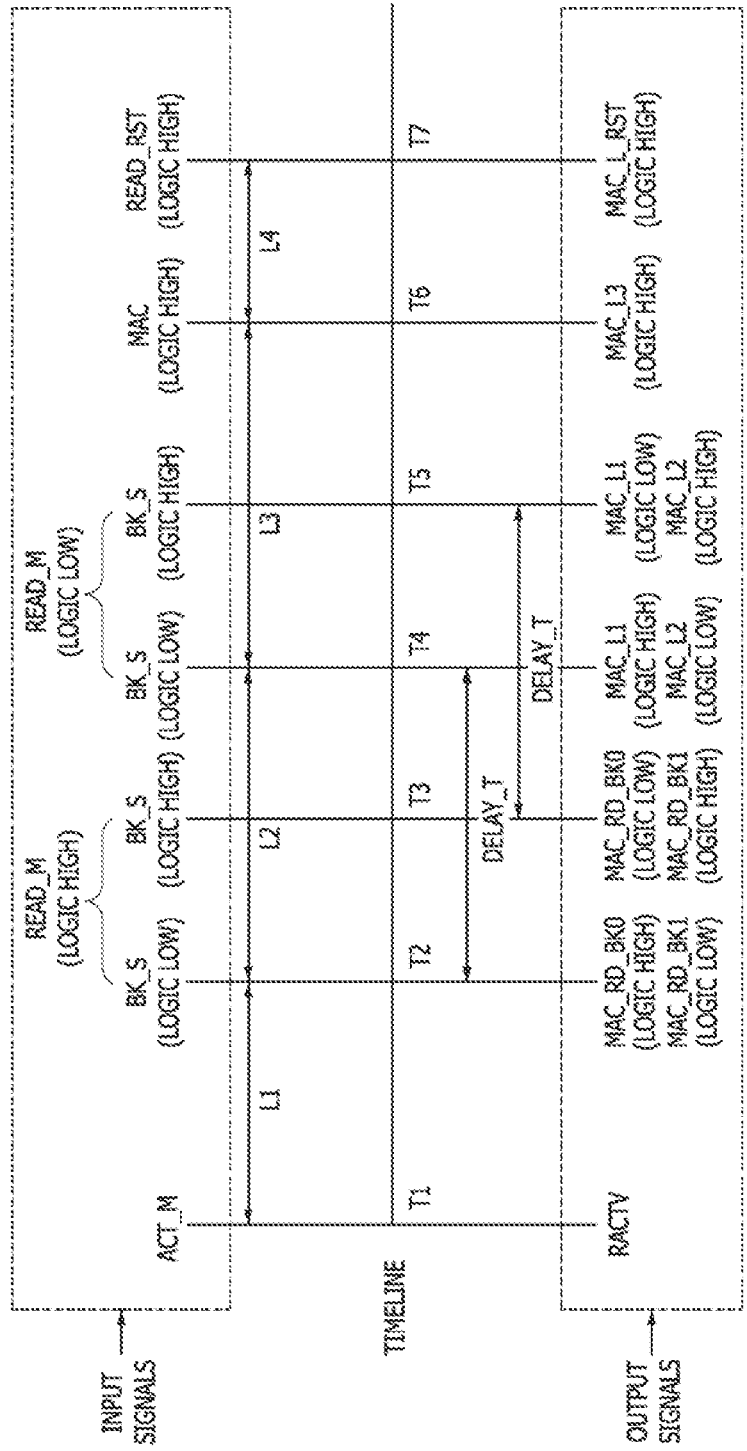
FIG. 6 illustrates input signals and output signals of the MAC command generator illustrated in FIG. 5 with a timeline.

FIG. 6 illustrates input signals and output signals of the MAC command generator 270 illustrated in FIG. 5 along a timeline. In FIG. 6, signals transmitted from the command decoder 250 to the MAC command generator 270 are illustrated in an upper dotted line box, and signals outputted from the MAC command generator 270 are illustrated in a lower dotted line box. Referring to FIGS. 5 and 6 at a first point in time "T1" of the timeline, the memory active signal ACT_M may be inputted to the MAC command generator 270 and the MAC command generator 270 may output the MAC active signal RACTV. At a second point in time "T2" when a certain time, for example, a first latency L1 elapses from the first point in time "T1", the memory read signal READ_M having a logic "high" level and the bank selection signal BK_S having a logic "low" level may be inputted to the MAC command generator 270. In response to the memory read signal READ_M having a logic "high" level and the bank selection signal BK_S having a logic "low" level, the MAC command generator 270 may output the first MAC read signal MAC_RD_BK0 having a logic "high" level and the second MAC read signal MAC_RD_BK1 having a logic "low" level in response to the memory read signal READ_M having a logic "high" level and the bank selection signal BK_S having a logic "low" level, as described with reference to FIG. 5. At a third point in time "T3" when a certain time elapses from the second point in time "T2", a logic level of the bank selection signal BK_S may change from a logic "low" level into a logic "high" level In such a case, the MAC command generator 270 may output the first MAC read signal MAC_RD_BK0 having a logic "low" level and the second MAC read signal MAC_RD_BK1 having a logic "high" level, as described with reference to FIG. 5.

At a fourth point in time "T4" when the delay time DELAY_T elapses from the second point in time "T2", the MAC command generator 270 may output the first MAC input latch signal MAC_L1 having a logic "high" level and the second MAC input latch signal MAC_L2 having a logic "low" level. The delay time DELAY_T may be set by the delay circuit 272. The delay time DELAY_T may bet to be different according a logic design scheme of the delay circuit 272 and may be fixed once the logic design scheme of the delay circuit 272 is determined. In an embodiment, the delay time DELAY_T may be set to be equal to or greater than a second latency L2. At a fifth point in time "T5" when a certain time elapses from the fourth point in time "T4", the MAC command generator 270 may output the first MAC input latch signal MAC_L1 having a logic "low" level and the second MAC input latch signal MAC_L2 having a logic "high" level. The fifth point in time "T5" may be a moment when the delay time DELAY_T elapses from the third point in time "T3".

At a sixth point in time "T6" when a certain time, for example, a third latency L3 elapses from the fourth point in time "T4", the MAC arithmetic signal MAC having a logic "high" level may be inputted to the MAC command generator 270. In response to the MAC arithmetic signal MAC having a logic "high" level, the MAC command generator 270 may output the MAC output latch signal MAC_L3 having a logic "high" level, as described with reference to FIG. 5. Subsequently, at a seventh point in time "T7" when a certain time, for example, a fourth latency L4 elapses from the sixth point in time "T6", the result read signal READ_RST having a logic "high" level may be inputted to the MAC command generator 270. In response to the result read signal READ_RST having a logic "high" level, the MAC command generator 270 may output the MAC result latch signal MAC_L_RST having a logic "high" level, as described with reference to FIG. 5.

In order to perform the deterministic MAC arithmetic operation, moments when the internal command signals ACT_M, READ_M, MAC, and READ_RST generated by the command decoder 250 are inputted to the MAC command generator 270 may be fixed and moments when the MAC command signals RACTV, MAC_RD_BK0, MAC_RD_BK1, MAC_L1, MAC_L2, MAC_L3, and MAC_L_RST are outputted from the MAC command generator 270 in response to the internal command signals ACT_M, READ_M, MAC, and READ_RST may also be fixed. Thus, all of the first latency L1 between the first point in time "T1" and the second point in time "T2", the second latency L2 between the second point in time "T2" and the fourth point in time "T4", the third latency L3 between the fourth point in time "T4" and the sixth point in time "T6", and the fourth latency L4 between the sixth point in time "T6" and the seventh point in time "T7" may have fixed values.

Figure 7:
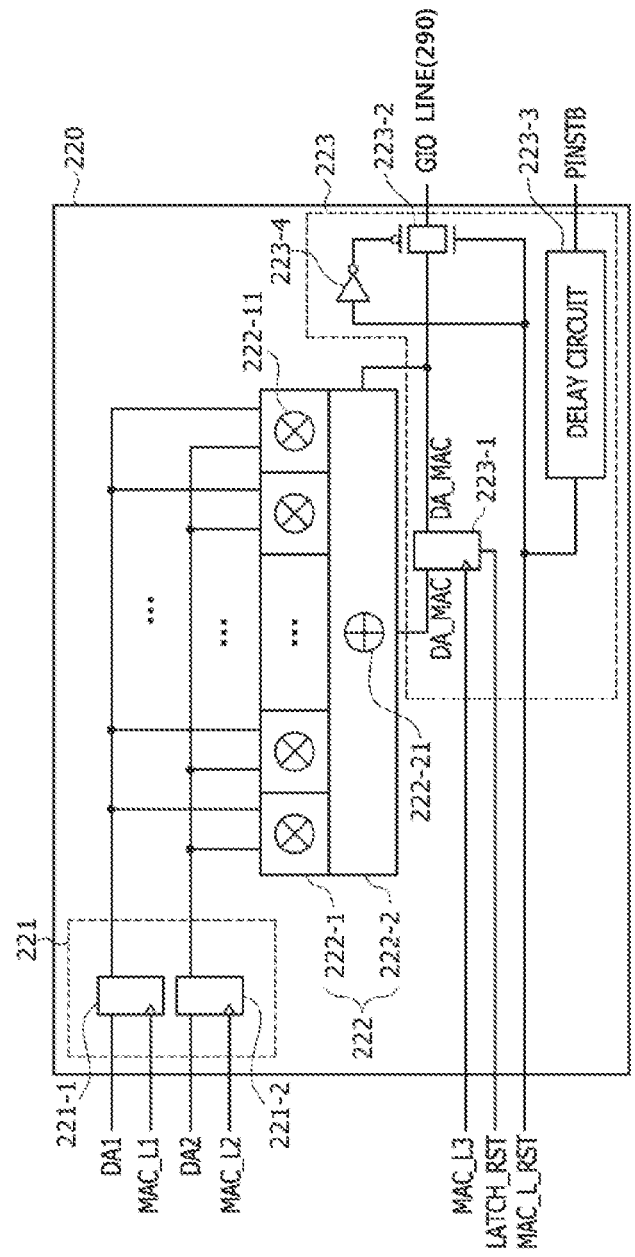
FIG. 7 illustrates an example of a configuration of a MAC operator included in the PIM device of FIG. 3.
Figure 8:
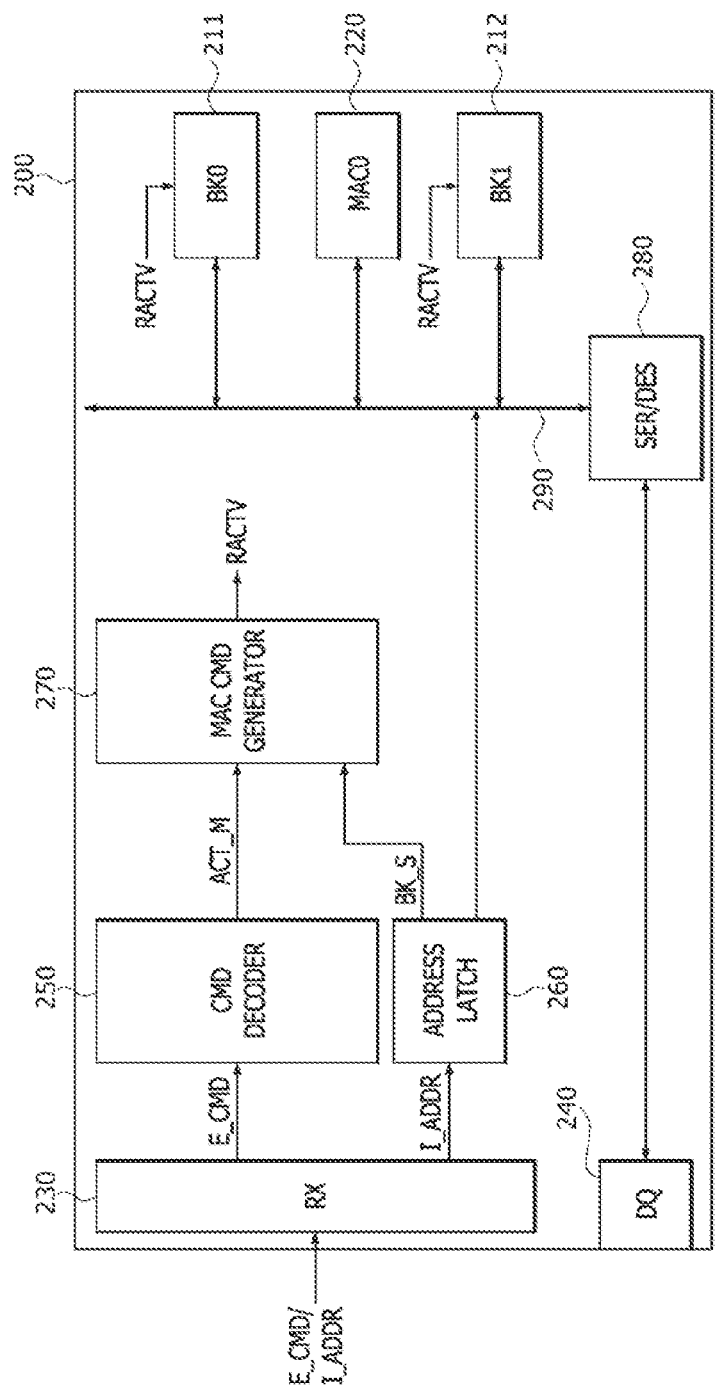
FIGS. 8 to 14 are block diagrams illustrating operations of the PIM device illustrated in FIG. 3.

In an embodiment, the first latency L1 may be defined as a time it takes to activate both of the first and second memory banks based on the MAC active signal RACTV. The second latency L2 may be defined as a time it takes to read the first and second data out of the first and second memory banks BK0 and BK1 based on the first and second MAC read signals MAC_RD_BK0 and MAC_RD_BK1 and to input the first and second data DA1 and DA2 into the first MAC operator (MAC0) 220. The third latency L3 may be defined as a time it takes to latch the first and second data DA1 and DA2 in the first MAC operator (MAC0) 220 based on the first and second MAC input latch signals MAC_L1 and MAC_L2 and it takes the first MAC operator (MAC0) 220 to perform the MAC arithmetic operation of the first and second data. The fourth latency L4 may be defined as a time it takes to latch the output data in the first MAC operator (MAC0) 220 based on the MAC output latch signal MAC_L3, FIG. 7 illustrates an example of a configuration of the first MAC operator (MAC0) 220 included in the PIM device 200 illustrated in FIG. 3. Referring to FIG. 7, the first MAC operator (MAC0) 220 may be configured to include a data input circuit 221, a MAC circuit 222, and a data output circuit 223. The data input circuit 221 may be configured to include a first input latch 221-1 and a second input latch 221-2. The MAC circuit 222 may be configured to include a multiplication logic circuit circuit 222-1 and an addition logic circuit circuit 222-2. The data output circuit 223 may be configured to include an output latch 223-1, a transfer gate 223-2, a delay circuit 223-3, and an inverter 223-4. In an embodiment, the first input latch 221-1, the second input latch 221-2, and the output latch 223-1 may be realized using flip-flops.

The data input circuit 221 of the first MAC operator (MAC0) 220 may be synchronized with the first and second MAC input latch signals MAC_L1 and MAC_L2 to receive and output the first and second data DA1 and DA2 inputted through the GIO line 290 to the MAC circuit 222. Specifically, the first data DA1 may be transmitted from the first memory bank BK0 (211 of FIG. 3) to the first input latch 221-1 of the data input circuit 221 through the GIO line 290, in response to the first MAC read signal MAC_RD_BK0 having a logic "high" level outputted from the MAC command generator (270 of FIG. 3). The second data DA2 may be transmitted from the second memory bank BK1 (212 of FIG. 2) to the second input latch 221-2 of the data input circuit 221 through the GIO line 290, in response to the second MAC read signal MAC_RD_BK1 having a logic "high" level outputted from the MAC command generator 270. The first input latch 221-1 may output the first data DA1 to the MAC circuit 222 in synchronization with the first MAC input latch signal MAC_L1 having a logic "high" level outputted from the MAC command generator 270 (270 of FIG. 3). The second input latch 221-2 may output the second data DA2 to the MAC circuit 222 in synchronization with the second MAC input latch signal MAC_L2 having a logic "high" level outputted from the MAC command generator (270 of FIG. 3). As described with reference to FIG. 5, the second MAC input latch signal MAC_L2 may be generated at a moment (corresponding to the fifth point in time "T5" of FIG. 6) when a certain time elapses from a moment (corresponding to the fourth point in time "T4" of FIG. 6) when the first MAC input latch signal MAC_L1 is generated. Thus, after the first data DA1 is inputted to the MAC circuit 222, the second data DA2 may then be inputted to the MAC circuit 222.

The MAC circuit 222 may perform a multiplying calculation and an accumulative adding calculation for the first and second data DA1 and DA2. The multiplication logic circuit circuit 222-1 of the MAC circuit 222 may include a plurality of multipliers 222-11. Each of the plurality of multipliers 222-11 may perform a multiplying calculation of the first data DA1 outputted from the first input latch 221-1 and the second data DA2 outputted from the second input latch 221-2 and may output the result of the multiplying calculation. Bit values constituting the first data DA1 may be separately inputted to the multipliers 222-11. Similarly, bit values constituting the second data DA2 may also be separately inputted to the multipliers 222-11. For example, if each of the first and second data DA1 and DA2 is comprised of an 'N'-bit binary stream and the number of the multipliers 222-11 is 'M', the first data DA1 having 'N/M' bits and the second data DA2 having 'N/M' bits may be inputted to each of the multipliers 222-11. That is, each of the multipliers 222-11 may be configured to perform a multiplying calculation of first 'N/M'-bit data and second 'N/M'-bit data. Multiplication result data outputted from each of the multipliers 222-11 may have '2N/M' bits.

The addition logic circuit circuit 222-2 of the MAC circuit 222 may include a plurality of adders 222-21. Although not shown in the drawings, the plurality of adders 222-21 may be disposed to provide a tree structure including a plurality of stages. Each of the adders 222-21 disposed at a first stage may receive two sets of multiplication result data from two of the multipliers 222-11 included in the multiplication logic circuit circuit 222-1 and may perform an adding calculation of the two sets of multiplication result data to output addition result data. Each of the adders 222-21 disposed at a second stage may receive two sets of addition result data from two of the adders 222-21 disposed at the first stage and may perform an adding calculation of the two sets of addition result data to output addition result data. The adders 222-21 disposed at a last stage may receive two sets of addition result data from two adders 222-21 disposed at the previous stage and may perform an adding calculation of the two sets of addition result data to output the addition result data. The adders 222-21 constituting the addition logic circuit circuit 222-2 may include an adder for performing an accumulative adding calculation of the addition result data outputted from the adder 222-21 disposed at the last stage and previous MAC result data stored in the output latch 223-1 of the data output circuit 223.

The data output circuit 223 may output MAC result data DA_MAC outputted from the MAC circuit 222 to the GIO line 290. Specifically, the output latch 223-1 of the data output circuit 223 may latch the MAC result data DA_MAC outputted from the MAC circuit 222 and may output the latched data of the MAC result data DA_MAC in synchronization with the MAC output latch signal MAC_L3 having a logic "high" level outputted from the MAC command generator (270 of FIG. 3). The MAC result data DA_MAC outputted from the output latch 223-1 may be fed back to the MAC circuit 222 for the accumulative adding calculation. In addition, the MAC result data DA_MAC may be inputted to the transfer gate 223-2, and the transfer gate 223-2 may output the MAC result data DA_MAC to the GIO line 290. The output latch 223-1 may be initialized if a latch reset signal LATCH_RST is inputted to the output latch 223-1. In such a case, all of data latched by the output latch 223-1 may be removed. In an embodiment, the latch reset signal LATCH_RST may be activated by generation of the MAC result latch signal MAC_L_RST having a logic "high" level and may be inputted to the output latch 223-1.

The MAC result latch signal MAC_L_RST outputted from the MAC command generator 270 may be inputted to the transfer gate 223-2, the delay circuit 223-3, and the inverter 223-4. The inverter 223-4 may inversely buffer the MAC result latch signal MAC_L_RST to output the inversely buffered signal of the MAC result latch signal MAC_L_RST to the transfer gate 223-2. The transfer gate 223-2 may transfer the MAC result data DA_MAC from the output latch 223-1 to the GIO line 290 in response to the MAC result latch signal MAC_L_RST having a logic "high" level. The delay circuit 223-3 may delay the MAC result latch signal MAC_L_RST by a certain time to generate and output a latch control signal PINSTB.

FIGS. 8 to 14 are block diagrams illustrating operations of the NM device 200 illustrated in FIG. 3. In FIGS. 8 to 14, the same reference numerals or the same reference symbols as used in FIG. 3 denote the same elements. First, referring to FIG. 8, if the external command E_CMD requesting the MAC arithmetic operation and the input address I_ADDR are transmitted from an external device to the receiving driver 230, the receiving driver 230 may output the external command E_CMD and the input address I_ADDR to the command decoder 250 and the address latch 260, respectively. The command decoder 250 may decode the external command E_CMD to generate and transmit the memory active signal ACT_M to the MAC command generator 270. The address latch 260 receiving the input address I_ADDR may generate and transmit the bank selection signal BK_S to the MAC command generator 270. The MAC command generator 270 may generate and output the MAC active signal RACTV in response to the memory active signal ACT_M and the bank selection signal BK_S. The MAC active signal RACTV may be transmitted to the first memory bank (BK0) 211 and the second memory bank (BK1) 212. The first memory bank (BK0) 211 and the second memory bank (BK1) 212 may be activated by the MAC active signal RACTV.

Figure 9:
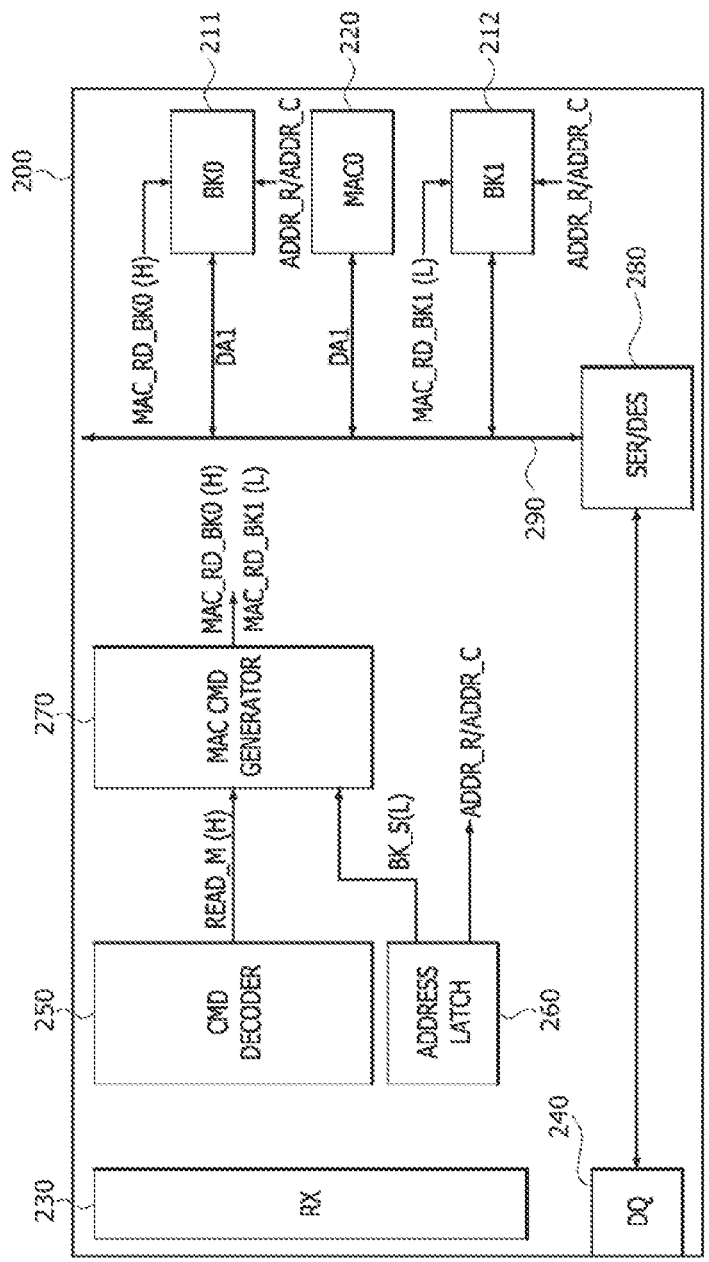

Next, referring to FIG. 9, the command decoder 250 may generate and output the memory read signal READ_M having a logic "high(H)" level to the MAC command generator 270. In addition, the address latch 260 may generate and output the bank selection signal BK_S having a logic "low(L)" level to the MAC command generator 270. In response to the memory read signal READ_M having a logic "high(H)" level and the bank selection signal BK_S having a logic "low(L)" level, the MAC command generator 270 may generate and output the first MAC read signal MAC_RD_BK0 having a logic "high(H)" level and the second MAC read signal MAC_RD_BK1 having a logic "low(L)" level, as described with reference to FIG. 4. The first MAC read signal MAC_RD_BK0 having a logic "high (H)" level, together with the row/column address ADDR_R/ADDR_C, may be transmitted to the first memory bank (BK0) 211. The second MAC read signal MAC_RD_BK1 having a logic "low(L)" level, together with the row/column address ADDR_R/ADDR_C, may be transmitted to the second memory bank (BK1) 212. The first data DA1 may be read out of the first memory bank (BK0) 211 by the first MAC read signal MAC_RD_BK0 having a logic "high(H)" level and may be transmitted to the first MAC operator (MAC0) 220 through the GIO line 290.

Figure 10:
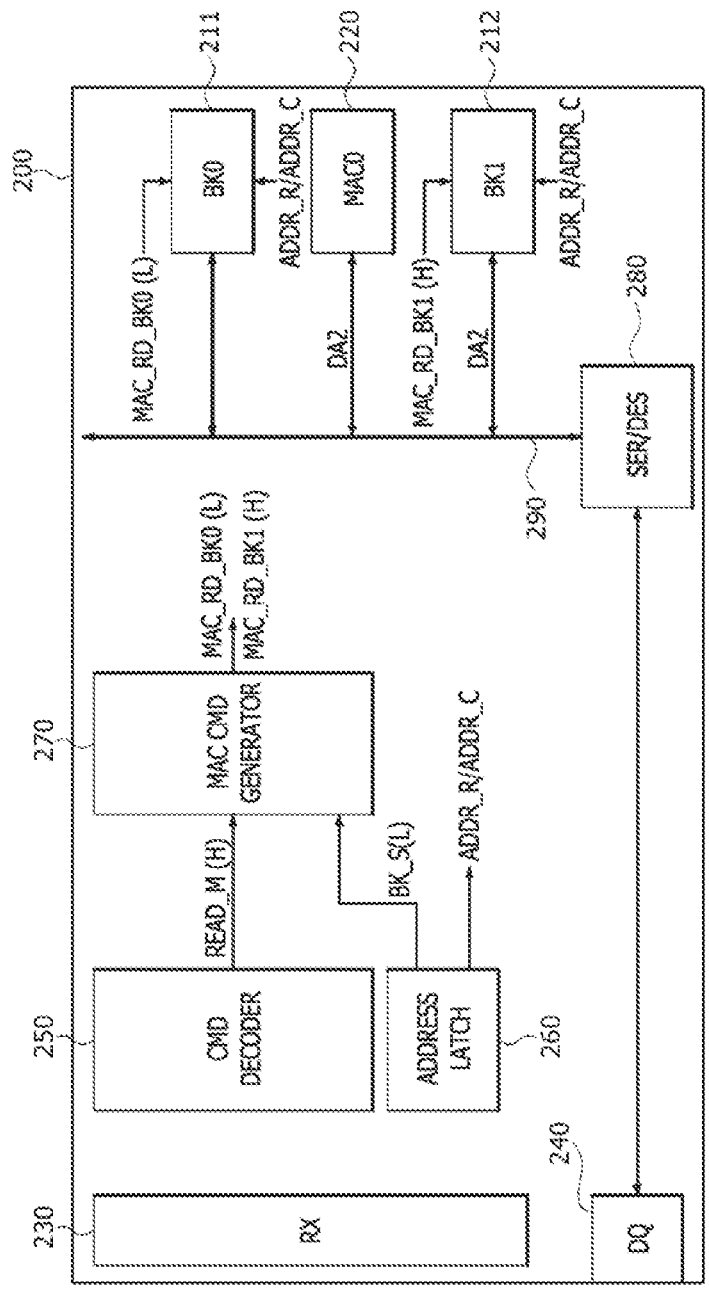

Next, referring to FIG. 10, a logic level of the bank selection signal BK_S may change from a logic "low(L)" level into a logic "high(H)" level while the memory read signal READ_M maintains a logic "high(H)" level. In such a case, as described with reference to FIG. 5, the MAC command generator 270 may generate and output the first MAC read signal MAC_RD_BK0 having a logic "low(L)" level and the second MAC read signal MAC_RD_BK1 having a logic "high(H)" level. The first MAC read signal MAC_RD_BK0 having a logic "low(L)" level, together with the row/column address ADDR_R/ADDR_C, may be transmitted to the first memory bank (BK0) 211. The second MAC read signal MAC_RD_BK1 having a logic "high(H)" level, together with the row/column address ADDR_R/ADDR_C, may be transmitted to the second memory bank (BK1) 212. The second data DA2 may be read out of the second memory bank (BK1) 212 by the second MAC read signal MAC_RD_BK1 having a logic "high(H)" level and may be transmitted to the first MAC operator (MAC0) 220 through the GIO line 290.

Figure 11:
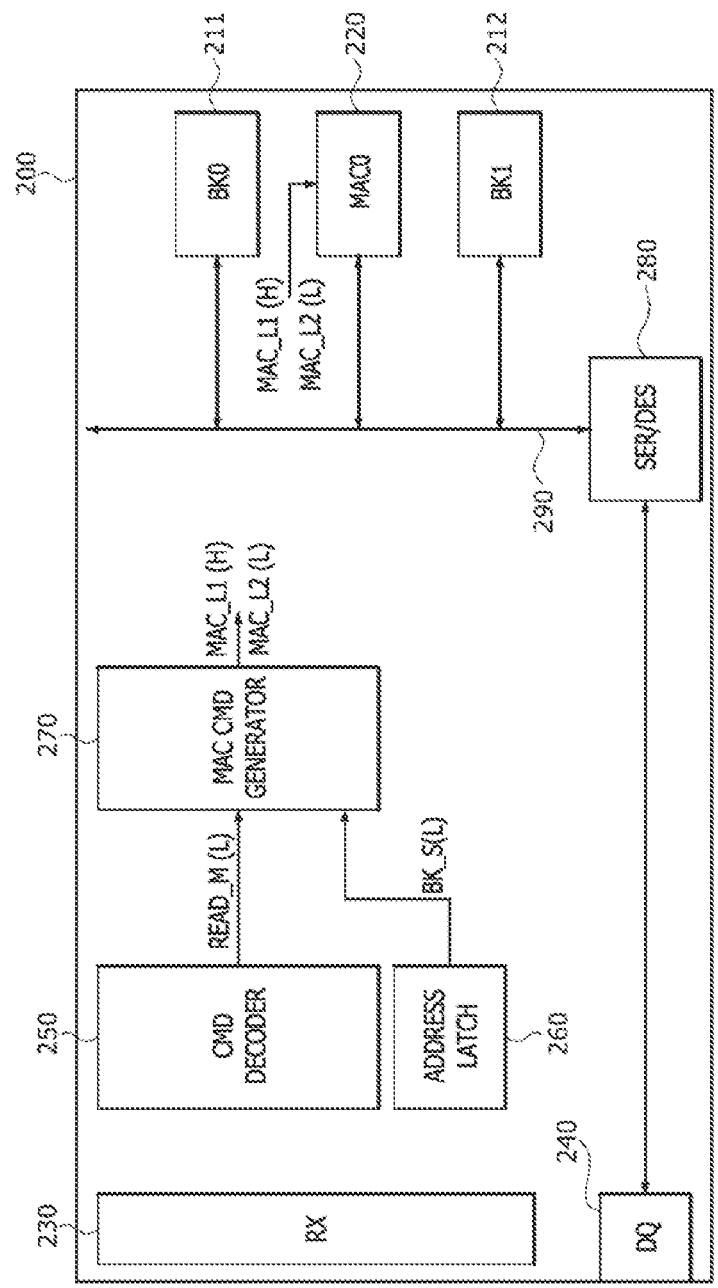

Next, referring to FIG. 11, a logic level of the memory read signal READ_M transmitted from the command decoder 250 to the MAC command generator 270 may change from a logic "high(H)" level into a logic "low(L)" level. In addition, a logic level of the bank selection signal BK_S transmitted from the address latch 260 to the MAC command generator 270 may change from a logic "high(H)" level into a logic "low(L)" level. In such a case, the MAC command generator 270 may generate and output the first MAC input latch signal MAC_L1 having a logic "high(H)" level and the second MAC input latch signal MAC_L2 having a logic "low(L)" level. A point in time when the first MAC input latch signal MAC_L1 having a logic "high(H)" level and the second MAC input latch signal MAC_L2 having a logic "low(L)" level are outputted from the MAC command generator 270 may be determined by a delay time of the delay circuit (271 of FIG. 4), as described with reference to FIG. 5. The first MAC input latch signal MAC_L1 having a logic "high(H)" level and the second MAC input latch signal MAC_L2 having a logic "low(L)" level outputted from the MAC command generator 270 may be transmitted to the first MAC operator (MAC0) 220. As described with reference to FIG. 7, the first MAC operator (MAC0) 220 may perform a latch operation of the first data DA1.

Figure 12:
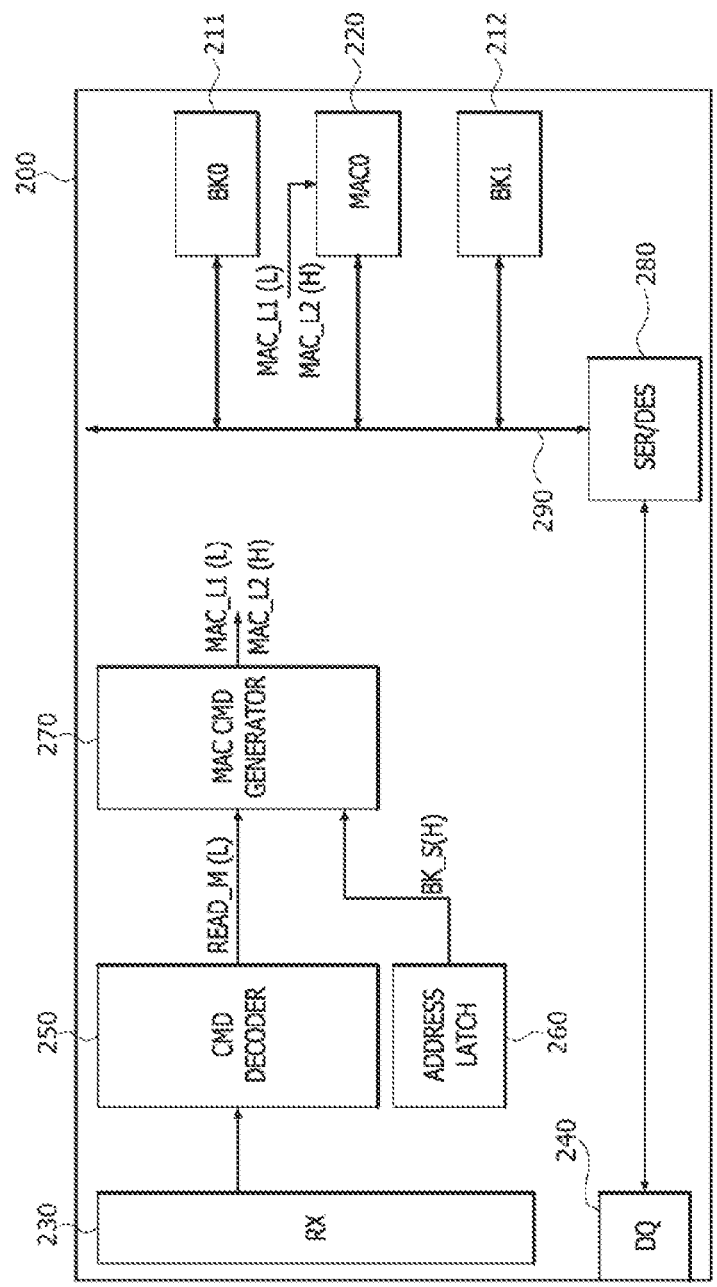

Next, referring to FIG. 12, a logic level of the bank selection signal BK_S transmitted from the address latch 260 to the MAC command generator 270 may change from a logic "low(L)" level into a logic "high(H)" level while the memory read signal READ_M maintains a logic "low(L)" level. In such a case, the MAC command generator 270 may generate and output the first MAC input latch signal MAC_L1 having a logic "low(L)" level and the second MAC input latch signal MAC_L2 having a logic "high(H)" level. A point in time when the first MAC input latch signal MAC_L1 having a logic "low(L)" level and the second MAC input latch signal MAC_L2 having a logic "high(H)" level are outputted from the MAC command generator 270 may be determined by a delay time of the delay circuit (271 of FIG. 5), as described with reference to FIG. 5. The first MAC input latch signal MAC_L1 having a logic "low(L)" level and the second MAC input latch signal MAC_L2 having a logic "high(H)" level outputted from the MAC command generator 270 may be transmitted to the first MAC operator (MAC0) 220. As described with reference to FIG. 7, the first MAC operator (MAC0) 220 may perform a latch operation of the second data DA2. After the latch operations of the first and second data DA1 and DA2 terminate, the first MAC operator (MAC0) 220 may perform the MAC arithmetic operation and may generate the MAC result data DA_MAC. The MAC result data DA_MAC generated by the first MAC operator (MAC0) 220 may be inputted to the output latch 223-1 included in the first MAC operator (MAC0) 220.

Figure 13:
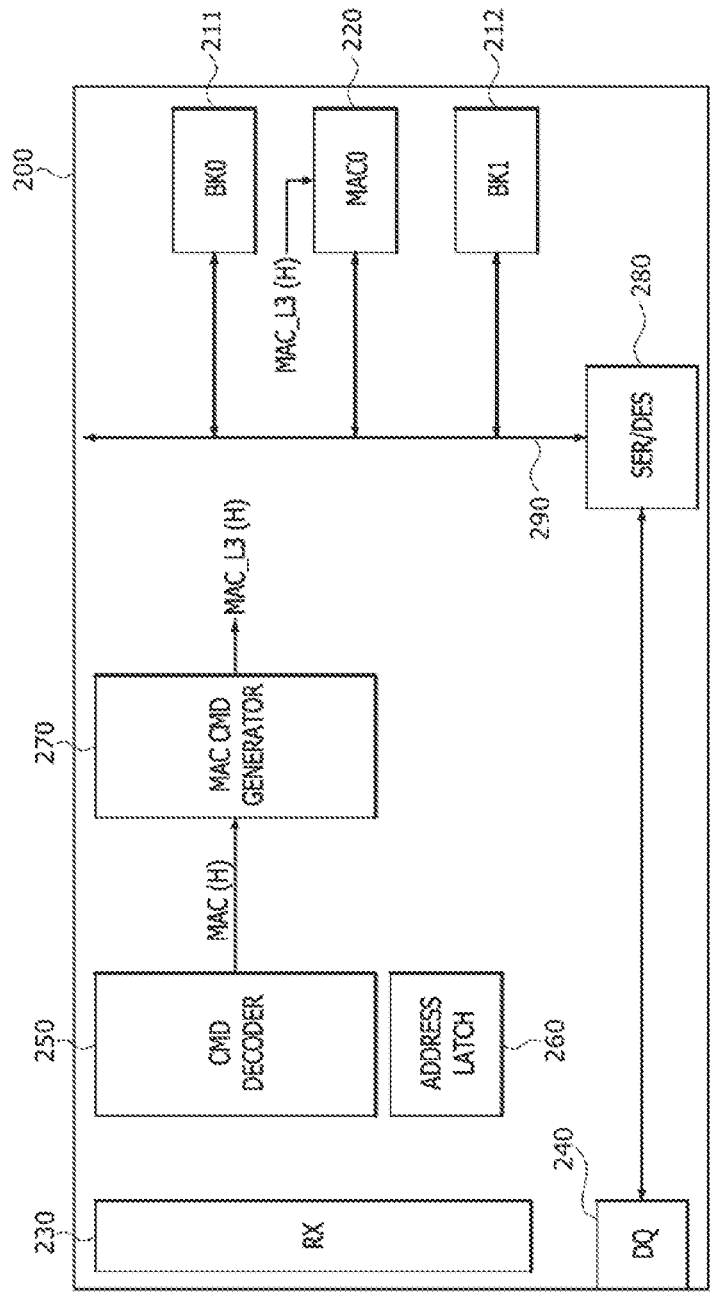

Next, referring to FIG. 13, the command decoder 250 may output and transmit the MAC arithmetic signal MAC having a logic "high(H)" level to the MAC command generator 270. The MAC command generator 270 may generate and output the MAC output latch signal MAC_L3 having a logic "high" level in response to the MAC arithmetic signal MAC having a logic "high(H)" level. The MAC output latch signal MAC_L3 having a logic "high" level may be transmitted to the first MAC operator (MAC0) 220. As described with reference to FIG. 7, the output latch (223-1 of FIG. 7) of the first MAC operator (MAC0) 220 may be synchronized with the MAC output latch signal MAC_L3 having a logic "high" level to transfer the MAC result data DA_MAC outputted from the MAC circuit 222 of the first MAC operator (MAC0) 220 to the transfer gate (233-2 of FIG. 7) of the first MAC operator (MAC0) 220. The MAC result data DA_MAC outputted from the output latch (223-1 of FIG. 7) may be fed back to the addition logic circuit circuit (222-2 of FIG. 7) for the accumulative adding calculation.

Figure 14:
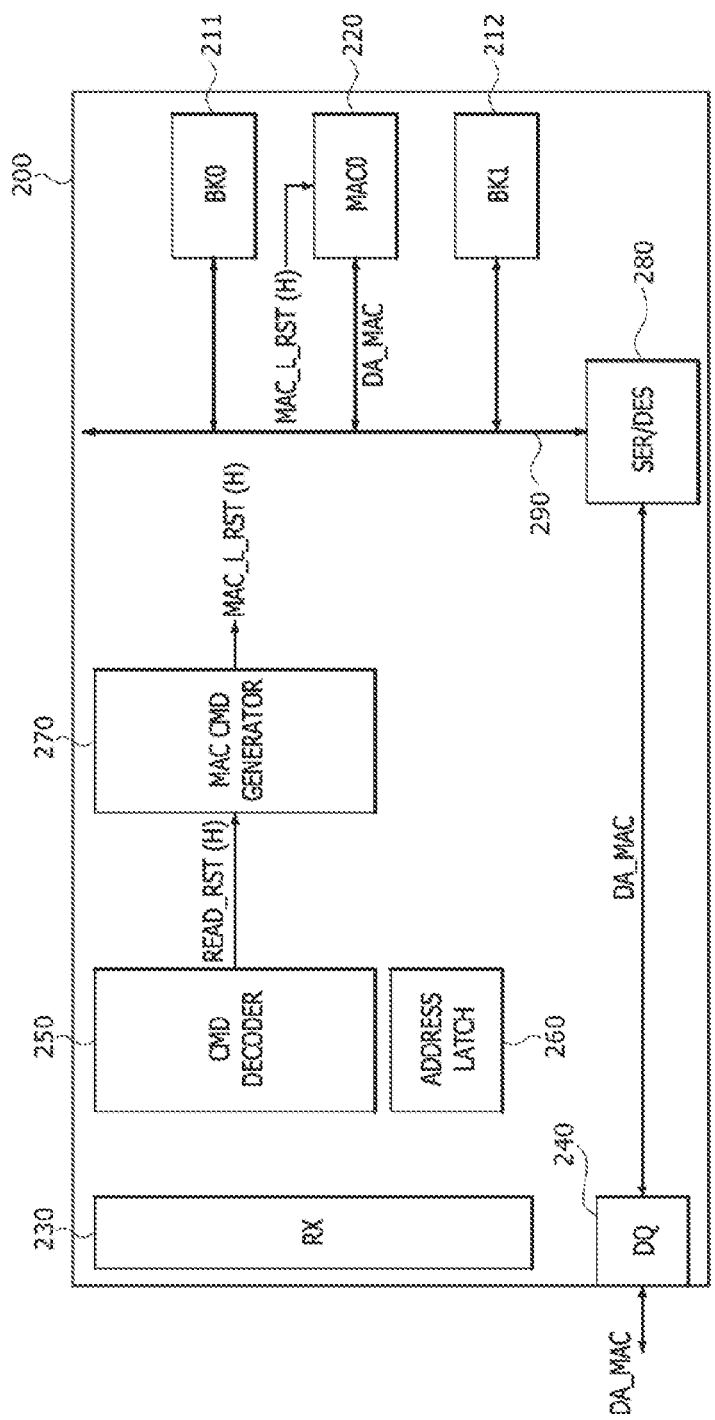
Figure 15:
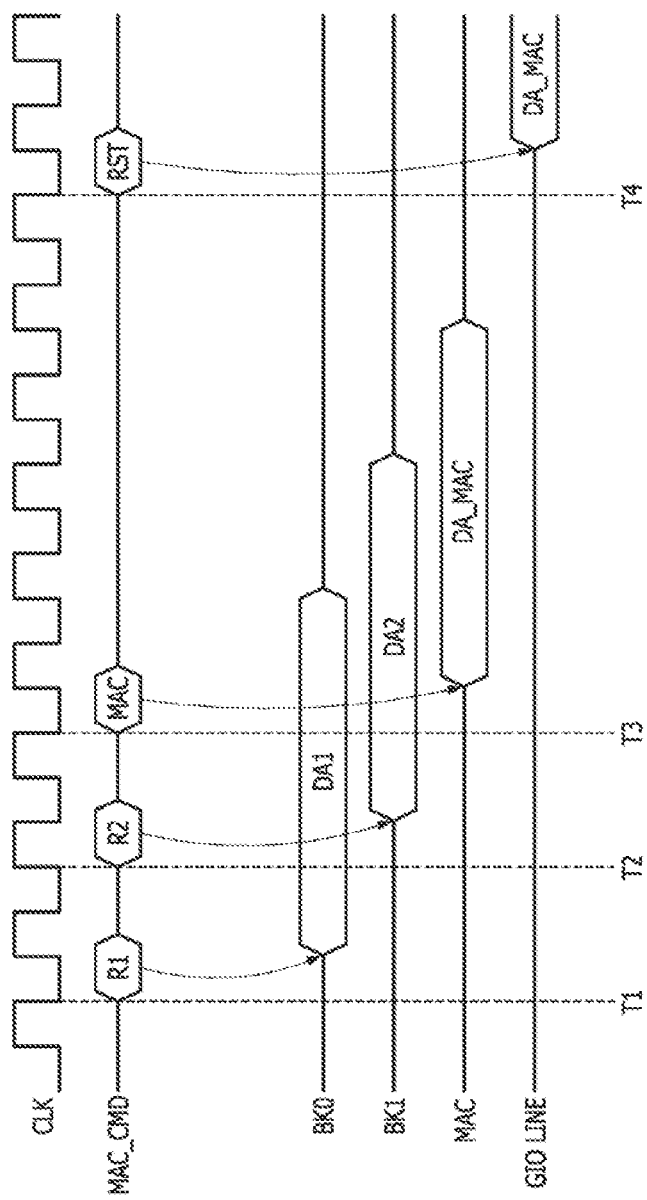
FIG. 15 is a timing diagram illustrating an operation of the PIM device illustrated in FIG. 3.

Next, referring to FIG. 14, the command decoder 250 may output and transmit the result read signal READ_RST having a logic "high(H)" level to the MAC command generator 270. The MAC command generator 270 may generate and output the MAC result latch signal MAC_L_RST having a logic "high" level in response to the result read signal READ_RST having a logic "high(H)" level. The MAC result latch signal MAC_L_RST having a logic "high" level may be transmitted to the first MAC operator (MAC0) 220. As described with reference to FIG. 7, the first MAC operator (MAC0) 220 may output the MAC result data DA_MAC to the GIO line 290 in response to the MAC result latch signal MAC_L_RST having a logic "high" level and may also reset the output latch (223-1 of FIG. 6) included in the first MAC operator (MAC0) 220 in response to the MAC result latch signal MAC_L_RST having a logic "high" level. The MAC result data DA_MAC transmitted to the GIO line 290 may be outputted to an external device through the serializer/deserializer 280 and the data I/O circuit 240, FIG. 15 is a timing diagram illustrating an operation of the PIM device 200 illustrate in FIG. 3. Referring to FIG. 15, at a first point in time "T1", the MAC command generator 270 may be synchronized with a falling edge of a clock signal CLK to generate and output the first MAC read signal MAC_RD_BK0 (R1) having a logic "high(H)" level. The first memory bank (BK0) 211 may be selected by the first MAC read signal MAC_RD_BK0 (R1) having a logic "high(H)" level so that the first data DA1 are read out of the first memory bank (BK0) 211. At a second point in time "T2", the MAC command generator 270 may be synchronized with a falling edge of the clock signal CLK to generate and output the second MAC read signal MAC_RD_BK1 (R2) having a logic "high(H)" level. The second memory bank (BK1) 212 may be selected by the second MAC read signal MAC_RD_BK1 (R2) having a logic "high(H)" level so that the second data DA2 are read out of the second memory bank (BK1) 212. At a third point in time "T3", the MAC command generator 270 may be synchronized with a falling edge of the clock signal CLK to generate and output the MAC arithmetic signal MAC having a logic "high(H)" level. The first MAC operator (MAC0) 220 may perform the multiplying calculations and the adding calculations of the first and second data DA1 and DA2 to generate the MAC result data DA_MAC, in response to the MAC arithmetic signal MAC having a logic "high(H)" level. At a fourth point in time "T4", the MAC command generator 270 may be synchronized with a falling edge of the dock signal CLK to generate and output the MAC result latch signal MAC_L_RST (RST) having a logic "high" level. The MAC result data DA_MAC generated by the first MAC operator (MAC0) 220 may be transmitted to the GIO line 290 by the MAC result latch signal MAC_L_RST (RST) having a logic "high" level.

Figure 16:
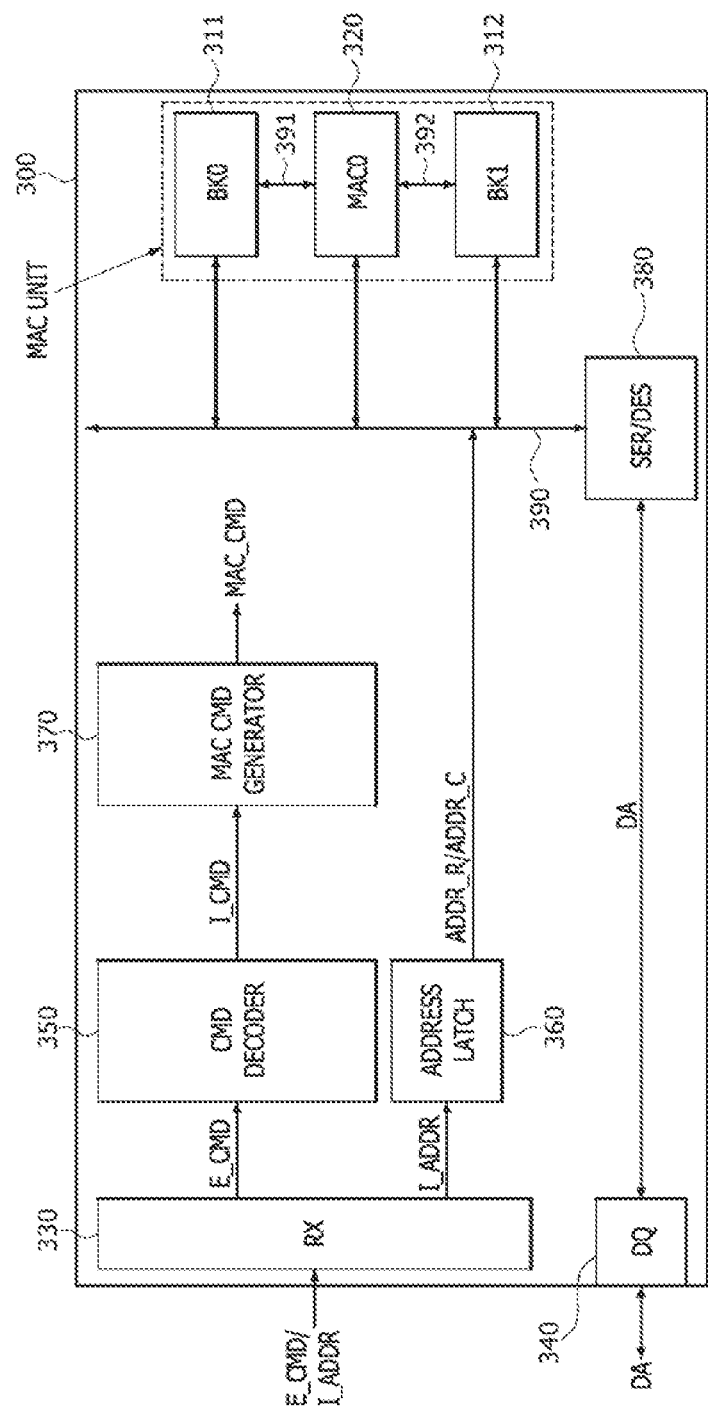
FIG. 16 is a block diagram illustrating another configuration of a PIM device according to the first embodiment of the present disclosure.
Figure 17:
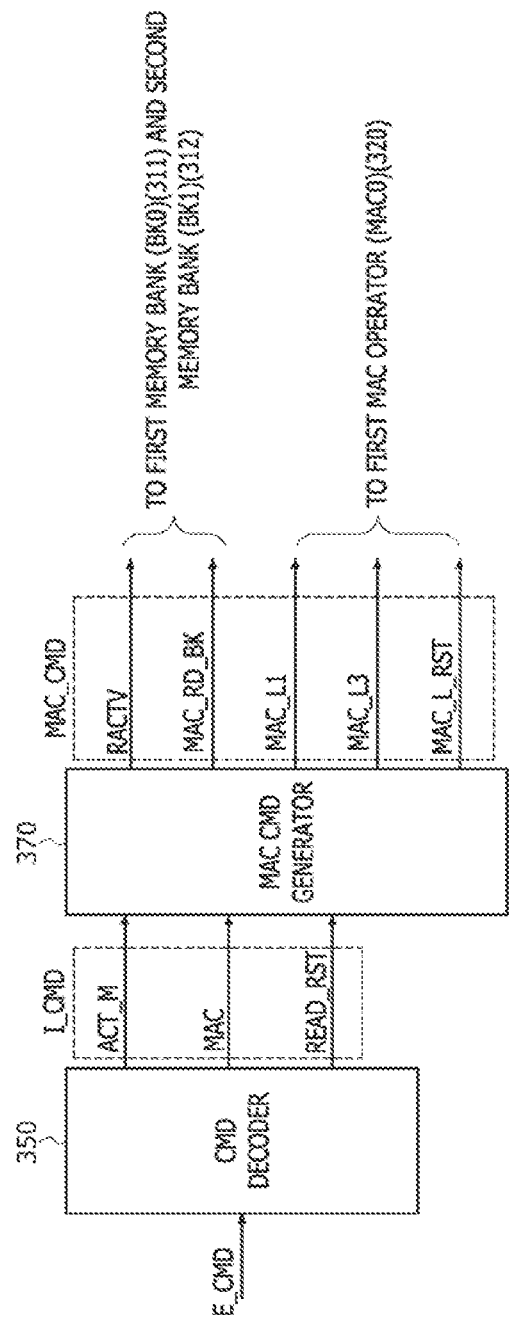
FIG. 17 illustrates internal command signals outputted from a command decoder and MAC command signals outputted from a MAC command generator in the PIM device of FIG. 16.

FIG. 16 is a block diagram illustrating another configuration of a PIM device 300 according to an embodiment of the present disclosure, and FIG. 17 illustrates an internal command signal outputted from a command decoder 350 of the PIM device 300 and a MAC command signal MAC_CMD outputted from a MAC command generator 370 of the PIM device 300. FIG. 16 illustrates only a first memory bank (BK0) 311, a second memory bank (BK1) 312, and a first MAC operator (MAC0) 320 constituting a first MAC unit among the plurality of MAC units. However, FIG. 16 illustrates merely an example for simplification of the drawing. Accordingly, the following description for the first MAC unit may be equally applicable to the remaining MAC units.

Referring to FIG. 16, the PIM device 300 may be configured to include the first memory bank (BK0) 311, the second memory bank (BK1) 312, and the first MAC operator (MAC0) 320. The PIM device 300 according to the present embodiment may include a GIO line 390, a first bank input/output (BIO) line 391, and a second BIO line 392 acting as data transmission lines. Data communication of the first memory bank (BK0) 311, the second memory bank (BK1) 312, and the first MAC operator (MAC0) 320 may be achieved through the GIO line 390. Only the data transmission between the first memory bank (BK0) 311 and the first MAC operator (MAC0) 320 may be achieved through the first BIO line 391, and only the data transmission between the second memory bank (BK1) 312 and the first MAC operator (MAC0) 320 may be achieved through the second BIO line 392. Thus, the first MAC operator (MAC0) 320 may directly receive first data and second data from the first and second memory banks (BK0 and BK1) 311 and 312 through the first BIO line 391 and the second BIO line 392 without using the GIO line 390.

The PIM device 300 may further include a receiving driver (RX) 330, a data I/O circuit (DQ) 340, the command decoder 350, an address latch 360, the MAC command generator 370, and a serializer/deserializer (SER/DES) 380. The command decoder 350, the address latch 360, the MAC command generator 370, and the serializer/deserializer 380 may be disposed in the peripheral circuit PERI of the PIM device 100 illustrated in FIG. 2. The receiving driver 330 may receive an external command E_CMD and an input address I_ADDR from an external device. The external device may denote a host or a controller coupled to the PIM device 300. Hereinafter, it may be assumed that the external command E_CMD transmitted to the PIM device 300 is a command requesting the MAC arithmetic operation. That is, the PIM device 300 may perform the deterministic MAC arithmetic operation in response to the external command E_CMD. The data I/O circuit 340 may include a data I/O pad. The data I/O pad may be coupled with a data I/O line. The PIM device 300 communicates with the external device through the data I/O circuit 340.

The receiving driver 330 may separately output the external command E_CMD and the input address I_ADDR received from the external device. Data DA inputted to the PIM device 300 through the data I/O circuit 340 may be processed by the serializer/deserializer 380 and may be transmitted to the first memory bank (BK0) 311 and the second memory bank (BK1) 312 through the GIO line 390 of the PIM device 300. The data DA outputted from the first memory bank (BK0) 311, the second memory bank (BK1) 312, and the first MAC operator (MAC0) 320 through the GIO line 390 may be processed by the serializer/deserializer 380 and may be outputted to the external device through the data I/O circuit 340. The serializer/deserializer 380 may convert the data DA into parallel data if the data DA are serial data or may convert the data DA into serial data if the data DA are parallel data. For the data conversion, the serializer/deserializer 380 may include a serializer for converting parallel data into serial data and a deserializer for converting serial data into parallel data.

The command decoder 350 may decode the external command E_CMD outputted from the receiving driver 330 to generate and output the internal command signal I_CMD. As illustrated in FIG. 17, the internal command signal I_CMD outputted from the command decoder 350 may include first to third internal command signals. In an embodiment, the first internal command signal may be a memory active signal ACT_M, the second internal command signal may be a MAC arithmetic signal MAC, and the third internal command signal may be a result read signal READ_RST. The first to third internal command signals outputted from the command decoder 350 may be sequentially inputted to the MAC command generator 370.

In order to perform the deterministic MAC arithmetic operation of the PIM device 300, the memory active signal ACT_M, the MAC arithmetic signal MAC, and the result read signal READ_RST outputted from the command decoder 350 may be sequentially generated at predetermined points in time (or clocks). In an embodiment, the memory active signal ACT_M, the MAC arithmetic signal MAC, and the result read signal READ_RST may have predetermined latencies, respectively. For example, the MAC arithmetic signal MAC may be generated after a first latency elapses from a point in time when the memory active signal ACT_M is generated, and the result read signal READ_RST may be generated after a third latency elapses from a point in time when the MAC arithmetic signal MAC is generated. No signal is generated by the command decoder 350 until a fourth latency elapses from a point in time when the result read signal READ_RST is generated. The first to fourth latencies may be predetermined and fixed. Thus, the host or the controller outputting the external command E_CMD may predict the points in time when the first to third internal command signals constituting the internal command signal I_CMD are generated by the command decoder 350 in advance at a point in time when the external command E_CMD is outputted from the host or the controller. That is, the host or the controller may predict a point in time (or a clock) when the MAC arithmetic operation terminates in the PIM device 300 after the external command E_CMD requesting the MAC arithmetic operation is transmitted from the host or the controller to the PIM device 300, even without receiving any signals from the PIM device 300.

The address latch 360 may convert the input address I_ADDR outputted from the receiving driver 330 into a row/column address ADDR_R/ADDR_C to output the row/column address ADDR_R/ADDR_C. The row/column address ADDR_R/ADDR_C outputted from the address latch 360 may be transmitted to the first and second memory banks 311 and 312. According to the present embodiment, the first data and the second data to be used for the MAC arithmetic operation may be simultaneously read out of the first and second memory banks (BK0 and BK1) 311 and 312, respectively. Thus, it may be unnecessary to generate a bank selection signal for selecting any one of the first and second memory banks 311 and 312. In an embodiment, a point in time when the row/column address ADDR_R/ADDR_C is inputted to the first and second memory banks 311 and 312 may be a point in time when a MAC command (i.e., the MAC arithmetic signal MAC) requesting a data read operation for the first and second memory banks 311 and 312 for the MAC arithmetic operation is generated.

The MAC command generator 370 may output the MAC command signal MAC_CMD in response to the internal command signal I_CMD outputted from the command decoder 350. As illustrated in FIG. 16, the MAC command signal MAC_CMD outputted from the MAC command generator 370 may include first to fifth MAC command signals. In an embodiment, the first MAC command signal may be a MAC active signal RACTV, the second MAC command signal may be a MAC read signal MAC_RD_BK, the third MAC command signal may be a MAC input latch signal MAC_L1, the fourth MAC command signal may be a MAC output latch signal MAC_L3, and the fifth MAC command signal may be a MAC result latch signal MAC_L_RST.

The MAC active signal RACTV may be generated based on the memory active signal ACT_M outputted from the command decoder 350. The MAC read signal MAC_RD_BK, the MAC input latch signal MAC_L1, the MAC output latch signal MAC_L3, and the MAC result latch signal MAC_L_RST may be sequentially generated based on the MAC arithmetic signal MAC outputted from the command decoder 350. That is, the MAC input latch signal MAC_L1 may be generated at a point in time when a certain time elapses from a point in time when the MAC read signal MAC_RD_BK is generated. The MAC output latch signal MAC_L3 may be generated at a point in time when a certain time elapses from a point in time when the MAC input latch signal MAC_L1 is generated. Filially, the MAC result latch signal MAC_L_RST may be generated based on the result read signal READ_RST outputted from the command decoder 350.

The MAC active signal RACTV outputted from the MAC command generator 370 may control an activation operation for the first and second memory banks 311 and 312. The MAC read signal MAC_RD_BK outputted from the MAC command generator 370 may control a data read operation for the first and second memory banks 311 and 312. The MAC input latch signal MAC_L1 outputted from the MAC command generator 370 may control an input data latch operation of the first MAC operator (MAC0) 320. The MAC output latch signal MAC_L3 outputted from the MAC command generator 370 may control an output data latch operation of the first MAC operator (MAC0) 320. The MAC result latch signal MAC_L_RST outputted from the MAC command generator 370 may control an output operation of MAC result data of the first MAC operator (MAC0) 320 and a reset operation of the first MAC operator (MAC0) 320.

As described above, in order to perform the deterministic MAC arithmetic operation of the PIM device 300, the memory active signal ACT_M, the MAC arithmetic signal MAC, and the result read signal READ_RST outputted from the command decoder 350 may be sequentially generated at predetermined points in time (or clocks), respectively. Thus, the MAC active signal RACTV, the MAC read signal MAC_RD_BK, the MAC input latch signal MAC_L1, the MAC output latch signal MAC_L3, and the MAC result latch signal MAC_L_RST may also be generated and outputted from the MAC command generator 370 at predetermined points in time after the external command E_CMD is inputted to the PIM device 300, respectively. That is, a time period from a point in time when the first and second memory banks 311 and 312 are activated by the MAC active signal RACTV until a point in time when the first MAC operator (MAC0) 320 is reset by the MAC result latch signal MAC_L_RST may be predetermined.

Figure 18:
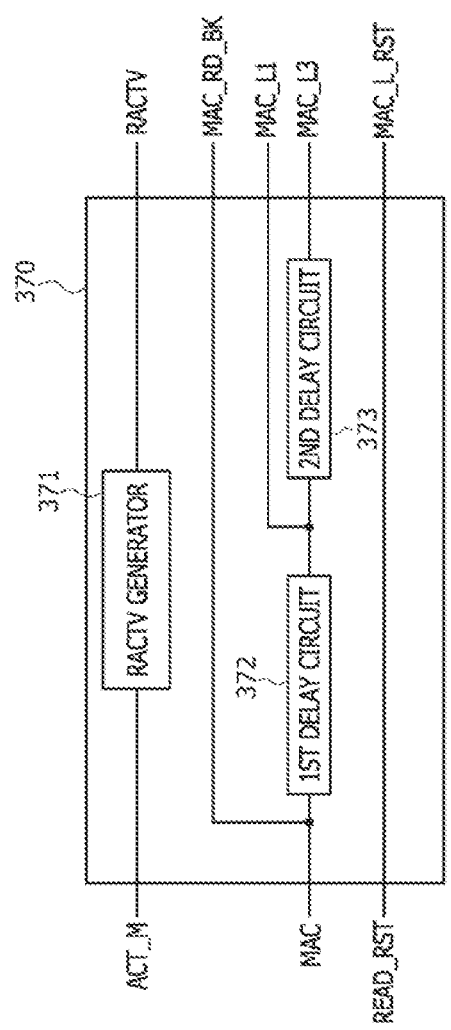
FIG. 18 illustrates an example of a configuration of a MAC command generator included in the PIM device of FIG. 16.

FIG. 18 illustrates an example of a configuration of the MAC command generator 370 included in the PIM device 300 illustrated in FIG. 16. Referring to FIG. 18, the MAC command generator 370 may sequentially receive the memory active signal ACT_M, the MAC arithmetic signal MAC, and the result read signal READ_RST from the command decoder 350. In addition, the MAC command generator 370 may sequentially generate and output the MAC active signal RACTV, the MAC read signal MAC_RD_BK, the MAC input latch signal MAC_L1, the MAC output latch signal MAC_L3, and the MAC result latch signal MAC_L_RST. The MAC active signal RACTV, the MAC read signal MAC_RD_BK, the MAC input latch signal MAC_L1, the MAC output latch signal MAC_L3, and the MAC result latch signal MAC_L_RST may be outputted in series with certain time intervals.

In an embodiment, the MAC command generator 370 may be configured to include an active signal generator 371, a first delay circuit 372, and a second delay circuit 373. The active signal generator 371 may receive the memory active signal ACT_M to generate and output the MAC active signal RACTV. The MAC active signal RACTV outputted from the active signal generator 371 may be transmitted to the first and second memory banks 311 and 312 to activate the first and second memory banks 311 and 312. The MAC command generator 370 may receive the MAC arithmetic signal MAC outputted from the command decoder 350 to output the MAC arithmetic signal MAC as the MAC read signal MAC_RD_BK. The first delay circuit 372 may receive the MAC arithmetic signal MAC and may delay the MAC arithmetic signal MAC by a first delay time DELAY_T1 to generate and output the MAC input latch signal MAC_L1. The second delay circuit 373 may receive an output signal of the first delay circuit 372 and may delay the output signal of the first delay circuit 372 by a second delay time DELAY_T2 to generate and output the MAC output latch signal MAC_L3. The MAC command generator 370 may generate the MAC result latch signal MAC_L_RST in response to the result read signal READ_RST outputted from the command decoder 350.

The MAC command generator 370 may generate and output the MAC active signal RACTV in response to the memory active signal ACT_M outputted from the command decoder 350. Subsequently, the MAC command generator 370 may generate and output the MAC read signal MAC_RD_BK in response to the MAC arithmetic signal MAC outputted from the command decoder 350. The MAC arithmetic signal MAC may be inputted to the first delay circuit 372. The MAC command generator 370 may delay the MAC arithmetic signal MAC by a certain time determined by the first delay circuit 372 to generate and output an output signal of the first delay circuit 372 as the MAC input latch signal MAC_L1. The output signal of the first delay circuit 372 may be inputted to the second delay circuit 373. The MAC command generator 370 may delay the MAC input latch signal MAC_L1 by a certain time determined by the second delay circuit 373 to generate and output an output signal of the second delay circuit 373 as the MAC output latch signal MAC_L3. Subsequently, the MAC command generator 370 may generate and output the MAC result latch signal MAC_L_RST in response to the result read signal READ_RST outputted from the command decoder 350.

Figure 19:
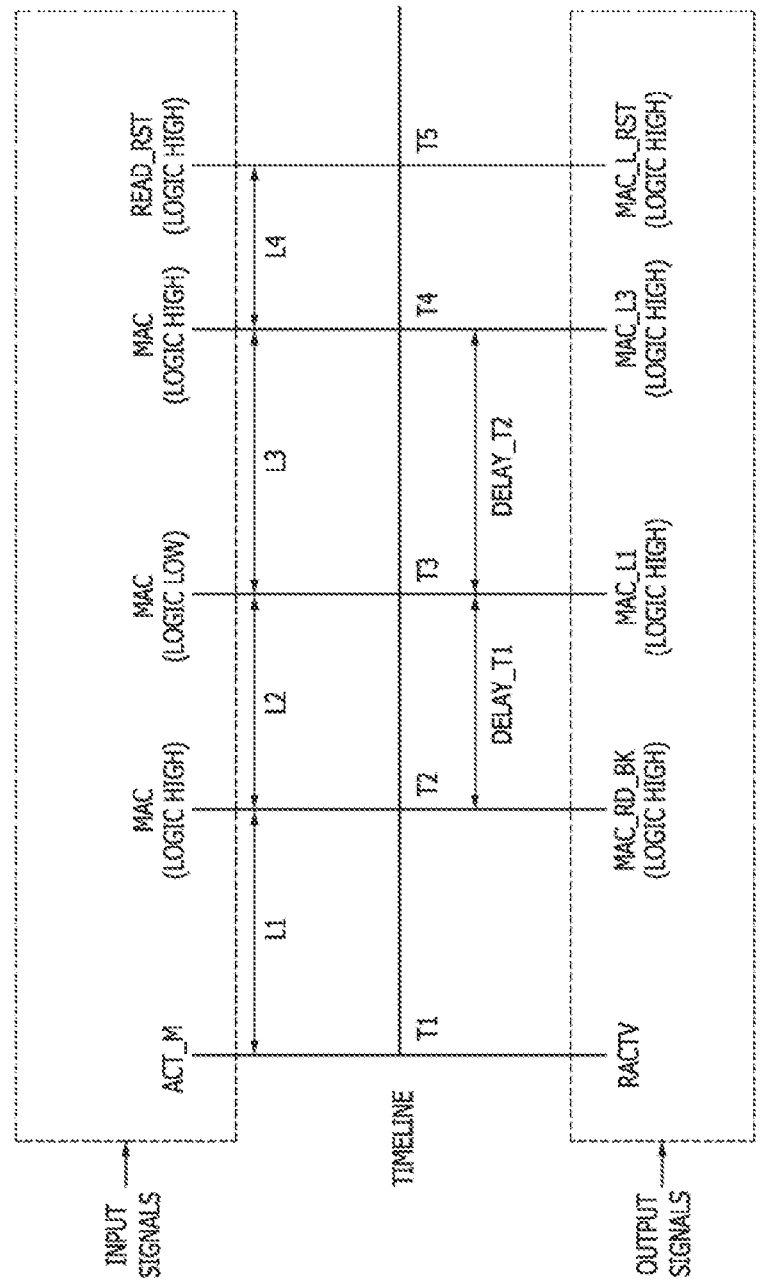
FIG. 19 illustrates input signals and output signals of the MAC command generator illustrated in FIG. 18 with a timeline.

FIG. 19 illustrates input signals and output signals of the MAC command generator 370 illustrated in FIG. 18 with a timeline. In FIG. 19, signals transmitted from the command decoder 350 to the MAC command generator 370 are illustrated in an upper dotted line box, and signals outputted from the MAC command generator 370 are illustrated in a lower dotted line box. Referring to FIGS. 18 and 19, at a first point in time "T1" of the timeline, the memory active signal ACT_M may be inputted to the MAC command generator 370 and the MAC command generator 370 may output the MAC active signal RACTV. At a second point in time "T2" when a certain time, for example, a first latency L1 elapses from the first point in time "T1", the MAC arithmetic signal MAC having a logic "high" level may be inputted to the MAC command generator 370. In response to the MAC arithmetic signal MAC having a logic "high" level, the MAC command generator 370 may output the MAC read signal MAC_RD_BK having a logic "high" level. At a third point in time "T3" when a certain time elapses from the second point in time "T2", a logic level of the MAC arithmetic signal MAC may change from a logic "high" level into a logic "low" level.

At the third point in time "T3" when the first delay time DELAY_T1 elapses from the second point in time "T2", the MAC command generator 370 may output the MAC input latch signal MAC_L1 having a logic "high" level. The first delay time DELAY_T1 may correspond to a delay time determined by the first delay circuit 372 illustrated in FIG. 18. The first delay time DELAY_T1 may be set to be different according to a logic design scheme of the first delay circuit 372. In an embodiment, the first delay time DELAY_T1 may be set to be equal to or greater than a second latency L2. At a fourth point in time "T4" when a certain time elapses from the third point in time "T3", the MAC command generator 370 may output the MAC output latch signal MAC_L3 having a logic "high" level. The fourth point in time "T4" may be a moment when the second delay time DELAY_T2 elapses from the third point in time "T3". The second delay time DELAY_T2 may correspond to a delay time determined by the second delay circuit 373 illustrated in FIG. 18. The second delay time DELAY_T2 may be set to be different according to a logic design scheme of the second delay circuit 373. In an embodiment, the second delay time DELAY_T2 may be set to be equal to or greater than a third latency L3. At a fifth point in time "T5" when a certain time, for example, a fourth L4 elapses from the fourth point in time "T4", the result read signal READ_RST having a logic "high" level may be inputted to the MAC command generator 370. In response to the result read signal READ_RST having a logic "high" level, the MAC command generator 370 may output the MAC result latch signal MAC_L_RST having a logic "high" level, as described with reference to FIG. 18.

In order to perform the deterministic MAC arithmetic operation, moments when the internal command signals ACT_M, MAC, and READ_RST generated by the command decoder 350 are inputted to the MAC command generator 370 may be fixed and moments when the MAC command signals RACTV, MAC_RD_BK, MAC_L1, MAC_L3, and MAC_L_RST are outputted from the MAC command generator 370 in response to the internal command signals ACT_M, MAC, and READ_RST may also be fixed. Thus, all of the first latency L1 between the first point in time "T1" and the second point in time "T2", the second latency L2 between the second point in time "T2" and the third point in time "T3", the third latency L3 between the third point in time "T3" and the fourth point in time "T4", and the fourth latency L4 between the fourth point in time "T4" and the fifth point in time "T5" may have fixed values.

In an embodiment, the first latency L1 may be defined as a time it takes to activate both of the first and second memory banks based on the MAC active signal RACTV. The second latency L2 may be defined as a time it takes to read the first and second data out of the first and second memory banks (BK0 and BK1) 311 and 312 based on the MAC read signals MAC_RD_BK and to input the first and second data DA1 and DA2 into the first MAC operator (MAC0) 320. The third latency L3 may be defined as a time it takes to latch the first and second data DA1 and DA2 in the first MAC operator (MAC0) 320 based on the MAC input latch signals MAC_L1 and it takes the first MAC operator (MAC0) 320 to perform the MAC arithmetic operation of the first and second data. The fourth latency L4 may be defined as a time it takes to latch the output data in the first MAC operator (MAC0) 320 based on the MAC output latch signal MAC_L3.

Figure 20:
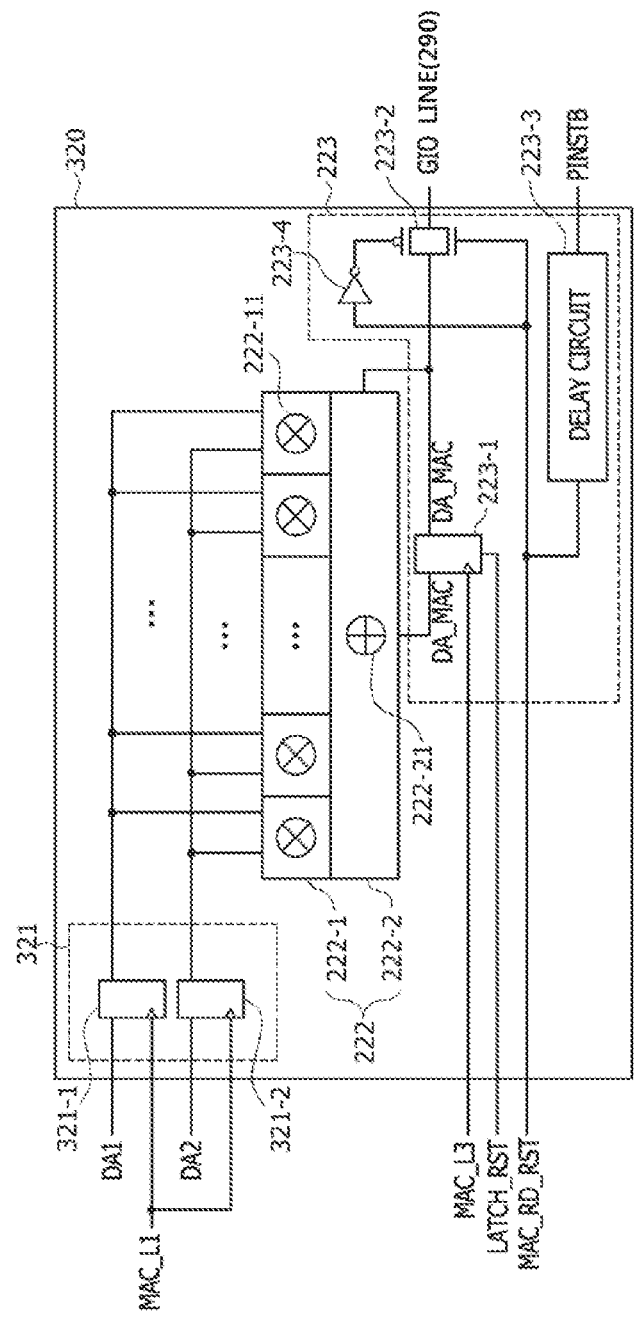
FIG. 20 illustrates an example of a configuration of a MAC operator included in the PIM device of FIG. 16.
Figure 21:
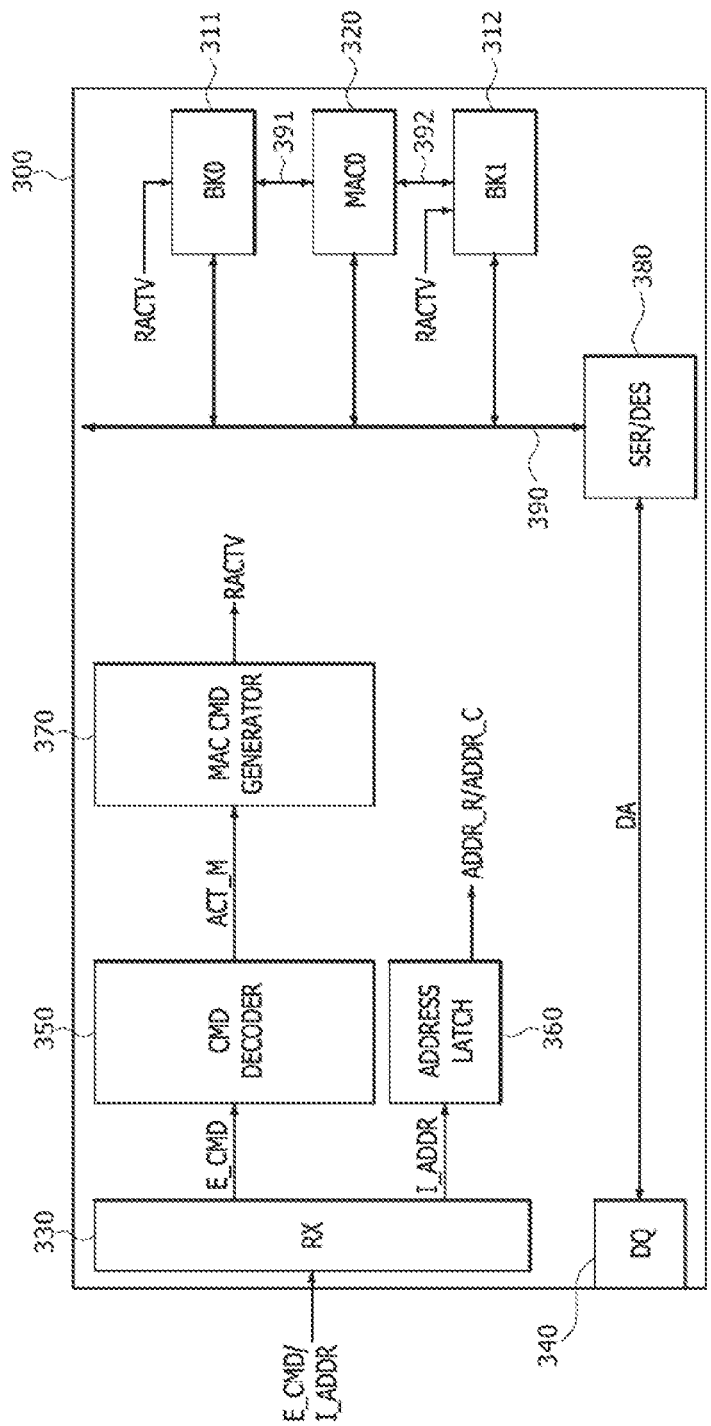
FIGS. 21 to 25 are block diagrams illustrating operations of the PIM device illustrated in FIG. 16.

FIG. 20 illustrates an example of a configuration of the first MAC operator (MAC0) 320 included in the PIM device 300 of FIG. 16. The first MAC operator (MAC0) 320 included in the PIM device 300 may have the same configuration as the first MAC operator (MAC0) 220 described with reference to FIG. 7 except for a signal applied to dock terminals of first and second input latches 321-1 and 321-2 constituting a data input circuit 321. Thus, in FIG. 20, the same reference numerals or the same reference symbols as used in FIG. 7 denote the same elements, and descriptions of the same elements as set forth with reference to FIG. 7 will be omitted hereinafter.

Describing in detail the differences between the first MAC operator (MAC0) 220 and the first MAC operator (MAC0) 320, in case of the first MAC operator (MAC0) 220 illustrated in FIG. 7, the first input latch (221-1 of FIG. 7) and the second input latch (221-2 of FIG. 7) of the data input circuit (221 of FIG. 7) may be synchronized with the first and second MAC input latch signals MAC_L1 and MAC_L2, respectively, sequentially generated with a certain time interval to output the first data DA1 and the second data DA2. In contrast, in case of the first MAC operator (MAC0) 320, the MAC input latch signal MAC_L1 may be inputted to both of the clock terminals of the first and second input latches 321-1 and 321-2 constituting a data input circuit 321. Thus, both of the first and second input latches 321-1 and 321-2 may be synchronized with the MAC input latch signal MAC_L1 to output the first data DA1 and the second data DA2, respectively. Accordingly, the first MAC operator (MAC0) 320 may transmit the first and second data DA1 and DA2 to the MAC circuit 222 in parallel without any time interval between the first and second data DA1 and DA2. As a result, the MAC arithmetic operation of the MAC circuit 222 may be quickly performed without any delay of data input time.

FIGS. 21 to 25 are block diagrams illustrating operations of the PIM device 300 illustrated in FIG. 16. In FIGS. 21 to 25, the same reference numerals or the same reference symbols as used in FIG. 16 denote the same elements. First, referring to FIG. 21, if the external command E_CMD requesting the MAC arithmetic operation and the input address I_ADDR are transmitted from an external device to the receiving driver 330, the receiving driver 330 may output the external command E_CMD and the input address I_ADDR to the command decoder 350 and the address latch 360, respectively. The command decoder 350 may decode the external command E_CMD to generate and transmit the memory active signal ACT_M to the MAC command generator 370. The MAC command generator 370 may generate and output the MAC active signal RACTV in response to the memory active signal ACT_M. The MAC active signal RACTV may be transmitted to the first memory bank (BK0) 311 and the second memory bank (BK1) 312. Both of the first memory bank (BK0) 311 and the second memory bank (BK1) 312 may be activated by the MAC active signal RACTV.

Figure 22:
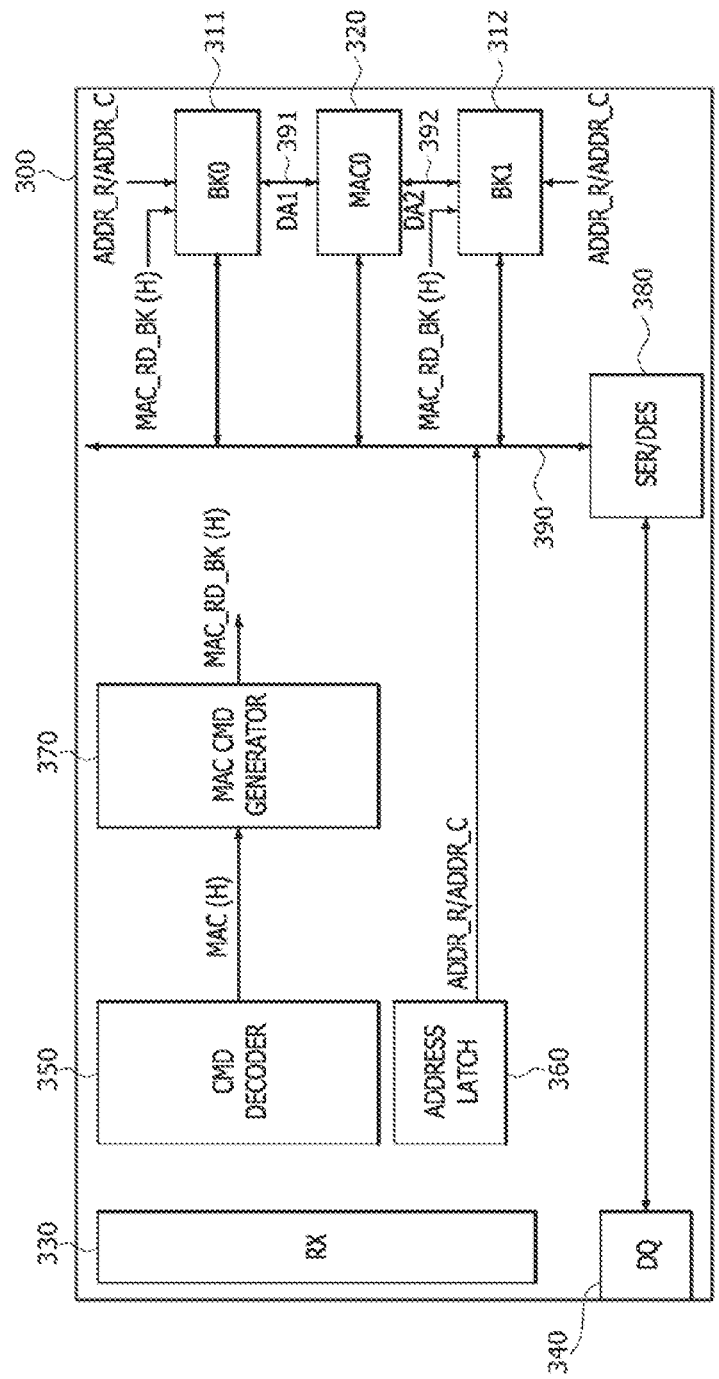

Next, referring to FIG. 22, the command decoder 350 may generate and output the MAC arithmetic signal MAC having a logic "high(H)" level to the MAC command generator 370. In response to the MAC arithmetic signal MAC having a logic "high(H)" level, the MAC command generator 370 may generate and output the MAC read signal MAC_RD_BK having a logic "high(H)" level. The MAC read signal MAC_RD_BK having a logic "high(H)" level, together with the row/column address ADDR_R/ADDR_C, may be transmitted to the first memory bank (BK0) 311 and the second memory bank (BK1) 312. The first data DA1 may be read out of the first memory bank (BK0) 311 by the MAC read signal MAC_RD_BK having a logic "high(H)" level and may be transmitted to the first MAC operator (MAC0) 320 through the first BIO line 391. In addition, the second data DA2 may be read out of the second memory bank (BK1) 312 by the MAC read signal MAC_RD_BK having a logic "high(H)" level and may be transmitted to the first MAC operator (MAC0) 320 through the second BIO line 392.

Figure 23:
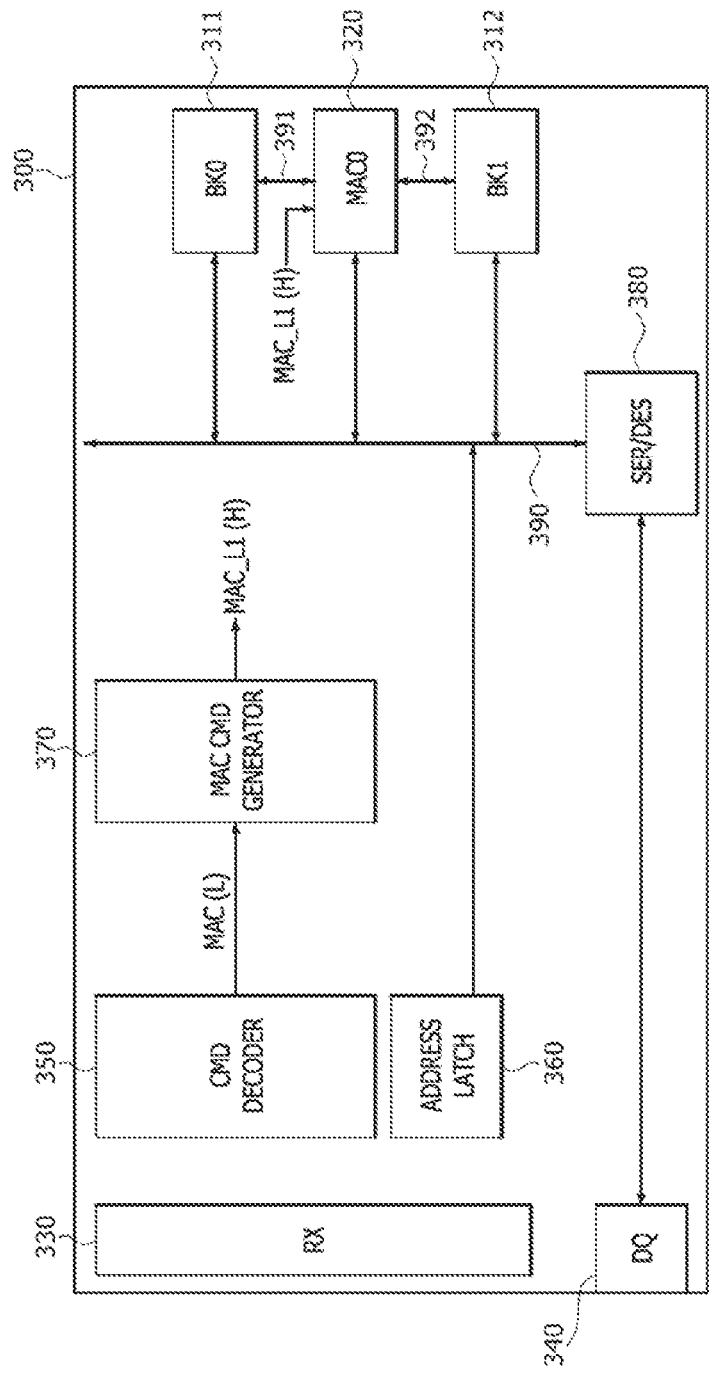

Next, referring to FIG. 23, a logic level of the MAC arithmetic signal MAC outputted from the command decoder 350 may change from a logic "high(H)" level into a logic "low(L)" level at a point in time when the first delay time DELAY_T1 determined by the first delay circuit (372 of FIG. 18) elapses from a point in time when the MAC read signal MAC_RD_BK is outputted from the MAC command generator 370. The MAC command generator 370 may generate and output the MAC input latch signal MAC_L1 having a logic "high(H)" level in response to the MAC arithmetic signal MAC having a logic "low(L)" level. The MAC input latch signal MAC_L1 having a logic "high(H)" level may be transmitted to the first MAC operator (MAC0) 320. The first MAC operator (MAC0) 320 may be synchronized with the MAC input latch signal MAC_L1 having a logic "high(H)" level to perform a latch operation of the first and second data DA1 and DA2 outputted from the first and second memory banks (BK0 and BK1) 311 and 312. If the latch operation of the first and second data DA1 and DA2 terminates, the first MAC operator (MAC0) 320 may perform the MAC arithmetic operation and may generate the MAC result data DA_MAC. The MAC result data DA_MAC generated by the first MAC operator (MAC0) 320 may be inputted to the output latch (223-1 of FIG. 20) included in the first MAC operator (MAC0) 320.

Figure 24:
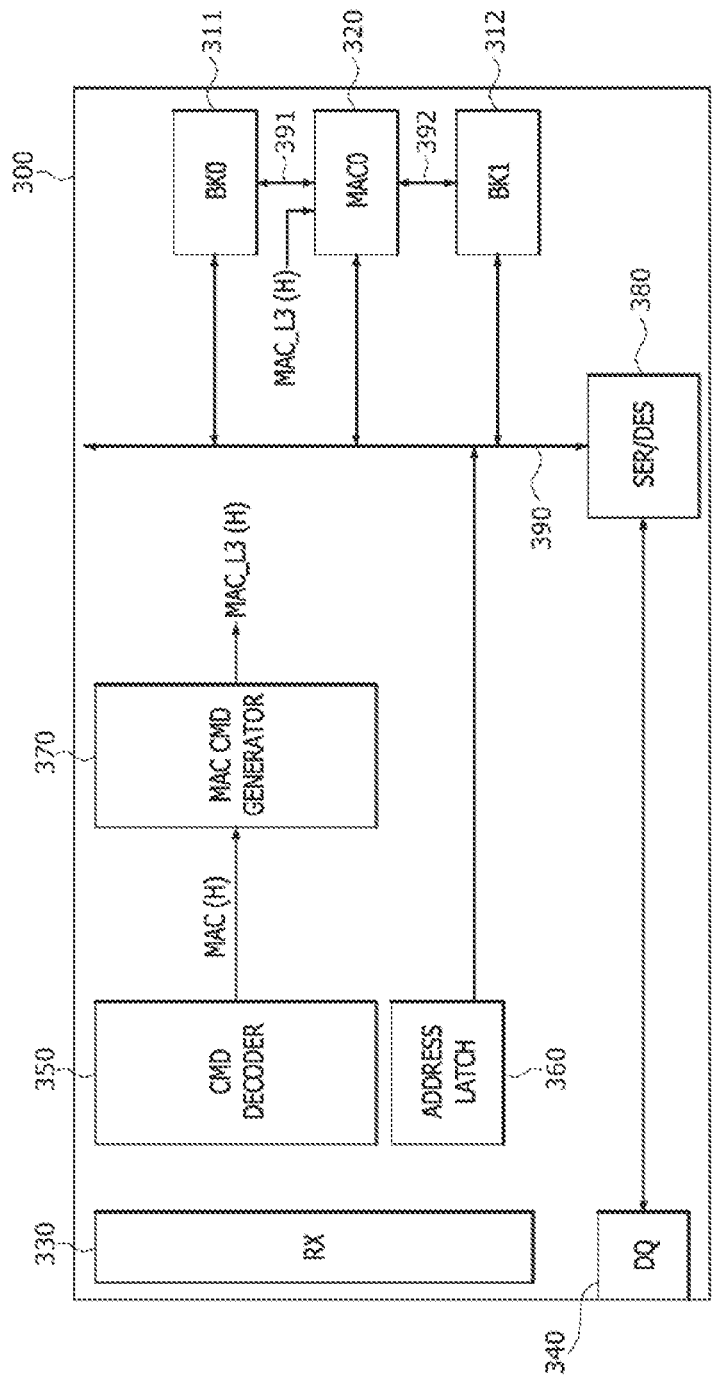

Next, referring to FIG. 24, a logic level of the MAC arithmetic signal MAC outputted from the command decoder 350 may change from a logic "low(L)" level into a logic "high(H)" level at a point in time when the second delay time DELAY_T2 determined by the second delay circuit (373 of FIG. 18) elapses from a point in time when the MAC input latch signal MAC_L1 having a logic "high (H)" level is outputted from the MAC command generator 370. The MAC command generator 370 may generate and output the MAC output latch signal MAC_L3 having a logic "high(H)" level in response to the MAC arithmetic signal MAC having a logic "high(H)" level. The MAC output latch signal MAC_L3 having a logic "high(H)" level may be transmitted to the first MAC operator (MAC0) 320. The output latch (223-1 of FIG. 20) included in the first MAC operator (MAC0) 320 may be synchronized with the MAC output latch signal MAC_L3 having a logic "high(H)" level to transfer the MAC result data DA_MAC generated by the MAC circuit (222 of FIG. 20) to the transfer gate (223-2 of FIG. 20) included in the first MAC operator (MAC0) 320. The MAC result data DA_MAC outputted from the output latch (223-1 of FIG. 20) may be fed back to the addition logic circuit circuit (222-2 of FIG. 20) for the accumulative adding calculation executed by the MAC circuit (222 of FIG. 20).

Figure 25:
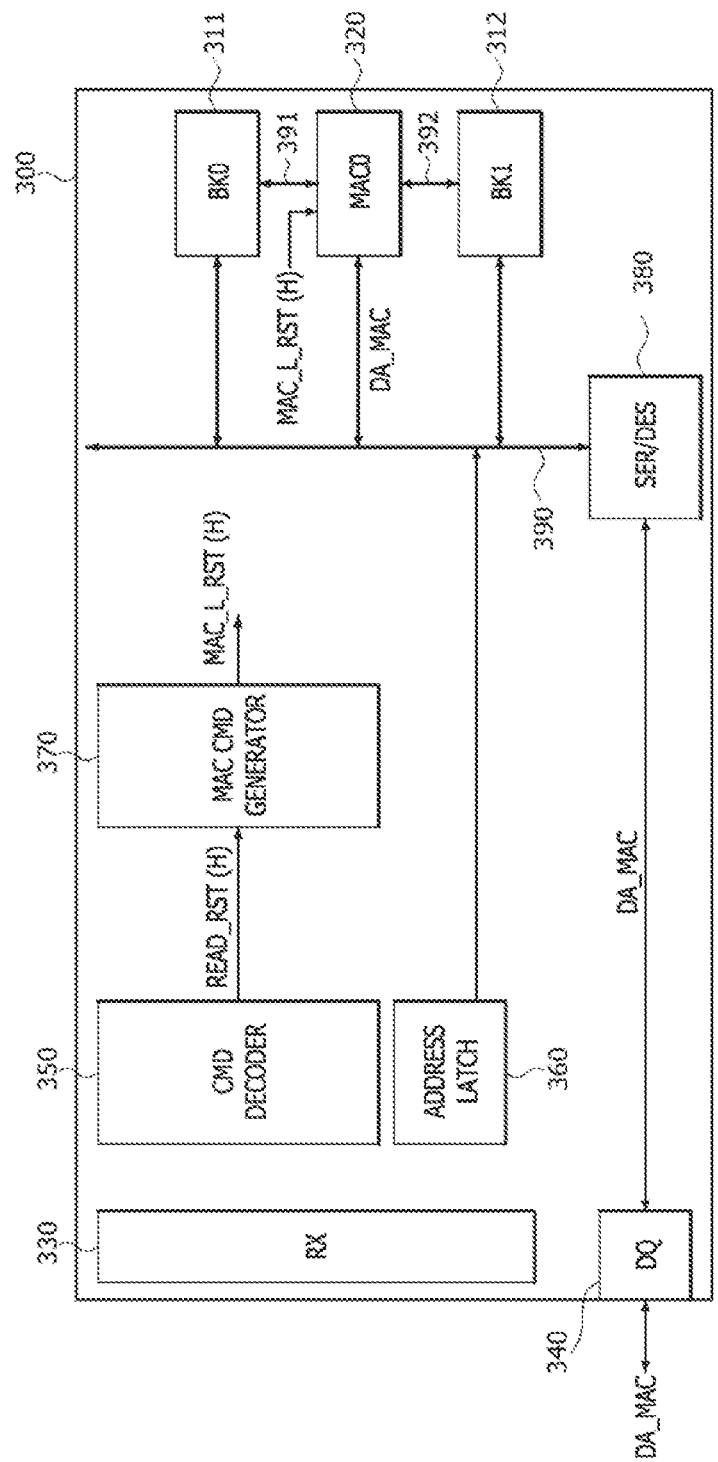

Next, referring to FIG. 25, the command decoder 350 may output and transmit the result read signal READ_RST having a logic "high(H)" level to the MAC command generator 370. The MAC command generator 370 may generate and output the MAC result latch signal MAC_L_RST having a logic "high" level in response to the result read signal READ_RST having a logic "high(H)" level. The MAC result latch signal MAC_L_RST having a logic "high" level may be transmitted to the first MAC operator (MAC0) 320. As described with reference to FIG. 20, the first MAC operator (MAC0) 320 may output the MAC result data DA_MAC to the GIO line 390 in response to the MAC result latch signal MAC_L_RST having a logic "high" level and may also reset the output latch (223-1 of FIG. 20) included in the first MAC operator (MAC0) 320 in response to the MAC result latch signal MAC_L_RST having a logic "high" level. The MAC result data DA_MAC transmitted to the GIO line 390 may be outputted to an external device through the serializer/deserializer 380 and the data I/O line 340. Although not shown in the drawings, the MAC result data DA_MAC outputted from the first MAC operator (MAC0) 320 may be written into the first memory bank (BK0) 311 through the first BIO line 391 without using the GIO line 390 or may be written into the second memory bank (BK1) 312 through the second BIO line 392 without using the GIO line 390.

Figure 26:
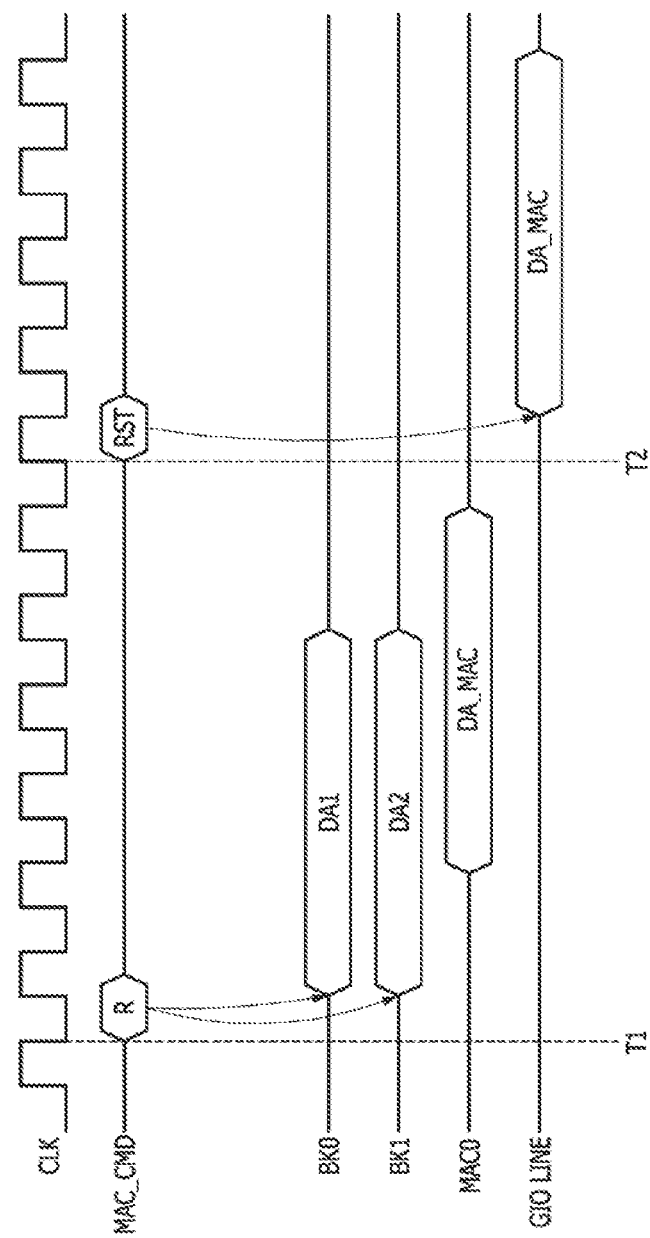
FIG. 26 is a timing diagram an operation of the PIM device illustrated in FIG. 16.

FIG. 26 is a timing diagram illustrating an operation of the PIM device 300 illustrated in FIG. 16. Referring to FIG. 26, at a first point in time "T1" the MAC command generator 370 may be synchronized with a falling edge of a dock signal CLK to generate and output the MAC read signal MAC_RD_BK (R) having a logic "high(H)" level. The first and second memory banks (BK0 and BK1) 311 and 312 may be selected by the MAC read signal MAC_RD_BK (R) having a logic "high(H)" level so that the first data DA1 and the second data DA2 are read out of the first and second memory banks (BK0 and BK1) 311 and 312. If a certain time elapses from a point in time when first data DA1 and the second data DA2 are read out, the first MAC operator (MAC0) 320 may perform the MAC arithmetic operation of the first and second data DA1 and DA2 to generate the MAC result data DA_MAC. At a second point in time "T2", the MAC command generator 370 may be synchronized with a falling edge of the clock signal CLK to generate and output the MAC result latch signal MAC_L_RST (RST) having a logic "high" level. The MAC result data DA_MAC may be transmitted to the GIO line 390 by the MAC result latch signal MAC_L_RST (RST) having a logic "high" level.

Figure 27:
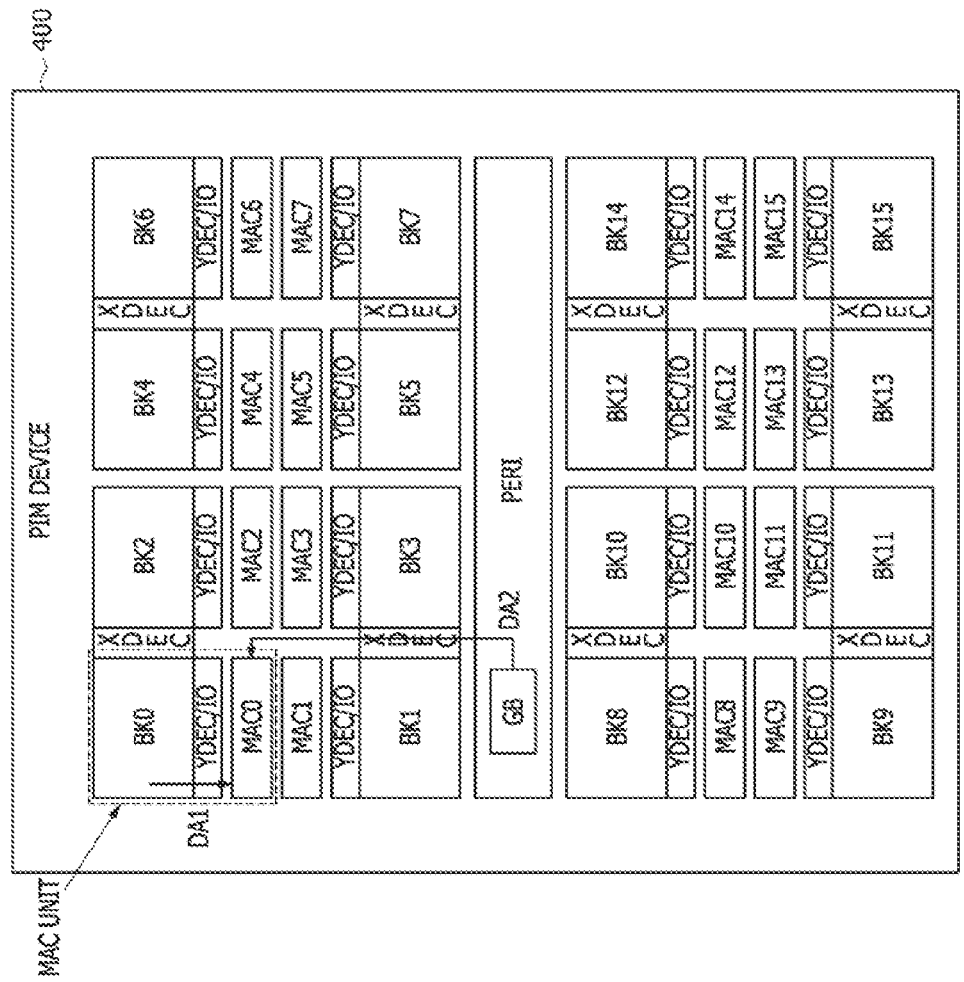
FIG. 27 is a schematic diagram illustrating an arrangement of memory banks and multiplication/accumulation (MAC) operators included in a PIM device according to a second embodiment of the present disclosure.

FIG. 27 illustrates a disposal structure indicating placement of memory banks and MAC operators included in a PIM device 400 according to another embodiment of the present disclosure. Referring to FIG. 27, the PIM device 400 may include memory devices such as a plurality of memory banks (e.g., first to sixteenth memory banks BK0, . . . , and BK15), processing devices such as a plurality of MAC operators (e.g., first to sixteenth MAC operators MAC0, . . . , and MAC15), and a global buffer GB. A core circuit may be disposed to be adjacent to the memory banks BK0, . . . , and BK15. The core circuit may include X-decoders XDECs and Y-decoders/IO circuits YDEC/IOs. The memory banks BK0, . . . , and BK15 and the core circuit may have the same configuration as described with reference to FIG. 2. Thus, descriptions of the memory banks BK0, . . . , and BK15 and the core circuit will be omitted hereinafter. The MAC operators MAC0, . . . , and MAC15 may be disposed to be allocated to the memory banks BK0, . . . , and BK15, respectively. That is, in the PIM device 400, two or more memory banks do not share one MAC operator with each other. Thus, the number of the MAC operators MAC0, . . . , and MAC15 included in the PIM device 400 may be equal to the number of the memory banks BK0, . . . , and BK15 included in the PIM device 400. One of the memory banks BK0, . . . , and BK15 together with one of the MAC operators MAC0, . . . , and MAC15 may constitute one MAC unit. For example, the first memory bank BK0 and the first MAC operator MAC0 may constitute a first MAC unit, and the second memory bank BK1 and the second MAC operator MAC1 may constitute a second MAC unit. Similarly, the sixteenth memory bank BK15 and the sixteenth MAC operator MAC15 may constitute a sixteenth MAC unit. In each of the first to sixteenth MAC units, the MAC operator may receive first data DA1 to be used for the MAC arithmetic operation from the respective memory bank.

The PIM device 400 may further include a peripheral circuit PERI. The peripheral circuit PERI may be disposed in a region other than an area in which the memory banks BK0, BK1, . . . , and BK15; the MAC operators MAC0, . . . , and MAC15; and the core circuit are disposed. The peripheral circuit PERI may be configured to include a control circuit relating to a command/address signal, a control circuit relating to input/output of data, and a power supply circuit. The peripheral circuit PERI of the PIM device 400 may have substantially the same configuration as the peripheral circuit PERT of the PIM device 100 illustrated in FIG. 2. A difference between the peripheral circuit PERI of the PIM device 400 and the peripheral circuit PERI of the PIM device 100 is that the global buffer GB is disposed in the peripheral circuit PERI of the PIM device 400. The global buffer GB may receive second data DA2 to be used for the MAC operation from an external device and may store the second data DA2. The global buffer GB may output the second data DA2 to each of the MAC operators MAC0, . . . , and MAC15 through a GIO line. In the event that the PIM device 400 performs neural network calculation, for example, an arithmetic operation in a deep learning process, the first data DA1 may be weight data and the second data DA2 may be vector data.

The PIM device 400 according to the present embodiment may operate in a memory mode or a MAC arithmetic mode. In the memory mode, the PIM device 400 may operate to perform the same operations as general memory devices. The memory mode may include a memory read operation mode and a memory write operation mode. In the memory read operation mode, the PIM device 400 may perform a read operation for reading out data from the memory banks BK0, BK1, . . . , and BK15 to output the read data, in response to an external request. In the memory write operation mode, the PIM device 400 may perform a write operation for storing data provided by an external device into the memory banks BK0, BK1, . . . , and BK15, in response to an external request. In the MAC arithmetic mode, the PIM device 400 may perform the MAC arithmetic operation using the MAC operators MAC0, . . . , and MAC15. In the PIM device 400, the MAC arithmetic operation may be performed in a deterministic way, and the deterministic MAC arithmetic operation of the PIM device 400 will be described more fully hereinafter. Specifically, the PIM device 400 may perform the read operation of the first data DA1 for each of the memory banks BK0, . . . , and BK15 and the read operation of the second data DA2 for the global buffer GB, for the MAC arithmetic operation in the MAC arithmetic mode. In addition, each of the MAC operators MAC0, . . . , and MAC15 may perform the MAC arithmetic operation of the first data DA1 and the second data DA2 to store a result of the MAC arithmetic operation into the memory bank or to output the result of the MAC arithmetic operation to an external device. In some cases, the PIM device 400 may perform a data write operation for storing data to be used for the MAC arithmetic operation into the memory banks before the data read operation for the MAC arithmetic operation is performed in the MAC arithmetic mode.

The operation mode of the PIM device 400 according to the present embodiment may be determined by a command which is transmitted from a host or a controller to the PIM device 400. In an embodiment, if a first external command requesting a read operation or a write operation for the memory banks BK0, BK1, . . . , and BK15 is transmitted from the host or the controller to the PIM device 400, the PIM device 400 may perform the data read operation or the data write operation in the memory mode. Alternatively, if a second external command requesting the MAC arithmetic operation is transmitted from the host or the controller to the PIM device 400, the PIM device 400 may perform the data read operation and the MAC arithmetic operation.

The PIM device 400 may perform the deterministic MAC arithmetic operation. Thus, the host or the controller may always predict a point in time (or a clock) when the MAC arithmetic operation terminates in the PIM device 400 from a point in time when an external command requesting the MAC arithmetic operation is transmitted from the host or the controller to the PIM device 400. Because the timing is predictable, no operation for informing the host or the controller of a status of the MAC arithmetic operation is required while the PIM device 400 performs the deterministic MAC arithmetic operation. In an embodiment, a latency during which the MAC arithmetic operation is performed in the PIM device 400 may be set to a fixed value for the deterministic MAC arithmetic operation.

Figure 28:
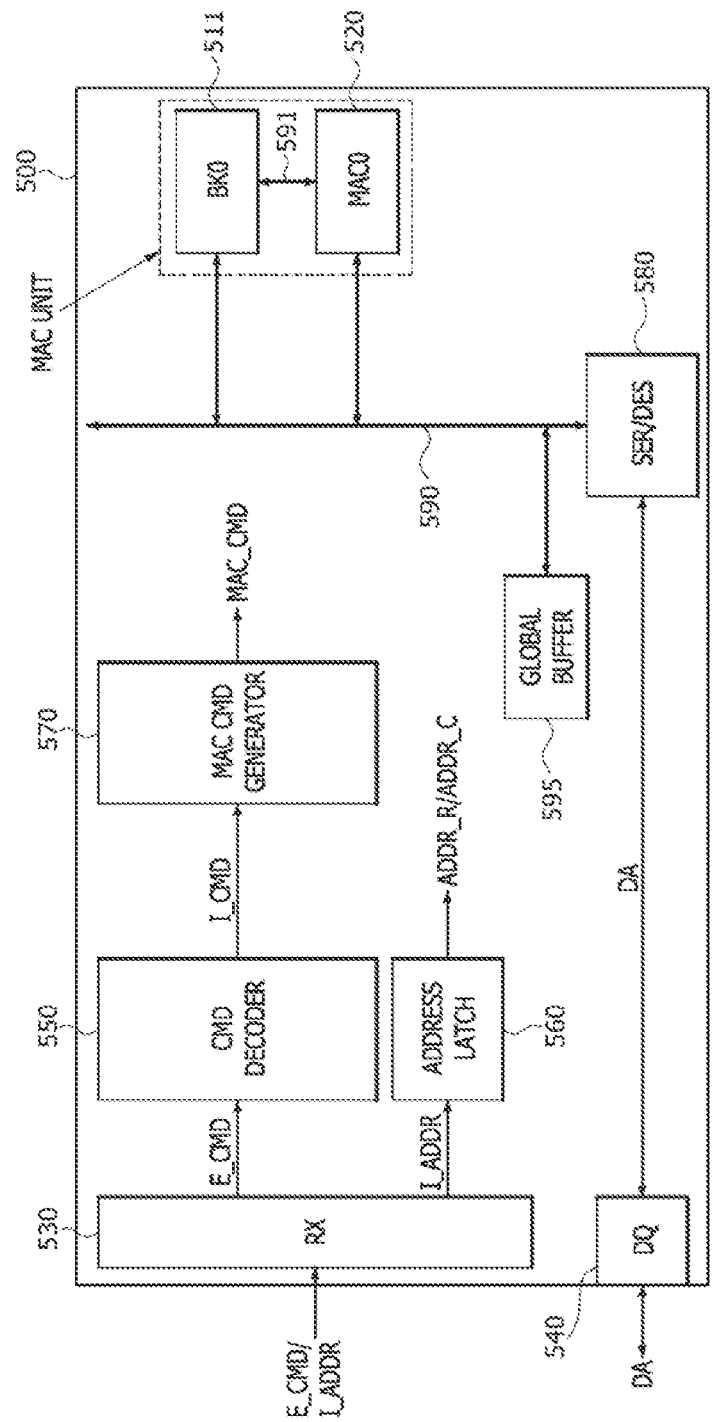
FIG. 28 is a block diagram illustrating a configuration of a PIM device according to the second embodiment of the present disclosure.

FIG. 28 is a block diagram illustrating an example of a detailed configuration of a PIM device 500 corresponding to the PIM device 400 illustrated in FIG. 27. FIG. 28 illustrates only a first memory bank (BK0) 511 and a first MAC operator (MAC0) 520 constituting a first MAC unit among a plurality of MAC units. However, FIG. 28 illustrates merely an example for simplification of the drawing. Accordingly, the following description for the first MAC unit may be equally applicable to the remaining MAC units. Referring to FIG. 28, the PIM device 500 may be configured to include the first memory bank (BK0) 511 and the first MAC operator (MAC0) 520 constituting the first MAC unit as well as a global buffer 595. The PIM device 500 may further include a GIO line 590 and a BIO line 591 used as data transmission lines. The first memory bank (BK0) 511 and the first MAC operator (MAC0) 520 may communicate with the global buffer 595 through the GIO line 590. Only the data transmission between the first memory bank (BK0) 511 and the first MAC operator (MAC0) 520 may be achieved through the BIO line 591. The BIO line 591 is dedicated specifically for data transmission between the first memory bank (BK0) 511 and the first MAC operator (MAC0) 520. Thus, the first MAC operator (MAC0) 520 may receive the first data DA1 to be used for the MAC arithmetic operation from the first memory bank (BK0) 511 through the BIO line 591 and may receive the second data DA2 to be used for the MAC arithmetic operation from the global buffer 595 through the GIO line 590.

The PIM device 500 may include a receiving driver (RX) 530, a data I/O circuit (DQ) 540, a command decoder 550, an address latch 560, a MAC command generator 570, and a serializer/deserializer (SER/DES) 580. The command decoder 550, the address latch 560, the MAC command generator 570, and the serializer/deserializer 580 may be disposed in the peripheral circuit PERI of the PIM device 400 illustrated in FIG. 27. The receiving driver 530 may receive an external command E_CMD and an input address I_ADDR from an external device. The external device may denote a host or a controller coupled to the PIM device 500. Hereinafter, it may be assumed that the external command E_CMD transmitted to the PIM device 500 is a command requesting the MAC arithmetic operation. That is, the PIM device 500 may perform the deterministic MAC arithmetic operation in response to the external command E_CMD. The data I/O circuit 540 may provide a means through which the PIM device 500 communicates with the external device.

The receiving driver 530 may separately output the external command E_CMD and the input address I_ADDR received from the external device. Data DA inputted to the PIM device 500 through the data I/O circuit 540 may be processed by the serializer/deserializer 580 and may be transmitted to the first memory bank (BK0) 511 and the global buffer 595 through the GIO line 590 of the PIM device 500. The data DA outputted from the first memory bank (BK0) 511 and the first MAC operator (MAC0) 520 through the GIO line 590 may be processed by the serializer/deserializer 580 and may be outputted to the external device through the data I/O circuit 540. The serializer/deserializer 580 may convert the data DA into parallel data if the data DA are serial data or may convert the data DA into serial data if the data DA are parallel data. For the data conversion, the serializer/deserializer 580 may include a serializer converting parallel data into serial data and a deserializer converting serial data into parallel data.

The command decoder 550 may decode the external command E_CMD outputted from the receiving driver 530 to generate and output the internal command signal I_CMD. The internal command signal I_CMD outputted from the command decoder 550 may be the same as the internal command signal I_CMD described with reference to FIG. 17. That is, the internal command signal I_CMD may include a first internal command signal corresponding to the memory active signal ACT_M, a second internal command signal corresponding to the MAC arithmetic signal MAC, and a third internal command signal corresponding to the result read signal READ_RST. The first to third internal command signals outputted from the command decoder 550 may be sequentially inputted to the MAC command generator 570. As described with reference to FIG. 17, the memory active signal ACT_M, the MAC arithmetic signal MAC, and the result read signal READ_RST outputted from the command decoder 550 may be sequentially generated at predetermined points in time (or docks) in order to perform the deterministic MAC arithmetic operation of the PIM device 500. Thus, the host or the controller outputting the external command E_CMD may predict the points in time when the first to third internal command signals constituting the internal command signal I_CMD are generated by the command decoder 550 in advance at a point in time when the external command E_CMD is outputted from the host or the controller. That is, the host or the controller may predict a point in time (or a dock) when the MAC arithmetic operation terminates in the PIM device 500 after the external command E_CMD requesting the MAC arithmetic operation is transmitted from the host or the controller to the PIM device 500, even without receiving any signals from the PIM device 500.

The address latch 560 may convert the input address I_ADDR outputted from the receiving driver 530 into a row/column address ADDR_R/ADDR_C to output the row/column address ADDR_R/ADDR_C. The row/column address ADDR_R/ADDR_C outputted from the address latch 560 may be transmitted to the first memory bank (BK0) 511. According to the present embodiment, the first data and the second data to be used for the MAC arithmetic operation may be simultaneously read out of the first memory bank (BK0) 511 and the global buffer 595, respectively. Thus, it may be unnecessary to generate a bank selection signal for selecting the first memory bank 511. A point in time when the row/column address ADDR_R/ADDR_C is inputted to the first memory bank 511 may be a point in time when a MAC command (i.e., the MAC arithmetic signal MAC) requesting a data read operation for the first memory bank 511 for the MAC arithmetic operation is generated.

The MAC command generator 570 may output the MAC command signal MAC_CMD in response to the internal command signal I_CMD outputted from the command decoder 550. The MAC command signal MAC_CMD outputted from the MAC command generator 570 may be the same as the MAC command signal MAC_CMD described with reference to FIG. 17. That is, the MAC command signal MAC_CMD outputted from the MAC command generator 570 may include the MAC active signal RACTV corresponding to the first MAC command signal, the MAC read signal MAC_RD_BK corresponding to the second MAC command signal, the MAC input latch signal MAC_L1 corresponding to the third MAC command signal, the MAC output latch signal MAC_L3 corresponding to the fourth MAC command signal, and the MAC result latch signal MAC_L_RST corresponding to the fifth MAC command signal.

The MAC active signal RACTV may be generated based on the memory active signal ACT_M outputted from the command decoder 550. The MAC read signal MAC_RD_BK, the MAC input latch signal MAC_L1, the MAC output latch signal MAC_L3, and the MAC result latch signal MAC_L_RST may be sequentially generated based on the MAC arithmetic signal MAC outputted from the command decoder 550. That is, the MAC input latch signal MAC_L1 may be generated at a point in time when a certain time elapses from a point in time when the MAC read signal MAC_RD_BK is generated. The MAC output latch signal MAC_L3 may be generated at a point in time when a certain time elapses from a point in time when the MAC input latch signal MAC_L1 is generated. Finally, the MAC result latch signal MAC_L_RST may be generated based on the result read signal READ_RST outputted from the command decoder 550.

The MAC active signal RACTV outputted from the MAC command generator 570 may control an activation operation for the first memory bank 511. The MAC read signal MAC_RD_BK outputted from the MAC command generator 570 may control a data read operation for the first memory bank 511 and the global buffer 595. The MAC input latch signal MAC_L1 outputted from the MAC command generator 570 may control an input data latch operation of the first MAC operator (MAC0) 520. The MAC output latch signal MAC_L3 outputted from the MAC command generator 570 may control an output data latch operation of the first MAC operator (MAC0) 520. The MAC result latch signal MAC_L_RST outputted from the MAC command generator 570 may control an output operation of MAC result data of the first MAC operator (MAC0) 520 and a reset operation of the first MAC operator (MAC0) 520.

As described above, in order to perform the deterministic MAC arithmetic operation of the PIM device 500, the memory active signal ACT_M, the MAC arithmetic signal MAC, and the result read signal READ_RST outputted from the command decoder 550 may be sequentially generated at predetermined points in time (or clocks), respectively. Thus, the MAC active signal RACTV, the MAC read signal MAC_RD_BK, the MAC input latch signal MAC_L1, the MAC output latch signal MAC_L3, and the MAC result latch signal MAC_L_RST may also be generated and outputted from the MAC command generator 570 at predetermined points in time after the external command E_CMD is inputted to the PIM device 500, respectively. That is, a time period from a point in time when the first and second memory banks 511 is activated by the MAC active signal RACTV until a point in time when the first MAC operator (MAC0) 520 is reset by the MAC result latch signal MAC_L_RST may be predetermined.

The MAC command generator 570 of the PIM device 500 according to the present embodiment may have the same configuration as described with reference to FIG. 18. In addition, the input signals and the output signals of the MAC command generator 570 may be inputted to and outputted from the MAC command generator 570 at the same points in time as described with reference to FIG. 19. As described with reference to FIGS. 18 and 19, the MAC command generator 570 may sequentially receive the memory active signal ACT_M, the MAC arithmetic signal MAC, and the result read signal READ_RST from the command decoder 550. In addition, the MAC command generator 570 may sequentially generate and output the MAC active signal RACTV, the MAC read signal MAC_RD_BK, the MAC input latch signal MAC_L1, the MAC output latch signal MAC_L3, and the MAC result latch signal MAC_L_RST, The MAC active signal RACTV, the MAC read signal MAC_RD_BK, the MAC input latch signal MAC_L1, the MAC output latch signal MAC_L3, and the MAC result latch signal MAC_L_RST may be outputted from the MAC command generator 570 in series with certain time intervals.

The MAC command generator 570 may generate and output the MAC active signal RACTV in response to the memory active signal ACT_M outputted from the command decoder 550. Subsequently, the MAC command generator 570 may generate and output the MAC read signal MAC_RD_BK in response to the MAC arithmetic signal MAC outputted from the command decoder 550. The MAC command generator 570 may delay the MAC arithmetic signal MAC by a certain time determined by the first delay circuit (372 of FIG. 18) to generate and output the MAC input latch signal MAC_L1. The MAC command generator 570 may delay the MAC input latch signal MAC_L1 by a certain time determined by the second delay circuit (373 of FIG. 18) to generate and output the MAC output latch signal MAC_L3. Subsequently, the MAC command generator 570 may generate and output the MAC result latch signal MAC_L_RST in response to the result read signal READ_RST outputted from the command decoder 550.

Figure 29:
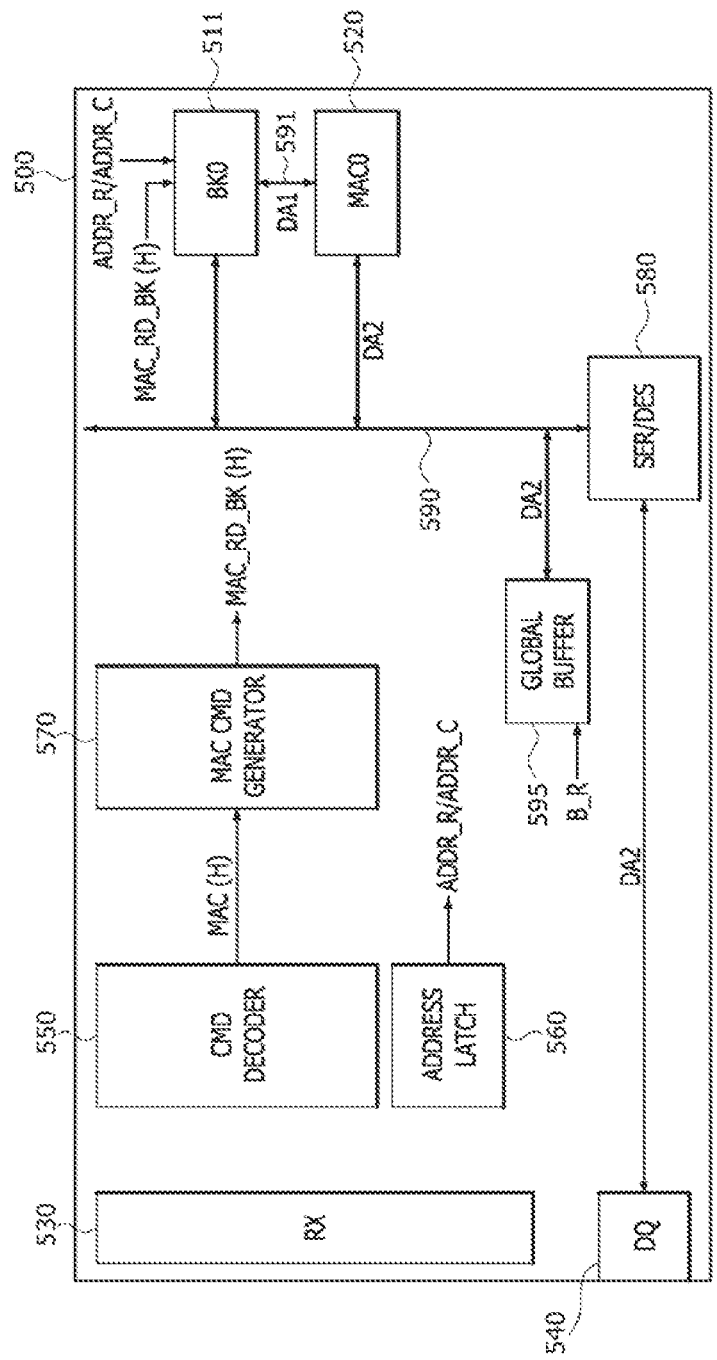
FIG. 29 is a block diagram illustrating an operation of the PIM device illustrated in FIG. 28.

FIG. 29 is a block diagram illustrating an operation of the PIM device 500 illustrated in FIG. 28. In FIG. 29, the same reference numerals or the same reference symbols as used in FIG. 16 denote the same elements. The operation of the PIM device 500 according to the present embodiment may be similar to the operation of the PIM device 300 described with reference to FIG. 16 except a transmission process of the first and second data DA1 and DA2 inputted to the first MAC operator (MAC0) 520. Thus, the operation of the PIM device 500 executed before the first and second data DA1 and DA2 are transmitted to the first MAC operator (MAC0) 520 may be the same as the operation of the PIM device 300 described with reference to FIG. 21. As illustrated in FIG. 29, when the MAC arithmetic signal MAC having a logic "high(H)" level is transmitted from the command decoder 550 to the MAC command generator 570, the MAC command generator 570 may generate and output the MAC read signal MAC_RD_BK having a logic "high(H)" level. The MAC read signal MAC_RD_BK having a logic "high(H)" level, together with the row/column address ADDR_R/ADDR_C, may be transmitted to the first memory bank (BK0) 511. In such a case, a global buffer read signal B_R may also be transmitted to the global buffer 595. The first data DA1 may be read out of the first memory bank (BK0) 511 by the MAC read signal MAC_RD_BK having a logic "high(H)" level and may be transmitted to the first MAC operator (MAC0) 520 through the BIO line 591. In addition, the second data DA2 may be read out of the global buffer 595 by the global buffer read signal B_R and may be transmitted to the first MAC operator (MAC0) 520 through the GIO line 590. The operation of the PIM device 500 executed after the first and second data DA1 and DA2 are transmitted to the first MAC operator (MAC0) 520 may be the same as the operation of the PIM device 300 described with reference to FIGS. 23 to 25.

Figure 30:
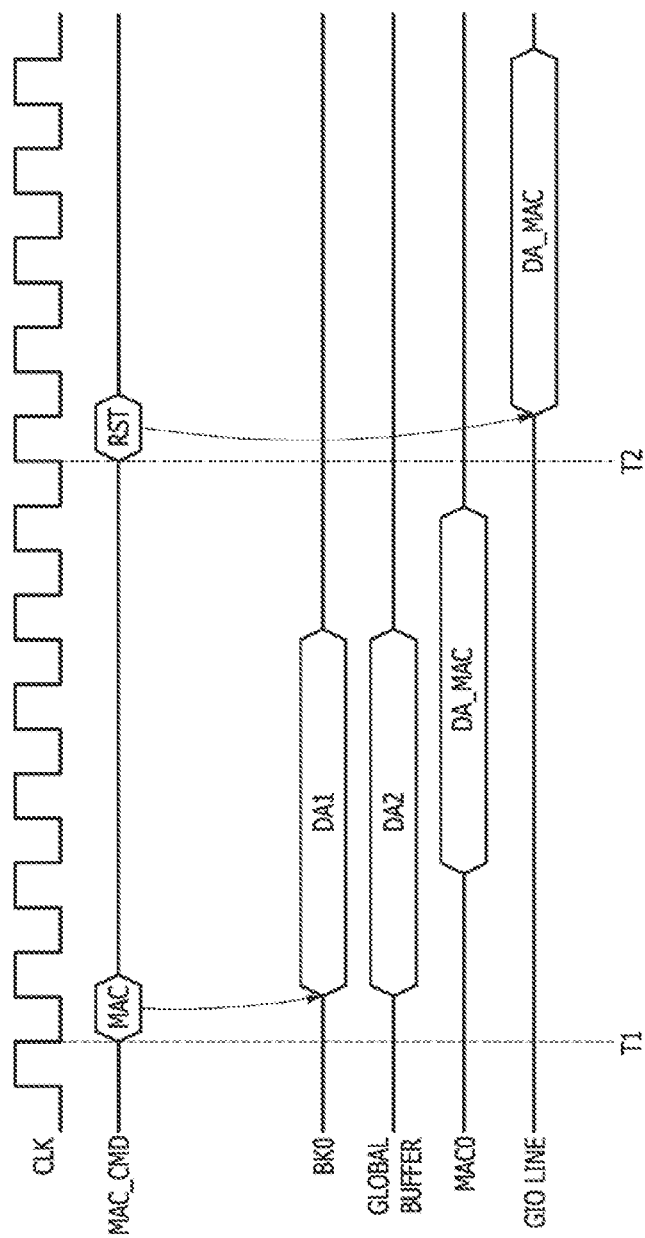
FIG. 30 is a timing diagram illustrating an operation of the PIM device illustrated in FIG. 28.

FIG. 30 is a timing diagram illustrating an operation of the PIM device 500 illustrated in FIG. 28. Referring to FIG. 30, at a first point in time "T1", the MAC command generator 570 may be synchronized with a falling edge of a dock signal CLK to generate and output the MAC read signal MAC_RD_BK (R) having a logic "high(H)" level. The first memory bank (BK0) 511 may be selected by the MAC read signal MAC_RD_BK (R) having a logic "high(H)" level so that the first data DA1 are read out of the first memory bank (BK0) 511. In addition, the second data DA2 may be read out of the global buffer 595. If a certain time elapses from a point in time when the first and second data DA1 and DA2 are read out of the first memory bank (BK0) 511 and the global buffer 595, the first MAC operator (MAC0) 520 may perform the MAC arithmetic operation of the first and second data DA1 and DA2 to generate the MAC result data DA_MAC. At a second point in time "T2", the MAC command generator 570 may be synchronized with a falling edge of the clock signal CLK to generate and output the MAC result latch signal MAC_L_RST (RST). The MAC result data DA_MAC may be transmitted to an external device through the GIO line 590 or to the first memory bank (BK0) 511 through the BIO line 591, by the MAC result latch signal MAC_L_RST (RST).

Figure 31:
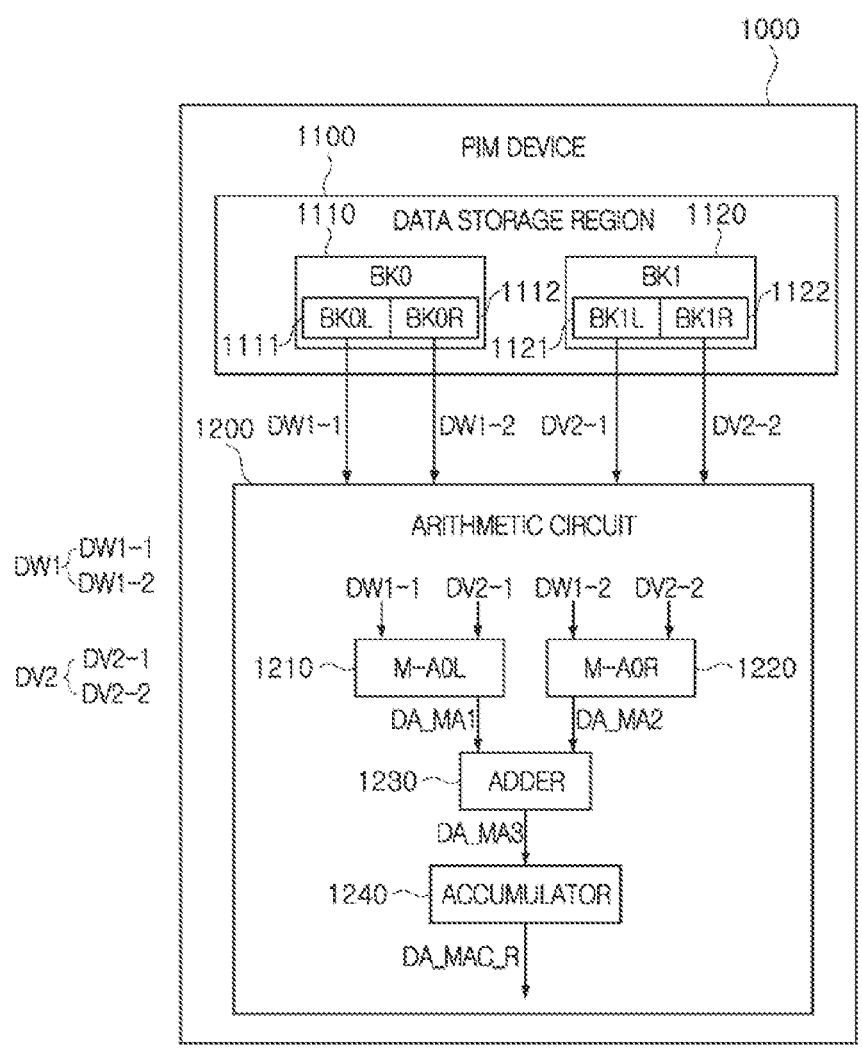
FIG. 31 is a block diagram illustrating a PIM device according to an embodiment of the present disclosure.

FIG. 31 is a block diagram illustrating a PIM device 1000 according to an embodiment of the present disclosure. Referring to FIG. 31, the PIM device 1000 may include a data storage region 1100 and an arithmetic circuit 1200. The data storage region 1100 may store first data DW1 and second data DV2. The first data DW1 and the second data DV2 may be separately stored in the data storage region 1100. The first data DW1 may include a first portion DW1-1 and a second portion DW1-2. The second data DV2 may include a first portion DV2-1 and a second portion DV2-2. The arithmetic circuit 1200 may perform a multiplying-and-accumulating (MAC) operation on the first data DW1 and the second data DV2 transmitted from the data storage region 1100 to output MAC result data. The description of the NM (10 of FIG. 1) described with reference to FIG. 1 may be equally applied to the PIM device 1000 illustrated in FIG. 31. For example, the PIM device 1000 may operate in a memory mode and a MAC operation mode, like the PIM device (10 of FIG. 1) illustrated in FIG. 1.

The data storage region 1100 may include a first memory bank (BK0) 1110 and a second memory bank (BK1) 1120. The first memory bank (BK0) 1110 may include a first left bank (BK0L) 1111 that stores the first portion DW1-1 of the first data DW1 and a first right bank (BK0R) 1112 that stores the second portion DW1-2 of the first data DW1. The second memory bank (BL1) 1120 may include a second left bank (BK1L) 1121 that stores the first portion DV2-1 of the second data DV2 and a second right bank (BK1R) 1122 that stores the second portion DV2-2 of the second data DV2.

The arithmetic circuit 1200 may receive the first portion DW1-1 of the first data DW1 from the first left bank (BK0L) 1111, and may receive the second portion DW1-2 of the first data DW1 from the first right bank (BK0R) 1112. In addition, the arithmetic circuit 1200 may receive the first portion DV2-1 of the second data DV2 from the second left bank (BK1L) 1121, and may receive the second portion DV2-2 of the second data DV2 from the second right bank (BK1R) 1122.

The arithmetic circuit 1200 may include a first multiplication-addition circuit (M-A0L) 1210, a second multiplication-addition circuit (M-A0R) 1220, an adder 1230, and an accumulator 1240. The first multiplication-addition circuit (MA0L) 1210 may output first multiplication-addition data DA_MA1 generated by performing first multiplication-addition calculation on the first portion DW1-1 of the first data DW1 and the first portion DV2-1 of the second data DV2. The second multiplication-addition circuit (MA0R) 1220 may output second multiplication-addition data DA_MA2 generated by performing second multiplication-addition calculation on the second portion DW1-2 of the first data DW1 and the second portion DV2-2 of the second data DV2. In an embodiment, the above-described first multiplication-addition calculation and second multiplication-addition calculation may be simultaneously performed. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

The adder 1230 may receive the first multiplication-addition data DA_MA1 from the first multiplication-addition circuit (NI-A0L) 1210 and the second multiplication-addition data DA_MA2 from the second multiplication-addition circuit (M-A0R) 1220. The adder 1230 may output third multiplication-addition data DA_MA3 generated by adding the first multiplication-addition data DA_MA1 and the second multiplication-addition data DA_MA2. The accumulator 1240 may receive the third multiplication-addition data DA_MA3 from the adder 1230. The accumulator 1240 may output MAC result data DA_MAC_R generated by accumulating the third multiplication-addition data DA_MA3 transmitted from the adder 1230.

Figure 32:
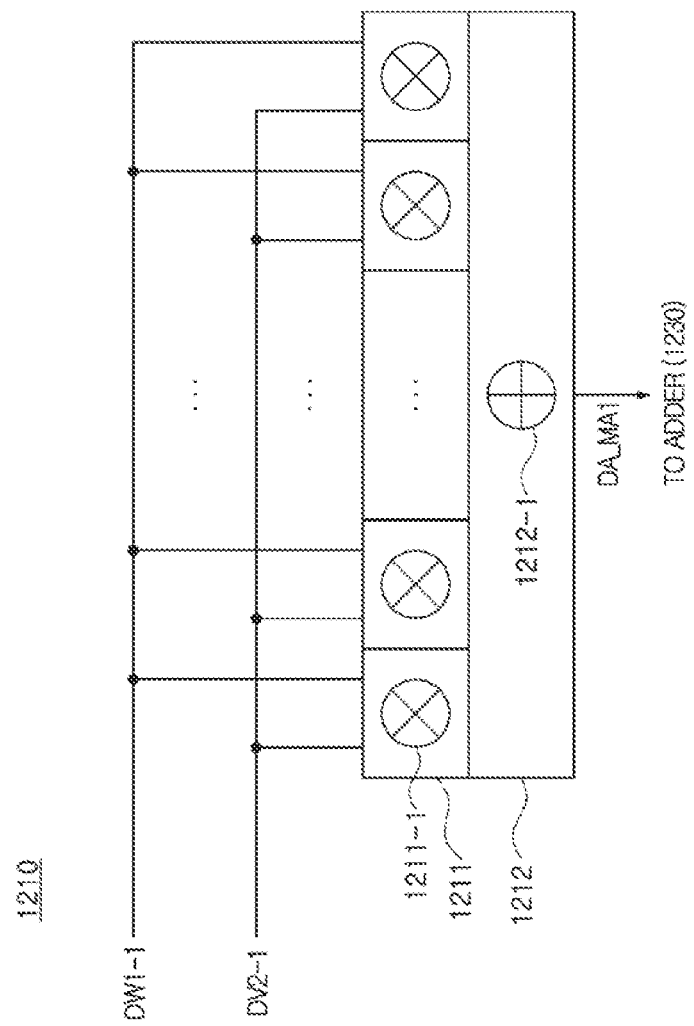
FIGS. 32, 33, and 34 illustrate an example of a detailed configuration of sub-elements of an arithmetic circuit illustrated in FIG. 31.
Figure 33:
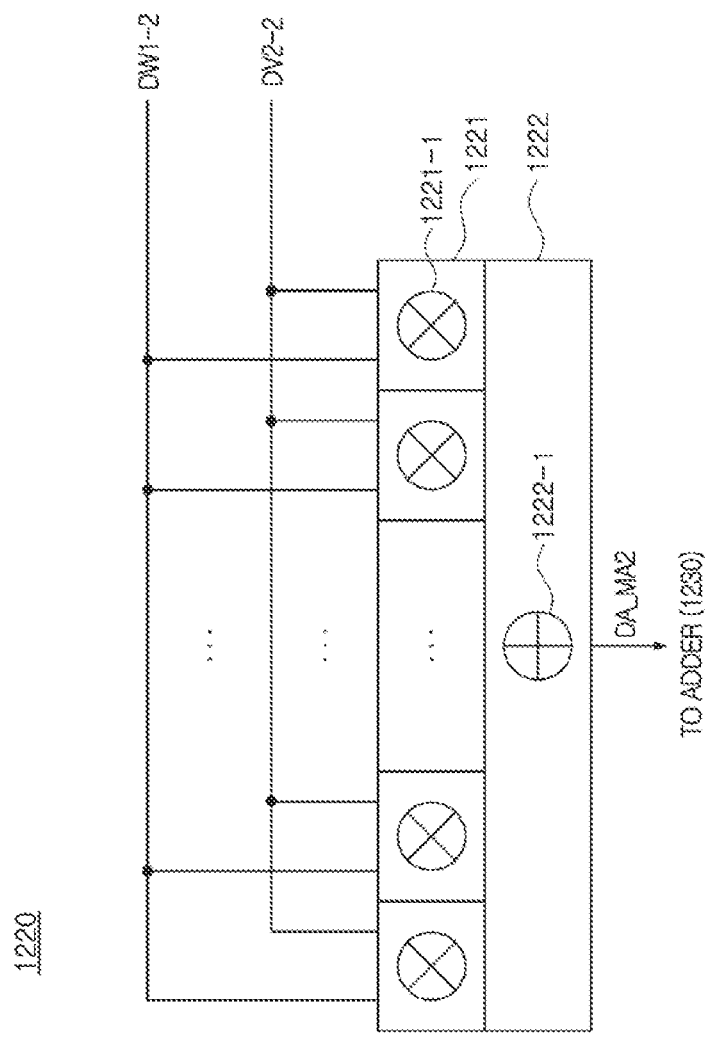
Figure 34:
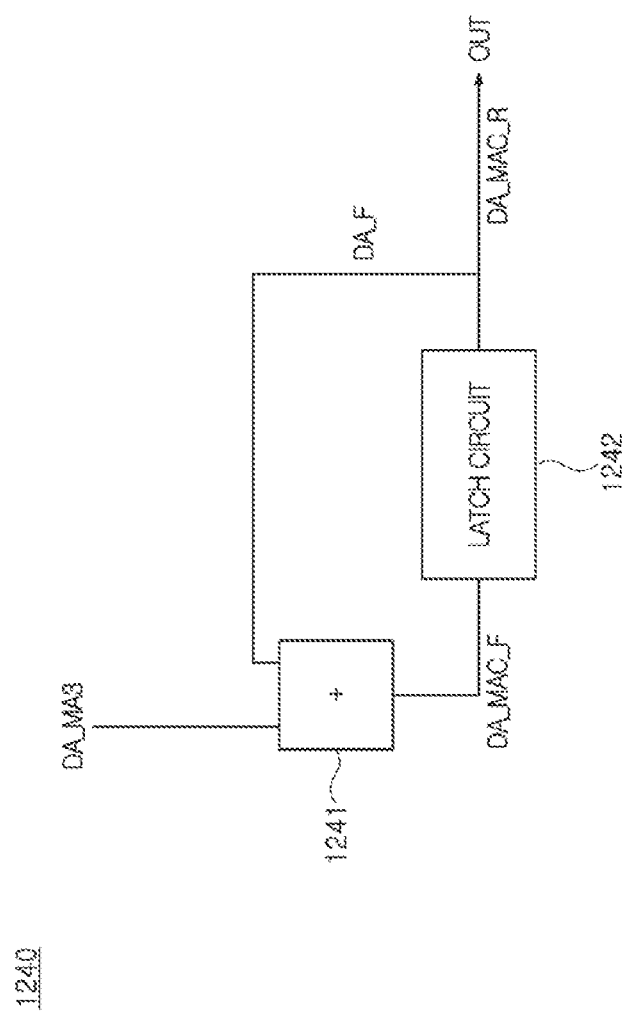

FIGS. 32 to 34 illustrate an example of detailed configurations of sub-elements of the arithmetic circuit 1200 illustrated in FIG. 31. For example FIG. 32 illustrates an example of a detailed configuration of the first multiplication-addition circuit (M-A0L) 1210. FIG. 33 illustrates an example of a detailed configuration of the second multiplication-addition circuit (M-A0R) 1220. FIG. 34 illustrates an example of a detailed configuration of the accumulator 1240.

Referring to FIG. 32, the first multiplication-addition circuit M-AOL 1210 may include a first multiplication logic circuit 1211 and a first addition logic circuit 1212. The first multiplication logic circuit 1211 may include a plurality of first multipliers 1211-1. Each of the first multipliers 1211-1 may perform multiplication calculation on the inputted first portion DW1-1 of the first data DW1 and the first portion DV2-1 of the second data DV2, and output multiplication result data. The first addition logic circuit 1212 may include a plurality of first adders 1212-1. The first adders 1212-1 may perform addition calculation on the data output from the first multipliers 1211-1. Although not illustrated in FIG. 32, the plurality of first adders 1212-1 may be disposed in a tree structure having a plurality of stages. Each of the first adders 1212-1 of a first stage may receive multiplication result data from the two first multipliers 1211-1 among the first multipliers 1211-1 of the first multiplication logic circuit 1211, perform addition calculation, and output addition result data. Each of the first adders 1212-1 of a second stage may receive addition result data from the two first adders 1212-1 among the first adders 1212-1 of the first stage, perform addition calculation, and output addition result data. The first adders 1212-1 of a last stage may receive addition result data from the two first adders 1212-1 of the previous stage, perform addition calculation, and output addition result data.

Referring to FIG. 33, the second multiplication-addition circuit M-A0R 1220 may include a second multiplication logic circuit 1221 and a second addition logic circuit 1222. The second multiplication logic circuit 1221 may include a plurality of second multipliers 1221-1. Each of the second multipliers 1221-1 may perform multiplication calculation on the inputted second portion DW1-2 of the first data DW1 and the second portion DV2-2 of the second data DV2, and output multiplication result data. The second addition logic circuit 1222 may include a plurality of second adders 1222-1. The second adders 1222-1 may perform addition calculation on the data output from the second multipliers 1221-1. Although not illustrated in FIG. 33, the plurality of second adders 1222-1 may be disposed in a tree structure having a plurality of stages. Each of the second adders 1222-1 of a first stage may receive multiplication result data from the two second multipliers 1221-1 among the second multipliers 1221-1 of the second multiplication logic circuit 1221, perform addition calculation, and output addition result data. Each of the second adders 1222-1 of a second stage may receive addition result data from the two second adders 1222-1 among the second adders 1222-1 of the first stage, perform addition calculation, and output addition result data. The second adders 1222-1 of a last stage may receive addition result data from the two second adders 1222-1 of the previous stage, perform addition calculation, and output addition result data.

Referring to FIG. 34, the accumulator 1240 may include an accumulating adder 1241 and a latch circuit 1242. The accumulating adder 1241 may add feedback data DA_F to the third multiplication-addition data DA_MA3 transmitted from the adder 1230 of FIG. 31 to output MAC result data DA_MAC_F in which the feedback data DA_F has been added. The latch circuit 1242 may receive and latch the MAC result data DA_MAC_F transmitted from the accumulating adder 1241, in which the feedback data DA_F has been added. Thereafter, the latch circuit 1242 may transmit the MAC result data DA_MAC_F, in which the feedback data DA_F has been added, to the accumulating adder 1241 as the feedback data DA_F. When all calculations on the first data DW1 and the second data DV2 are finished, the final MAC result data DA_MAC_R of the first data DW1 and the second data DV2 may be output from the latch circuit 1242 to the outside OUT. In embodiment, an outside is located outside the PIM device 1000 or the arithmetic circuit 1200.

In an embodiment, the MAC calculation operation of the arithmetic circuit 1200 may be repeated a plurality of times. For example, when a data amount of the first data DW1 and the second data DV2 is greater than a data amount that the arithmetic circuit 1200 can calculate at one time, the MAC calculation operation may be repeatedly performed until calculations on all of the first data DW1 and the second data DV2 are finished. That is, the first multiplication-addition circuit (M_A0L) 1210 may sequentially output the first multiplication-addition data DA_MA1 multiple times. The second multiplication-addition circuit (M-A0R) 1220 may sequentially output the second multiplication-addition data DA_MA2 multiple times. The adder 1230 may sequentially output the third multiplication-addition data DA_MA3 multiple times. In the present embodiment, the accumulating adder 1241 may add the feedback data DA_F to the third multiplication-addition data DA_MA3 sequentially transmitted from the adder 1230 to output MAC result data DA_MAC_F, in which the feedback data DA_F has been added. The latch circuit 1242 may transmit the MAC result data DA_MAC_F, in which the feedback data DA_F has been added, to the accumulating adder 1241 again as feedback data DA_F. Through such processes, the third multiplication-addition data DA_MA3 output from the adder 1230 may be accumulated. The above-described processes are repeated until the calculations on all the first data DW1 and second data DV2 are finished.

Figure 35:
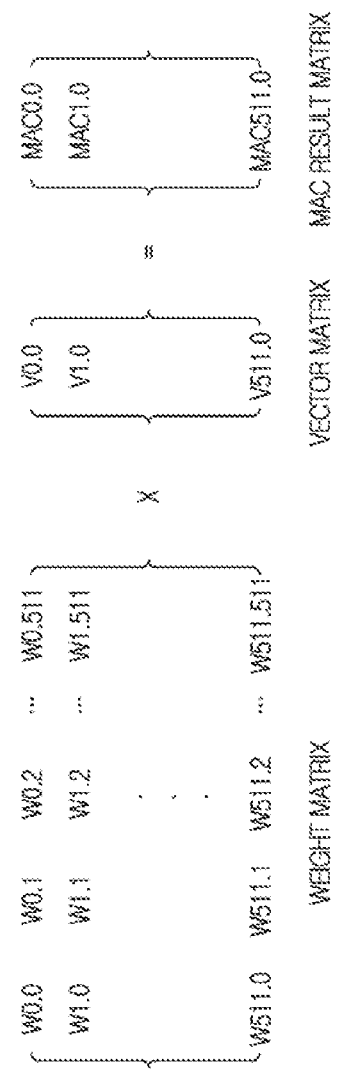
FIG. 35 illustrates an example of an MAC operation performed in a PIM device illustrated in FIG. 31.

FIG. 35 illustrates an example of an MAC calculation operation performed in the PIM device 1000 illustrated in FIG. 31. Referring to FIG. 35, the MAC calculation performed by the PIM device 1000 may be performed through a matrix calculation operation. The PIM device 1000 may perform matrix multiplication calculations on a weight matrix WEIGHT MATRIX of M+1 rows and N+1 columns ((M+1)×(N+1)) (M, N are natural numbers) and a vector matrix VECTOR MATRIX of N+1 rows and 1 column ((N+1)×1) under control of an external controller. A MAC result matrix of N+1 rows and 1 column ((N+1)×1) may be generated according to the matrix multiplication calculations on the weight matrix and the vector matrix. For example, the weight matrix may be configured as a 512×512 matrix, and the vector matrix may be configured as a 512×1 matrix. In this case, the weight matrix may be composed of 512×512 elements W0.0, ..., and W511.511. The vector matrix may be composed of 512 elements X0.0, and X511.0. The MAC result matrix may be composed of 512 elements MAC0.0, and MAC511.0. Each of the elements constituting the weight matrix and each of the elements constituting the vector matrix may be configured as a binary stream having a plurality of bit values.

The multiplication calculation of the weight matrix and the vector matrix may conform to a neural network structure of a multi-layer perceptron (MLP) method. In general, an MLP-type neural network for performing deep learning may include an input layer, a plurality of, for example, at least three or more hidden layers, and an output layer. The multiplication calculation of the weight matrix and the vector matrix illustrated in FIG. 32, that is, the MAC operation may correspond to calculation in one of the hidden layers. In the case of a first hidden layer, the MAC operation may be performed using the inputted second data DV2. However, the MAC operation in each of the hidden layers from a second hidden layer to a last hidden layer may be performed by using an operation result in the previous hidden layer as the second data DV2.

Figure 36:
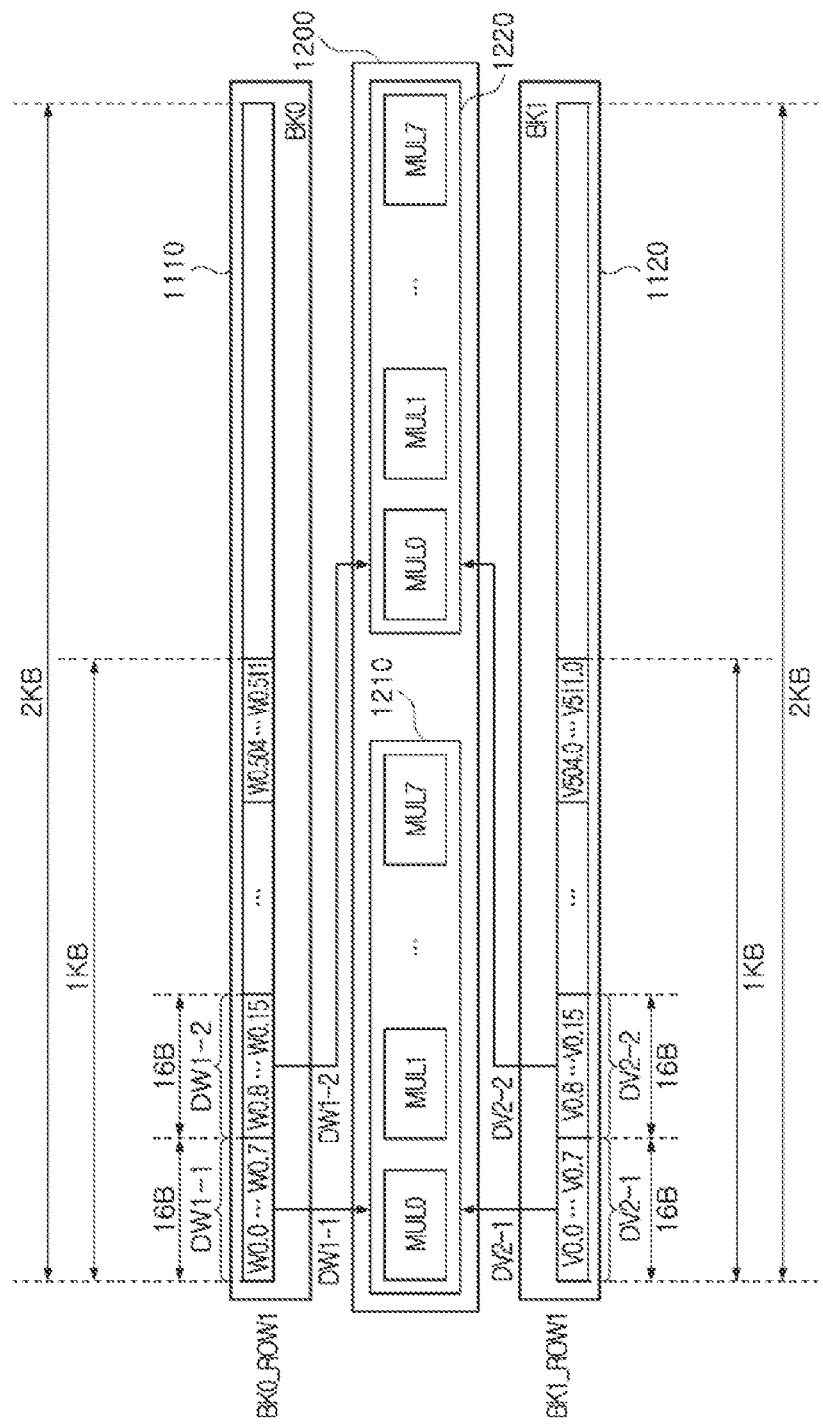
FIG. 36 illustrates a method of accessing data in the PIM device illustrated in FIG. 31.

FIG. 36 illustrates an example of a method of accessing data in the PIM device 1000 illustrated in FIG. 31. Referring to FIG. 31 and FIG. 36, in this example, the first data DW1 may be composed of elements W0.0, ..., W0.511 in the first row of the 512×512 weight matrix illustrated in FIG. 35. The second data DV2 may be composed of elements V0.0, ..., and V511.0 of the 512×1 vector matrix illustrated in FIG. 35. In this example, it is assumed that each of the elements W0.0, ..., and W0.511 of the first row of the weight matrix and each of the elements V0.0, ..., and V511.0 of the vector matrix have a size of 2 bytes. Accordingly, the first data DW1 and the second data DV2 may each have a size of 1 Kbytes 1 KB.

In this embodiment, it is exemplified that the first data DW1 is stored in a first row BK0_ROW1 of the first memory bank (BK0) 1110 having a storage capacity of 2 Kbytes 2 KB. In addition, in this embodiment, the first left bank (BK0L) 1111 and the first right bank (BK0R) 1112 each transmit data to the arithmetic circuit 1200 by 16 bytes 16B in order to perform a single MAC operation. In this case, the first left bank (BK0L) 1111 may transmit the first portion DW1-1 of the first data DW1 corresponding to the elements W0.0, ..., and W0.7 of the first to eighth columns of the first row of the weight matrix to the first multiplication-addition circuit 1210 of the arithmetic circuit 1200. The first right bank (BK0R) 1112 may transmit the second portion DW1-2 of the first data DW1 corresponding to the elements W0.8, ..., and W0.15 of the ninth to sixteenth columns of the first row of the weight matrix to the second multiplication-addition circuit 1220 of the arithmetic circuit 1200. This process may be repeatedly performed a plurality of times unto all of the MAC operations for the entire first data DW1 corresponding to the elements W0.0, ..., and W0.511 of the first row of the weight matrix are finished.

Similar to the first data DW1, it is exemplified that the second data DV2 is also stored in the first row BK1_ROW1 of the second memory bank (BK1) 1120 having a storage capacity of 2 Kbytes in this example. In addition, in this example, it is exemplified that the second left bank (BK1L) 1121 and the second right bank (BK1R) 1122 each transmit data by 16 bytes 16B to the arithmetic circuit 1200. In this case, the second left bank (BK1L) 1121 may transmit the first portion DV2-1 of the second data DV2 corresponding to the elements V0.0, ..., and V7.0 of the first to eighth columns of the vector matrix to the first multiplication-addition circuit 1210 of the arithmetic circuit 1200. The second right bank (BK1R) 1122 may transmit the second portion DV2-2 of the second data DV2 corresponding to the elements V8.0, ..., and V15.0 of the ninth to sixteenth columns of the vector matrix to the second multiplication-addition circuit 1220 of the arithmetic circuit 1200. This process may be repeatedly performed a plurality of times until all of the MAC operations for the entire second data DV2 corresponding to the elements W0.0, ..., and W511.0 of the vector matrix are finished.

The multipliers included in the first and second multiplication-addition circuits 1210 and 1220 may each perform multiplication-addition operation on the inputted data. Each of the multipliers included in the first and second multiplication-addition circuits 1210 and 1220 may receive the first data DW1 and the second data DV2 of 16 Bytes 16B. For example, when each of the first and second multiplication-addition circuits 1210 and 1220 includes eight multipliers MUL0, ..., and MUL7, each of the first and second multiplication-addition circuits 1210 and 1220 may perform multiplication-addition operations of 256 Bytes at one time.

Figure 37:
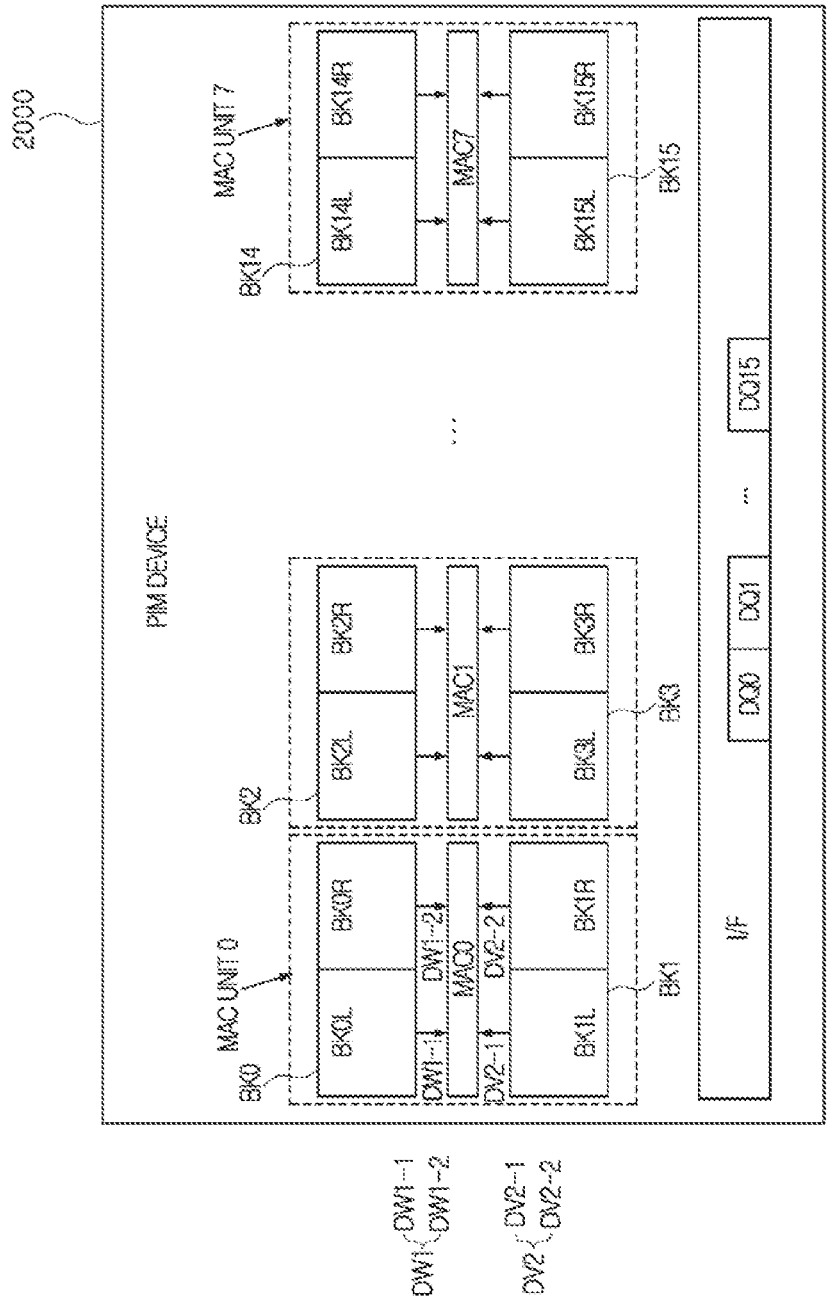
FIG. 37 illustrates a disposal structure of memory banks and operation circuits in a PIM device according to another embodiment of the present disclosure.

FIG. 37 illustrates a disposal structure of memory banks and arithmetic circuits in a NM device 2000 according to another embodiment of the present disclosure. Referring to FIG. 37, the PIM device 2000 may include a plurality of storage regions, a plurality of MC operators MAC0 and MAC7, and an interface I/F. The plurality of storage regions may include storage regions of a first group providing first data DW1 and storage regions of a second group providing second data DV2. Each of the plurality of MAC operators MAC0, and MAC7 may perform MAC operations on the first data DW1 and the second data DV2 provided from the storage regions.

The storage regions of the first group and second group may be composed of a plurality of memory banks BK0, ..., and BK15. For example, the storage regions of the first group may be composed of even-numbered memory banks BK0, BK2, ..., and BK14, and the storage regions of the second group may be composed of odd-numbered memory banks BK1, BK3, ..., and BK15. Although, in FIG. 37, the PIM device 2000 includes 16 memory banks BK0, ..., and BK15, this is only an example and the number of the memory banks may be variously set.

A first storage region, which is one of the storage regions of the first group, a second storage region, which is one of the storage regions of the second group, and one MAC operator receiving data from the first storage region and the second storage region may constitute one MAC unit. For example, a first memory bank BK0, which is one of the storage regions of the first group, a second memory bank BK1, which is one of the storage regions of the second group, and a first MAC operator MAC0 may constitute a first MAC unit MAC UNIT 0. Similarly, a fifteenth memory bank BK14, a sixteenth memory bank BK15, and an eighth MAC operator MAC7 may constitute an eighth MAC unit MAC UNIT 7. Explanation for the first MAC unit MAC UNIT 0 may be equally applied to other MAC units.

A configuration of the first MAC unit MAC UNIT 0 may be substantially the same as a configuration of the arithmetic circuit (1200 of FIG. 31) described with reference to FIGS.

31 to 34. For example, the first MAC unit MAC UNIT U may include components substantially the same as the first multiplication-addition circuit (1210 of FIG. 31), the second multiplication-addition circuit (1220 of FIG. 31), the adder (1230 of FIG. 31), and the accumulator (1240 of FIG. 31) described above with reference to FIGS. 31 to 34. Accordingly, the detailed description for the configuration of the first MAC unit MAC UNIT 0 will be omitted.

The interface I/F may include a plurality of data input and output (input/output) circuits DQ0, . . . , and DQ15 performing data transmission between the outside and the memory banks BK0, and BK15. Although FIG. 37 illustrates 16 data input/output circuits DQ0, . . . , and DQ15, this is only an example and the number of the data input/output circuits may be variously set. Each of the data input/output circuits DQ0, . . . , and DQ15 may include an input/output pad. Each of the data input/output circuits DQ0, . . . , and DQ15 may be connected to a data input/output line. The PIM device 2000 may communicate with external devices through the data input/output circuits DQ0, . . . , and DQ15. The data input/output circuits DQ0, . . . , and DQ15 may transmit data transmitted from the outside to the memory banks BK0, . . . , and BK15, or transmit data transmitted from the memory banks BK0, . . . , and BK15 to the outside. In an embodiment, an outside is considered anything outside the PIN device 2000.

Half of the data input/output circuits DQ0, . . . , and DQ15 may be allocated to the left banks BK0L, . . . , and BK15L of each of the memory banks BK0, . . . , and BK15, and the other half of the data input/output circuits DQ0, . . . , and DQ15 may be allocated to the right banks BK0R, . . . , and BK15R of each of the memory banks BK0, . . . , and BK15. That is, the left banks BK0L, . . . , and BK15L of each of the memory banks BK0, . . . , and BK15 may perform data transmission with the outside through half of the data input/output circuits DQ0, . . . , and DQ15. The right banks BK0R, BK15R of each of the memory banks BK0, . . . , and BK15 may perform data transmission with the outside through the other half of the data input/output circuits DQ0, . . . , and DQ15 except for the data input/output circuits allocated to the left banks BK0L, . . . , and BK15L. In an embodiment, each of the first left bank BK0L and the second left bank BK1L may perform data transmission with the outside through the first to eighth data input/output circuits DQ0, . . . , and DQ7. Each of the first right bank BK0R and the second right bank BK1R may perform data transmission with the outside through the ninth to sixteenth data input/output circuits DQ0, . . . , and DQ15. In an embodiment, each of the first left bank BK0L and the second left bank BK1L may perform data transmission with the outside through two of the first to eighth data input/output circuits DQ0, . . . , and DQ7. Each of the first right bank BK0R and the second right bank BK1R may perform data transmission with the outside through two of the ninth to sixteenth data input/output circuits DQ0, . . . , and DQ15.

Figure 38:
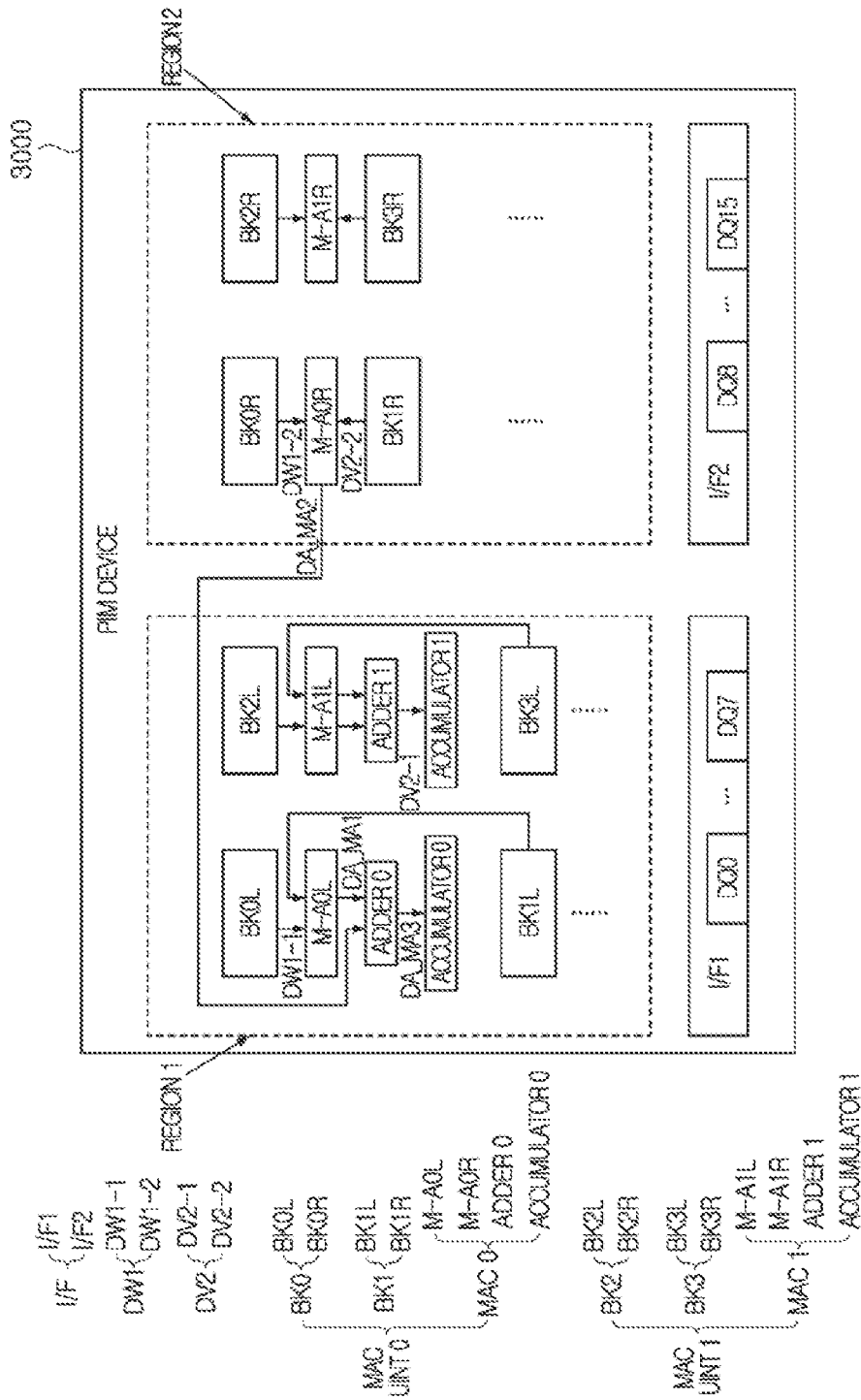
FIG. 38 illustrates an arrangement structure of memory banks and operation circuits in a PIM device according to yet another embodiment of the present disclosure.

FIG. 38 illustrates a disposal structure of memory banks and arithmetic circuits in a PIM device 3000 according to yet another embodiment of the present disclosure. Referring to FIG. 38, the PIM device 3000 may include a plurality of storage regions, a plurality of MAC operators MAC0 and MAC1, and an interface I/F. The storage regions may include a first group of storage regions that store and provide first data DW1, and a second group of storage regions that store and provide second data DV2. Each of the plurality of MAC operators MAC0 and MAC1 may perform MAC operations on the first data DW1 and the second data DV2 provided from the storage regions. The storage regions of the first group and second group may each be composed of a plurality of memory banks BK0, . . . , and BK3. The number of the memory banks may be variously set. In an embodiment, the storage regions of the first group may be composed of even-numbered memory banks BK0 and BK2, and the storage regions of the second group may be composed of odd-numbered memory banks BK1 and BK3.

A first storage region, which is one of the storage regions of the first group, a second storage region, which is one of the storage regions of the second group, and one MAC operator receiving data from the first storage region and the second storage region may constitute one MAC unit. For example, a first memory bank BK0 that is one of the storage regions of the first group, a second memory bank BK1 that is one of the storage regions of the second group, and a first MAC operator MAC0 may constitute a first MAC unit MAC UNIT 0. Similarly, a third memory bank BK2, a fourth memory bank BK3, and a second MAC operator MAC1 may constitute a second MAC unit MAC UNIT 1. The explanation for the first MAC unit MAC UNIT 0 may be equally applied to other MAC units. A detailed configuration of the first MAC unit MAC UNIT 0 will be described below with reference to FIG. 39.

The interfaces I/F may include a first interface I/F1 allocated to a first region REGION 1 and a second interface I//F2 allocated to a second region REGION 2. The first interface I/F1 may include a plurality of data input/output circuits DQ0, . . . , and DQ7 performing data transmission between the outside and the left banks BK0L, . . . , and BK3L of each of the memory banks BK0, . . . , and BK3. The second interface I/F2 may include a plurality of data input/output circuits DQ8, . . . , and DQ15 performing data transmission between the outside and the right banks BK0R, . . . , and BK3R of each of the memory banks BK0, . . . , and BK3. Previously, the descriptions of the data input/output circuits (DQ0, . . . , and DQ15 of FIG. 37) described with reference to FIG. 37 may be equally applied to the data input/output circuits DQ0, . . . , and DQ15 illustrated in FIG. 38.

In the PIM device 3000, a region may be divided into two portions in consideration of placement intervals, sizes, and data transmission efficiency of the memory banks BK0, . . . , and BK3 and the data input/output circuits DQ1, . . . , and DQ15. That is, the left banks BK0L, . . . , and BK3L of the memory banks BK0, . . . , and BK3 may be disposed in the first region REGION 1, and the right banks BK0R, and BK3R of the memory banks BK0, . . . , BK3 may be disposed in the second region REGION 2. The data input/output circuits DQ0, . . . , and DQ7 allocated to the left banks BK0L, . . . , and BK3L may be disposed adjacent to the first region REGION 1, and the data input/output circuits DQ8, . . . , and DQ215 allocated to the right banks BK0R, . . . , and BK3R may be disposed adjacent to the second region REGION 2.

Figure 39:
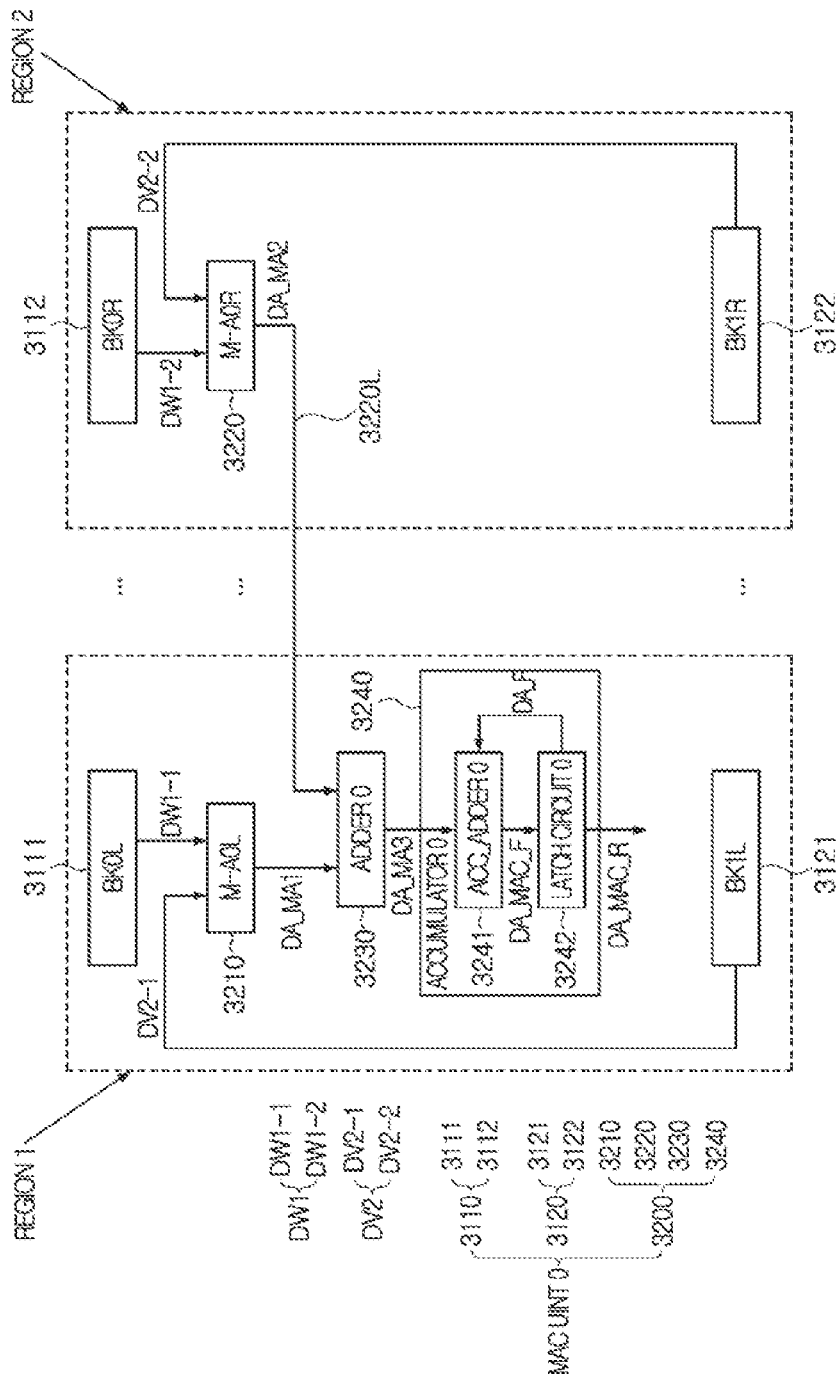
FIG. 39 illustrates an example of a configuration of a MAC unit included in the NM device shown in FIG. 38.

FIG. 39 illustrates an example of a configuration of the first MAC unit MAC UNIT 0 included in the PIM device 3000 of FIG. 38. Referring to FIG. 39, the first MAC unit MAC UNIT 0 may include a first memory bank 3110, a second memory bank 3120, and a first MAC operator 3200. The first memory bank 3110 may include a first left bank (BK0L) 3111 that stores a first portion DW1-1 of first data DW1 composed of the first portion DW1-1 and a second portion DW1-2, and a first right bank (BK0R) 3112 that stores a second portion DW1-2 of the first data DW1. The first left bank (BK0L) 3111 may be positioned in the first region REGION 1, and the first right bank (BK0R) 3112 may be positioned in the second region REGION 2. The second memory bank 3120 may include a second left bank (BK1L) 3121 that stores a first portion DV2-1 of second data DV2 composed of the first portion DV2-1 and a second portion DV2-2 of the second data DV2. The second left bank (BK1L) 3121 may be positioned in the first region REGION 1 and the second right bank (BK1R) 3122 may be positioned in the second region REGION 2.

The first MAC operator 3200 may include a first multiplication-addition circuit (M-A0L) 3210, a second multiplication-addition circuit (M-A0R) 3220, an adder 3230, and an accumulator 3240. The first multiplication-addition circuit (M-A0L) 3210 may receive the first portion DW1-1 of the first data DW1 from the first left bank (BK0L) 3111, and may receive the first portion DV2-1 of the second data DV2 from the second left bank (BK1L) 3121. The first multiplication-addition circuit (M-AOL) 3210 may output first multiplication-addition data DA_MA1 generated by performing a first multiplication-addition operation on the first portion DW1-1 of the first data DW1 and the first portion DV2-1 of the second data DV2. The first multiplication-addition circuit (M-A0L) 3210 may be positioned in the first region REGION 1.

The second multiplication-addition circuit (M-A0R) 3220 may receive the second portion DW1-2 of the first data DW1 from the first right bank (BK0R) 3112, and may receive the second portion DV2-2 of the second data DV2 from the second right bank (BK1R) 3122. The second multiplication-addition circuit (M-A0R) 3220 may output second multiplication-addition data DA_MA2 generated by performing a second multiplication-addition operation on the second portion DW1-2 of the first data DW1 and the second portion DV2-1 of the second data DV2. The second multiplication-addition circuit (M-A0R) 3220 may be positioned in the second region REGION 2.

The adder 3230 may receive the first multiplication-addition data DA_MA1 from the first multiplication-addition circuit (M-A0L) 3210 and the second multiplication-addition data DA_MA2 from the second multiplication-addition circuit (M-A0R) 3220. The adder 3230 may output third multiplication-addition data DA_MA3 generated by summing the first multiplication-addition data DA_MA1 and the second multiplication-addition data DA_MA2. The adder 3230 may be positioned in the first region REGION 1. The PIM device 3000 may further include a data transmission line 3220L configured to connect the adder 3230 positioned in the first region REGION 1 and the second multiplication-addition circuit (M-A0R) 3220 positioned in the second region REGION 2. The second multiplication-addition data DA_MA2 may be transmitted from the second multiplication-addition circuit (M-A0R) 3220 to the adder 3230.

Figure 40:
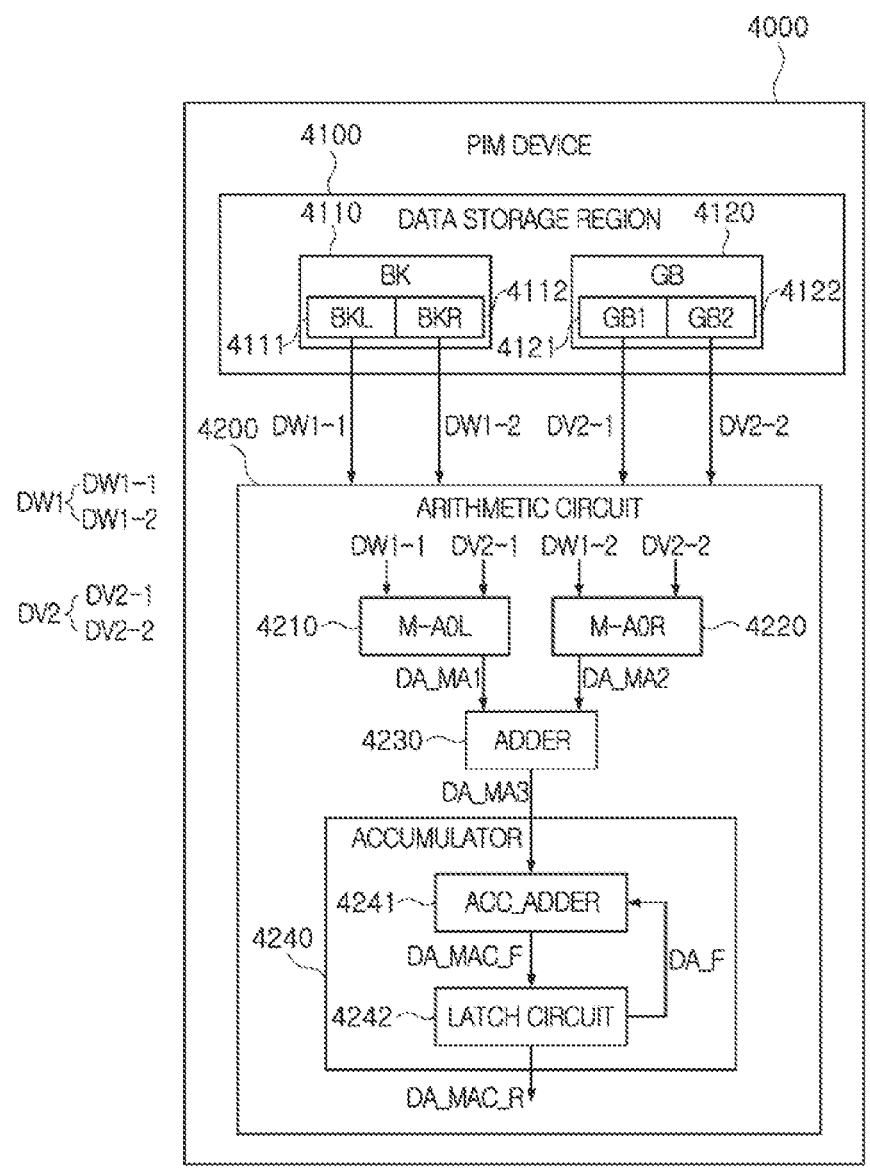
FIG. 40 is a block diagram of a PIM device according to another embodiment of the present disclosure.

The accumulator 3240 may receive the third multiplication-addition data DA_MA3 from the adder 3230. The accumulator 3240 may output final MAC result data DA_MAC_R generated by accumulating the third multiplication-addition data DA_MAC3 transmitted from the adder 3230. The accumulator 3240 may be positioned in the first region REGION 1. For example, the accumulator 3240 may include an accumulating adder 3241 and a latch circuit 3242. The accumulating adder 3241 may add feedback data DA_F to the third multiplication-addition data DA_MAC3 transmitted from the adder 3230 to output MAC result data DA_MAC_F in which the feedback data DA_F has been added. The latch circuit 3242 may receive and latch the MAC result data DA_MAC_F transmitted from the accumulating adder 3241, in which the feedback data DA_F has been added. The latch circuit 3242 may transmit the MAC result data DA_MAC_F transmitted from the accumulating adder 3241, in which the feedback data DA_F has been added to the accumulating adder 3241 as feedback data DA_F. When all operations on the first data DW1 and the second data DV2 are finished, the final MAC result data DA_MAC_R of the first data DW1 and the second data DV2 may be output from the latch circuit 3242. Like the arithmetic circuit (1200 of FIG. 31) described above with reference to FIGS. 31 to 34, the MAC operation of the first MAC operator 3200 may also be repeated a plurality of times, FIG. 40 is a block diagram of a PIM device 4000 according to yet another embodiment of the present disclosure. Referring to FIG. 40, the PIM device 4000 may include a data storage region 4100 and an arithmetic circuit 4200. The data storage region 4100 may store first data DW1 and second data DV2. The data storage region 4100 may separately store the first data DW1 and the second data DV2. The first data DW1 may be composed of a first portion DW1-1 and a second portion DW1-2. The second data DV2 may be composed of a first portion DV2-1 and a second portion DV2-2. The arithmetic circuit 4200 may perform a multiplication-and-accumulation (MAC) operation on the first data DW1 and the second data DV2 transmitted from the data storage region 4100 to output MAC operation results. The description of the PIM device (10 of FIG. 1) described with reference to FIG. 1 may be equally applied to the PIM device 4000 illustrated in FIG. 40. For example, the PIM device 4000 may operate in a memory mode and a MAC operation mode, like the PIM device (10 of FIG. 1) illustrated in FIG. 1.

The data storage region 4100 may include a memory bank (BK) 4110 and a global buffer (GB) 4120. The memory bank (BK) 4110 may include a left bank (BKL) 4111 that stores the first portion DW1-1 of the first data DW1 and a right bank (BKR) 4112 that stores the second portion DW1-2 of the first data DW1. The global buffer (GB) 4120 may include a first global bank (GB1) 4121 that stores the first portion DV2-1 of the second data DV2 and a second global bank (GB2) 4122 that stores the second portion DV2-2 of the second data DV2.

The arithmetic circuit 4200 may receive the first portion DW1-1 of the first data DW1 from the left bank (BKL) 4111, and may receive the second portion DW1-2 of the first data DW1 from the right bank (BKR) 4112. In addition, the arithmetic circuit 4200 may receive the first portion DV2-1 of the second data DV2 from the first global buffer (GB1) 4121, and may receive the second portion DV2-2 of the second data DV2 from the second global buffer (GB2) 4122. The arithmetic circuit 4200 may include a first multiplication-addition circuit (M-A0L) 4210, a second multiplication-addition circuit (M-A0R) 4220, an adder 4230, and an accumulator 4240. The first multiplication-addition circuit (M-A0L) 4210, the second multiplication-addition circuit (M-A0R) 4220, the adder 4230, and the accumulator 4240 may have substantially the same configurations as the first multiplication-addition circuit M-AOL (1210 of FIG. 31), the second multiplication-addition circuit M-AOL (1220 of FIG. 31), the adder (1230 of FIG. 31), and the accumulator (1240 of FIG. 31) described above with reference to FIGS. 31 to 34. Therefore, the descriptions of the corresponding components will be omitted.

Figure 41:
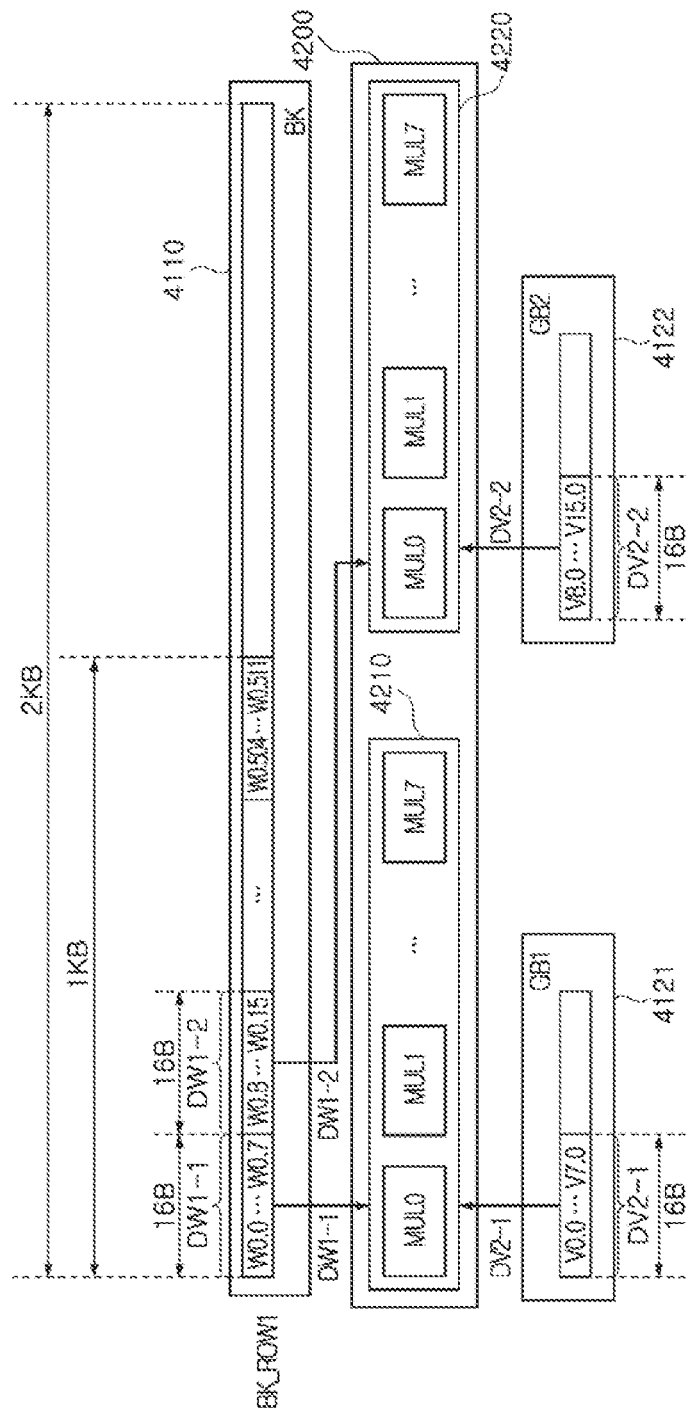
FIG. 41 illustrates a method of accessing data in the PIM device illustrated in FIG. 40.

FIG. 41 illustrates an example of a method of accessing data in the PIM device 4000 illustrated in FIG. 40. Referring to FIG. 41, in this example, the first data DW1 may be composed of the elements W0.0, . . . , and W0.511 of the first row of the 512×512 weight matrix illustrated in FIG. 35. The second data DV2 may be composed of the elements V0.0, ..., and V511.0 of the 512×1 vector matrix illustrated in FIG. 35. In this embodiment, it is premised that each of the elements W0.0, ..., and W0.511 of the first row of the weight matrix and each of the elements V0.0, ..., and V511.0 of the vector matrix have a size of 2 bytes. Accordingly, the first data DW1 and the second data DV2 may each have a size of 1 Kbyte 1 KB.

In this embodiment, it may be exemplified that the first data DW1 is stored, for example, in a first row BK_ROW1 of the memory bank (BK) 4110 having a storage capacity of 2 Kbytes 2 KB. In addition, in this embodiment, it may be exemplified that each of the left bank (BKL) 4111 and the right bank (BKR) 4112 transmits 16 bytes 16B of data to the arithmetic circuit 4200 to perform a single MAC operation. In this case, the left bank (BKL) 4111 may transmit the first portion DW1-1 of the first data DW1 corresponding to the elements W0.0, ..., and W0.7 of the first to eighth columns of the first row of the weight matrix to the first multiplication-addition circuit 4210 of the arithmetic circuit 4200. The right bank (BKR) 4112 may transmit the second portion DW1-2 of the first data DW1 corresponding to the elements W0.8, ..., and W0.15 of the ninth to sixteenth columns of the first row of the weight matrix to the second multiplication-addition circuit 4220 of the arithmetic circuit 4200. This process may be repeatedly performed a plurality of times until all of the MAC operations for the entire first data DW1 corresponding to the elements W0.0, ..., and W0.511 of the first row of the weight matrix are finished.

In this embodiment, it is exemplified that the first global buffer (GB1) 4121 and the second global buffer (GB2) 4122 may each transmit 16 bytes of data to the arithmetic circuit 4200 to perform a single MAC operation. In this case, the first global buffer (GB1) 4121 may transmit the first portion DV2-1 of the second data DV2 corresponding to the elements V0.0, ..., and V7.0 of the first to eighth columns of the vector matrix to the first multiplication-addition circuit 4210 of the arithmetic circuit 4200. The second global buffer (GB2) 4122 may transmit the second portion DV2-2 of the second data DV2 corresponding to the elements V8.0, ..., and V15.0 of the ninth to sixteenth columns of the vector matrix to the second multiplication-addition circuit 4220 of the arithmetic circuit 4200. This process may be repeatedly performed a plurality of times until all of the MAC operations for the entire second data DV2 corresponding to the elements W0.0, ..., and W0.511 of the vector matrix are finished.

The multipliers included in the first and second multiplication-addition circuits 4210 and 4220 may each perform a multiplication-addition operation of the inputted data. Each of the multipliers included in the first and second multiplication-addition circuits 4210 and 4220 may receive the first data DW1 and the second data DV2 of 16 Bytes 16B. For example, when each of the first and second multiplication-addition circuits 4210 and 4220 includes 8 multipliers MUL0, ..., and MUL7, the first and second multiplication-addition circuits 4210 and 4220 may perform multiplication-addition operations of 256 Bytes at one time. Although not shown in FIG. 41, the second data DV2 transmitted from the first and second global buffers (GB1) 4210 and (GB2) 4220 may be inputted to the arithmetic circuit 4200 through separate global input/output lines.

Figure 42:
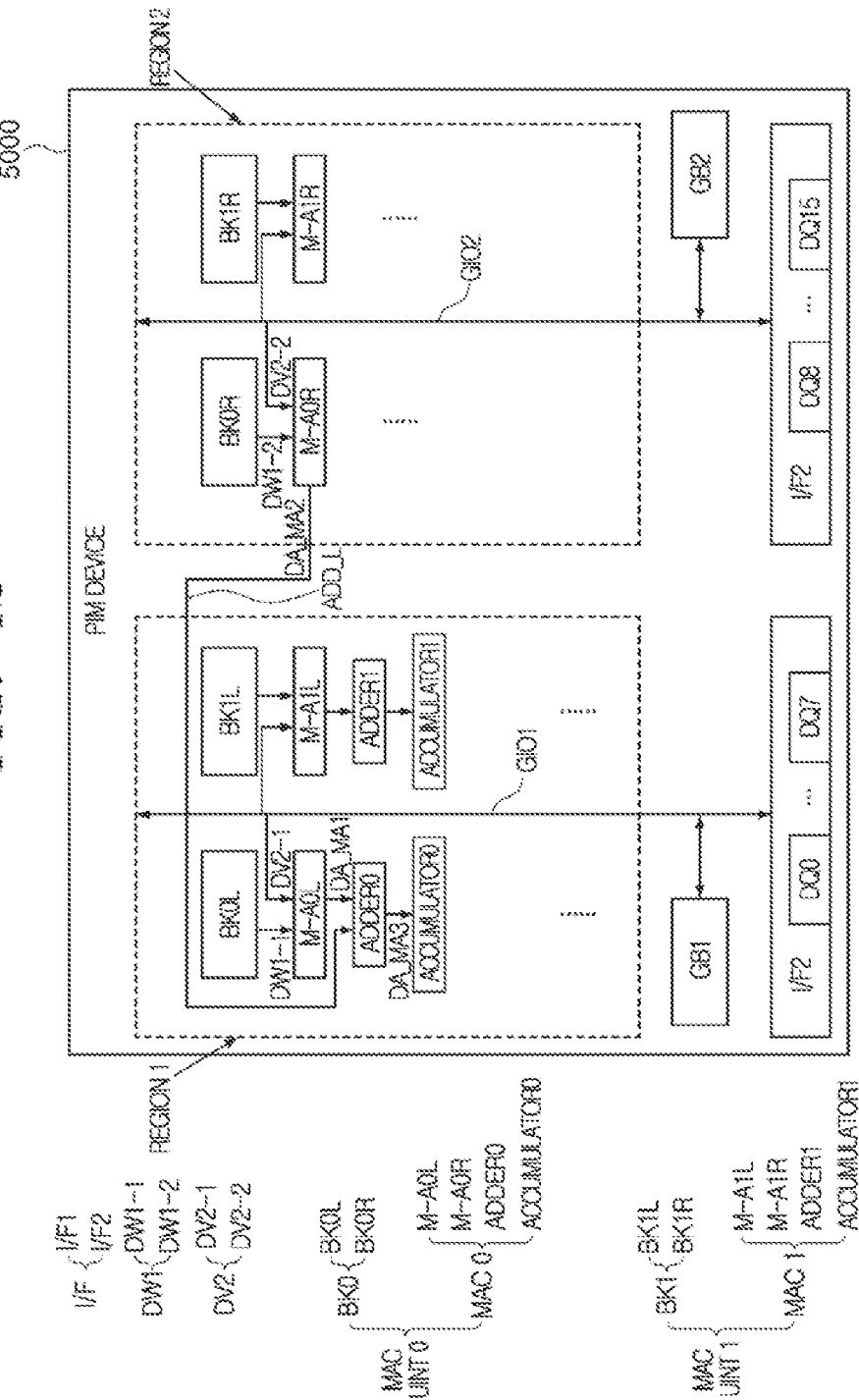
FIG. 42 illustrates an arrangement structure of memory banks and operation circuits in a PIM device according to another embodiment of the present disclosure.

FIG. 42 illustrates a disposal structure of memory banks and arithmetic circuits in a PIM device 5000 according to yet another embodiment of the present disclosure. Referring to FIG. 42, the PIM device 5000 may include a plurality of memory banks BK0 and BK1, a first global buffer GB1, a second global buffer GB2, MAC operators MAC0 and MAC1, a first global input/output line GIO1, a second global input/output line GIO2, and an interface I/F. The number of the memory banks included in the PIM device 5000 may be variously set.

The first memory bank BK0 and the first MAC operator MAC0 may constitute a first MAC unit MAC UNIT 0. Likewise, the second memory bank BK1 and the second MAC operator MAC1 may constitute a second MAC unit MAC UNIT 1. The description of the first MAC unit MAC UNIT 0 may be equally applied to the other MAC unit. The configuration of the first MAC unit MAC UNIT 0 will be described with reference to FIG. 43 below.

The interface I/F may include a first interface I/F1 allocated to a first region REGION 1, and a second interface I/F2 allocated to a second region REGION 2. The first interface I/F1 may include a plurality of data input/output circuits DQ0, ..., and DQ7 performing data transmission between the outside and left banks BK0L and BK1L of the memory banks BK0 and BK1, respectively. The second interface I/F2 may include a plurality of data input/output circuits DQ8, ..., and DQ15 performing data transmission between the outside and right banks BK0R and BK1R of the memory banks BK0 and BK1, respectively. Previously, the descriptions of the data input/output circuits (DQ0, ..., and DQ15 in FIG. 37) described with reference to FIG. 37 may be equally applied to the data input/output circuits DQ0, ..., and DQ15 shown in FIG. 42.

Like the PIM device (3000 of FIG. 38) described with reference to FIG. 38 above, the PIM device 5000 may also include the first region REGION 1 and the second region REGION 2 that are separated within the PIM device 5000. The left banks BK0L and BK1L may be disposed in the first region REGION 1, and the right banks BK0R and BK1R may be disposed in the second region REGION 2. The data input/output circuits DQ0, ..., and DQ7 allocated in the left banks BK0L and BK1L may be disposed adjacent to the first region REGION 1, and the data input/output circuits DQ8, ..., and DQ15 allocated in the right banks BK0R and BK1R may be disposed adjacent to the second region REGION 2.

The first global buffer GB1 may transmit data to the first MAC operator MAC0 through the first global input/output line GIO1 allocated in the first region REGION 1. The second global buffer GB2 may transmit data to the second MAC operator MAC1 through the second global input/output line GIO2 allocated in the second region REGION 2. In an embodiment, the first global buffer GB1 may be disposed adjacent to the first region REGION 1, and the second global buffer GB2 may be disposed adjacent to the second region REGION 2.

Figure 43:
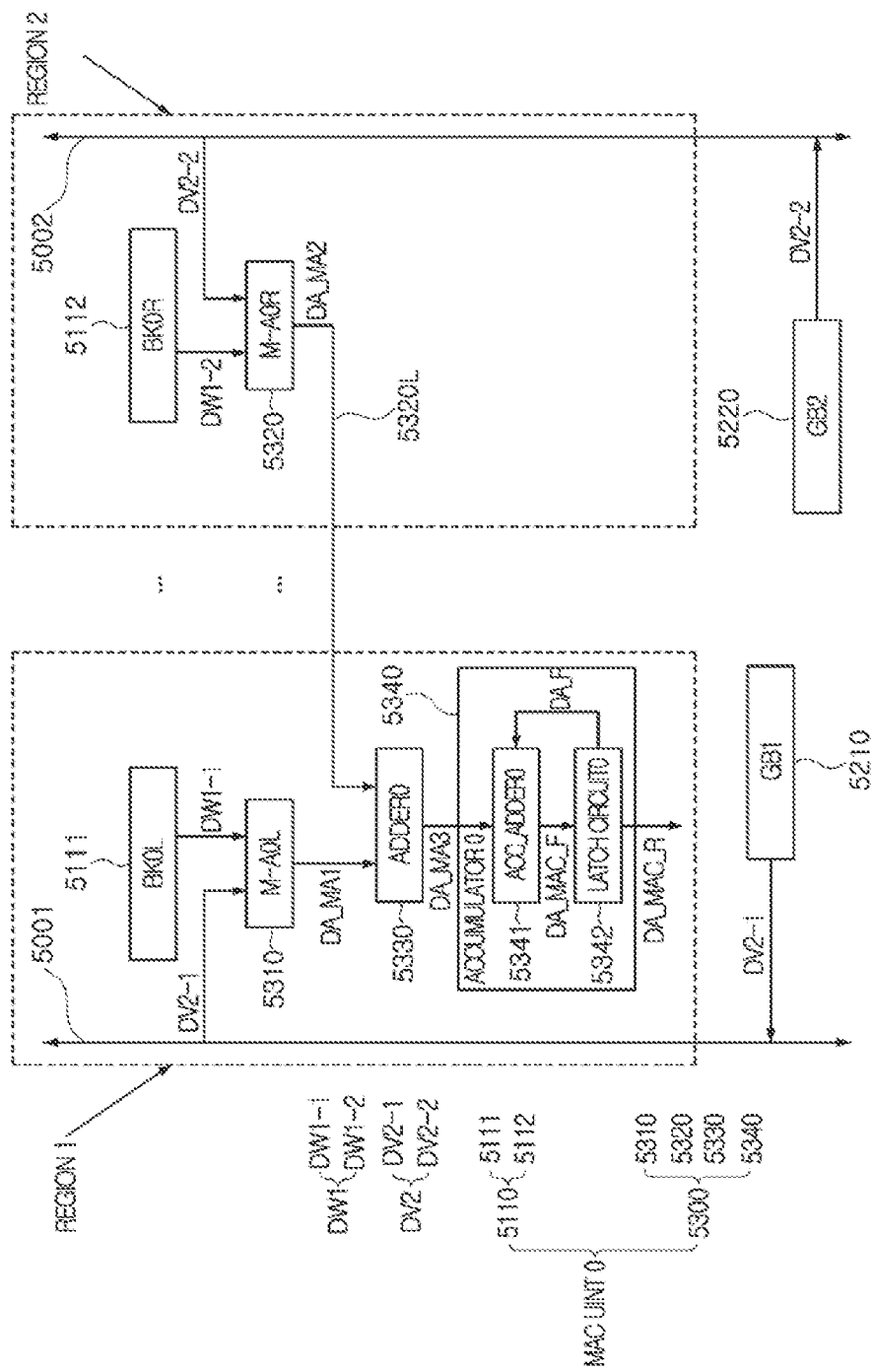
FIG. 43 illustrates an example of a configuration of a MAC unit included in the PIM device illustrated in FIG. 42.

FIG. 43 illustrates an example of a configuration of the first MAC unit MAC UNIT 0 included in the PIM device 5000 illustrated in FIG. 42. Referring to FIG. 43, a first memory bank 5110 may include the left bank (BK0L) 5111 that stores a first portion DW1-1 of first data DW1 composed of the first portion DW1-1 and a second portion DW1-2, and the right bank (BK0R) 5112 that stores the second portion DW1-2 of the first data DW1. A first global buffer 5210 may store a first portion DV2-1 of second data DV2 composed of the first portion DV2-1 and a second portion DV2-2. A second global buffer 5220 may store a second portion DV2-2 of the second data DV2.

A first MAC operator 5300 may include a first multiplication-addition circuit (M-A0L) 5310, a second multiplication-addition circuit (M-A0R) 5320, an adder 5330, and an accumulator 5340. The first multiplication-addition circuit (M-A0L) 5310 may receive the first portion DW1-1 of the first data DW1 from the left bank (BK0L) 5111. In addition, the first multiplication-addition circuit (M-A0L) 5310 may receive the first portion DV2-1 of the second data DV2 from the first global buffer (GB1) 5210 through a first global input/output line 5001. The multiplication-addition circuit (M-A0L) 5310 may output first multiplication-addition data DA_MA1 generated by performing a first multiplication-addition operation on the first portion DW1-1 of the first data DW1 and the first portion DV2-1 of the second data DV2. The first multiplication-addition circuit (M-A0L) 5310 may be positioned in the first region REGION 1.

The second multiplication-addition circuit (M-A0R) 5320 may receive the second portion DW1-2 of the first data DW1 from the right bank 5112. In addition, the second multiplication-addition circuit (M-A0R) 5320 may receive the second portion DV2-2 of the second data DV2 from the second global buffer (GB2) 5220 through a second global input/output line 5002. The second multiplication-addition circuit (M-A0R) 5320 may output second multiplication-addition data DA_MA2 generated by performing a second multiplication-addition operation on the second portion DW1-2 of the first data DW1 and the second portion DV2-2 of the second data DV2. The second multiplication-addition circuit (M-A0R) 5320 may be positioned in the second region REGION 2.

The adder 5330 may receive the first multiplication-addition data DA_MA1 from the first multiplication-addition circuit (M-A0L) 5310 and the second multiplication-addition data DA_MA2 from the second multiplication-addition circuit (M-A0R) 5320. The adder 5330 may output third multiplication-addition data DA_MA3 generated by summing the first multiplication-addition data DA_MA1 and the second multiplication-addition data DA_MA2. The adder 5330 may be positioned in the first region REGION 1.

The PIM device 5000 may further include a data transmission line 5320L configured to connect the adder 5330 positioned in the first region REGION 1 and the second multiplication-addition circuit (M-A0R) 5320 positioned in the second region REGION 2. The second multiplication-addition data DA_MA2 may be transmitted from the second multiplication-addition circuit (M-A0R) 5320 to the adder 5330 through the data transmission line 5320L.

The accumulator 5340 may receive the third multiplication-addition data DA_MA3 from the adder 5330. The accumulator 5340 may output final MAC result data DA_MAC_R generated by accumulating the third multiplication-addition data DA_MA3 transmitted from the adder 5330. The accumulator 5340 may be positioned in the first region REGION 1. The accumulator 5340 may include an accumulating adder 5341 and a latch circuit 5342. The accumulating adder 5341 may add feedback data DA_F to the third multiplication-addition data DA_MA3 transmitted from the adder 5330 to output MAC result data DA_MAC_F in which the feedback data DAF has been added. The latch circuit 5342 may receive and latch the MAC result data DA_MAC_F transmitted from the accumulating adder 5341, in which the feedback data DA_F has been added. The latch circuit 5342 may transmit the MAC result data DA_MAC_F in which the feedback data DA_F has been added, transmitted from the accumulating adder 5341 to the accumulating adder 5341 as feedback data DA_F. When all operations on the first data DW1 and the second data DV2 are finished, final MAC result data DA_MAC_R of the first data DW1 and the second data DV2 may be output from the latch circuit 5432. Like the operation circuit (1200 in FIG. 31) described above with reference to FIGS. 31 to 34, the MAC operation of the first MAC operator 5300 may also be repeated a plurality of times.

Figure 44:
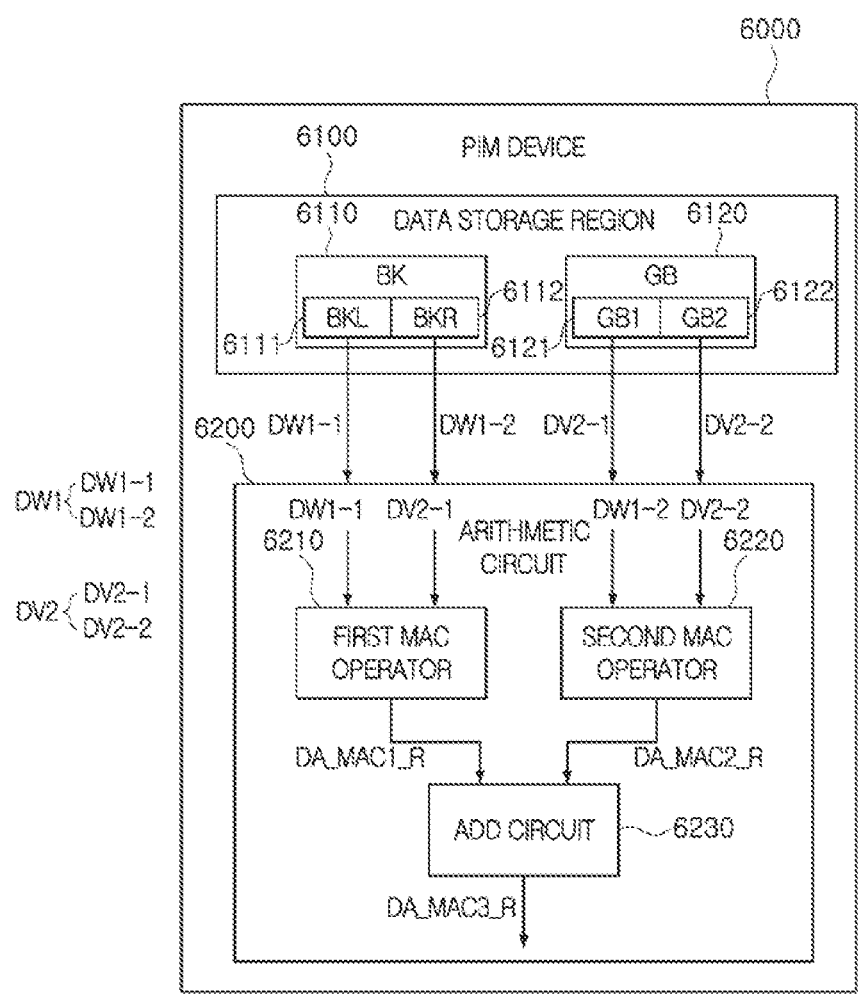
FIG. 44 is a block diagram of a PIM device according to another embodiment of the present disclosure.

FIG. 44 is a block diagram of a PIM device 6000 according to yet another embodiment of the present disclosure. Referring to FIG. 44, the PIM device 6000 may include a data storage region 6100 and an arithmetic circuit 6200. The data storage region 6100 may store first data DW1 and second data DV2. In the data storage region 6100, the first data DW1 and the second data DV2 may be separately stored. The first data DW1 may be composed of a first portion DW1-1 and a second portion DW1-2, and the second data DV2 may be composed of a first portion DV2-1 and a second portion DV2-2. The arithmetic circuit 6200 may perform multiplication-addition operations to the first data DW1 and the second data DV2 transmitted from the data storage region 6100 to output operation results. The description of the PIM device (10 in FIG. 1) described with reference to FIG. 1 may be equally applied to the PIM device 6000 illustrated in FIG. 44. For example, the PIM device 6000 may operate in a memory mode and a MAC operation mode, like the PIM device (10 of FIG. 1) illustrated in FIG. 1.

The data storage region 6100 may include a memory bank (BK) 6110 and a global buffer (GB) 6120. The memory bank (BK) 6110 may include a left bank (BKL) 6111 that stores the first portion DW101 of the first data DW1 and a right bank (BKR) that stores the second portion DW1-2 of the first data DM. The global buffer (GB) 6120 may include a first global buffer (GB1) 6121 that stores the first portion DV2-1 of the second data DV2 and a second global buffer (GB2) 6122 that stores the second portion DV2-2 of the second data DV2.

The arithmetic circuit 6200 may receive the first portion DW1-1 of the first data DW1 from the left bank (BKL) 6111, and may receive the second portion DW1-2 of the first data DW1 from the right bank (BKR) 6112. The arithmetic circuit 6200 may receive the first portion DV2-1 of the second data DV2 from the first global buffer (GB1) 6121, and may receive the second portion DV2-2 of the second data DV2 from the second global buffer (GB2) 6122.

The arithmetic circuit 6200 may include a first MAC operator 6210, a second MAC operator 6220, and an addition circuit 6230. The first MAC operator 6210 may output first MAC result data DA_MAC1_R generated by performing a first MAC operation on the first portion DW1-1 of the first data DW1 and the first portion DV2-1 of the second data DV2. The second MAC operator 6220 may output second MAC result data DA_MAC2_R generated by performing a second MAC operation on the second portion DW1-2 of the first data DW1 and the second portion DV2-2 of the second data DV2. The addition circuit 6230 may receive the first MAC result data DA_MAC1_R from the first MAC operator 6210, and may receive the second MAC result data DA_MAC2_R from the second MACA operator 6220. The addition circuit 6230 may sum the first MAC result data DA_MAC1_R and the second MAC result data DA_MAC2_R to output third MAC result data DA_MAC3_R, which is a final MAC result data on the first data DW1 and the second data DV2.

Figure 45:
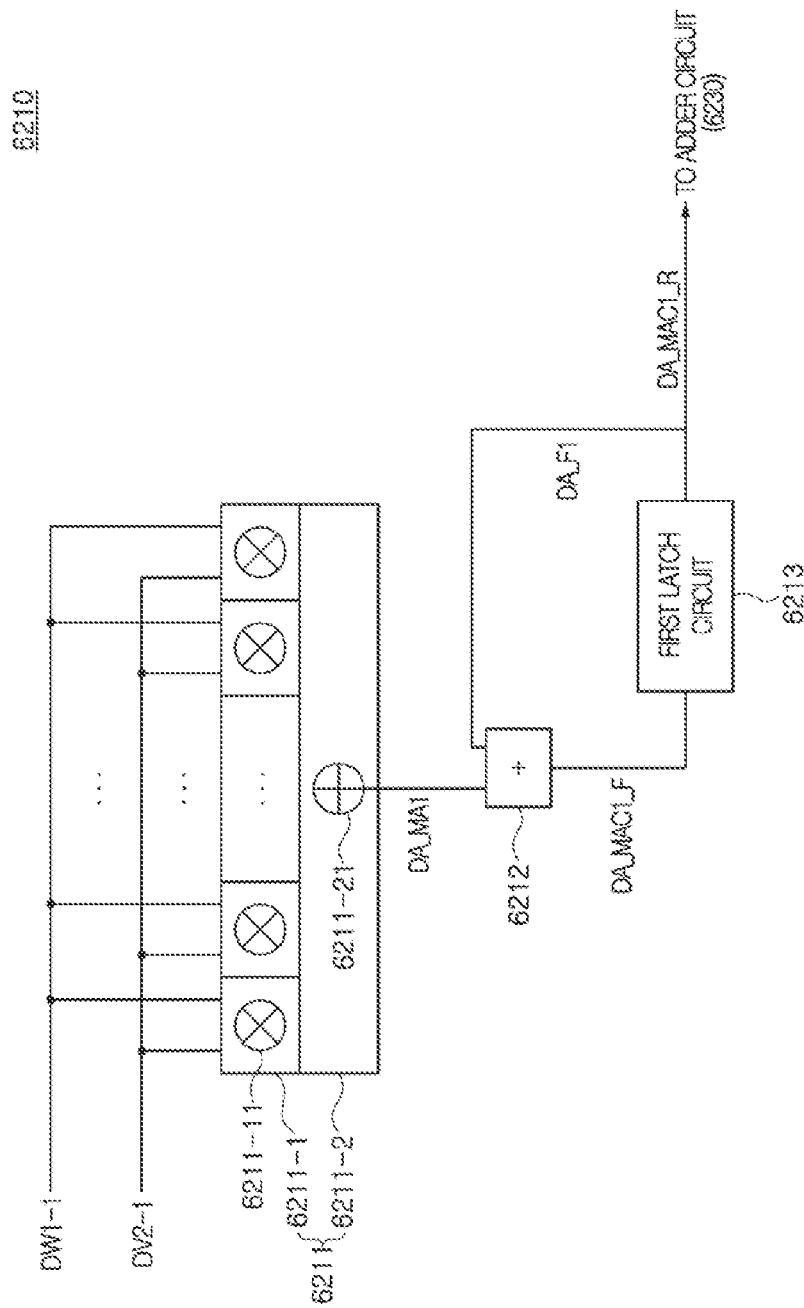
FIGS. 45, 46, and 47 illustrate an example of a detailed configuration of sub-elements of the operation circuit illustrated in FIG. 44.
Figure 46:
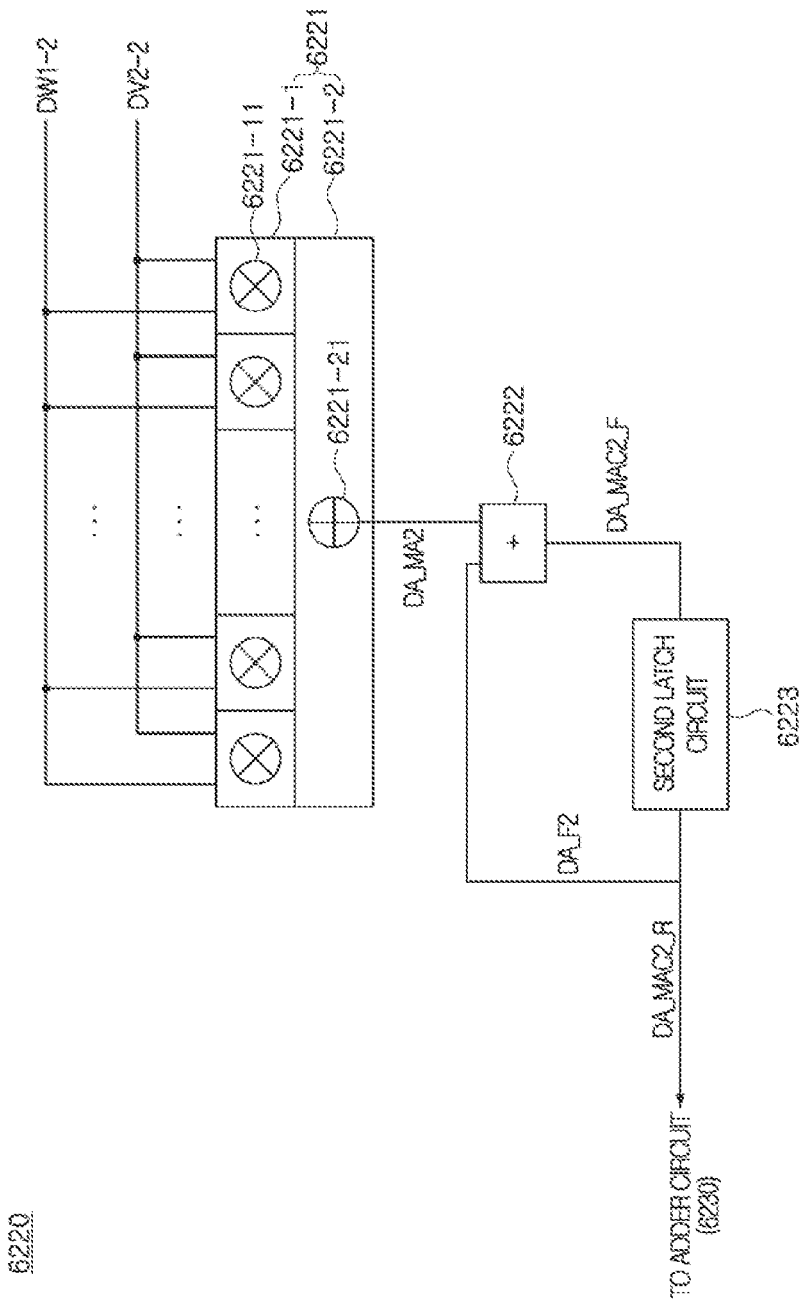
Figure 47:
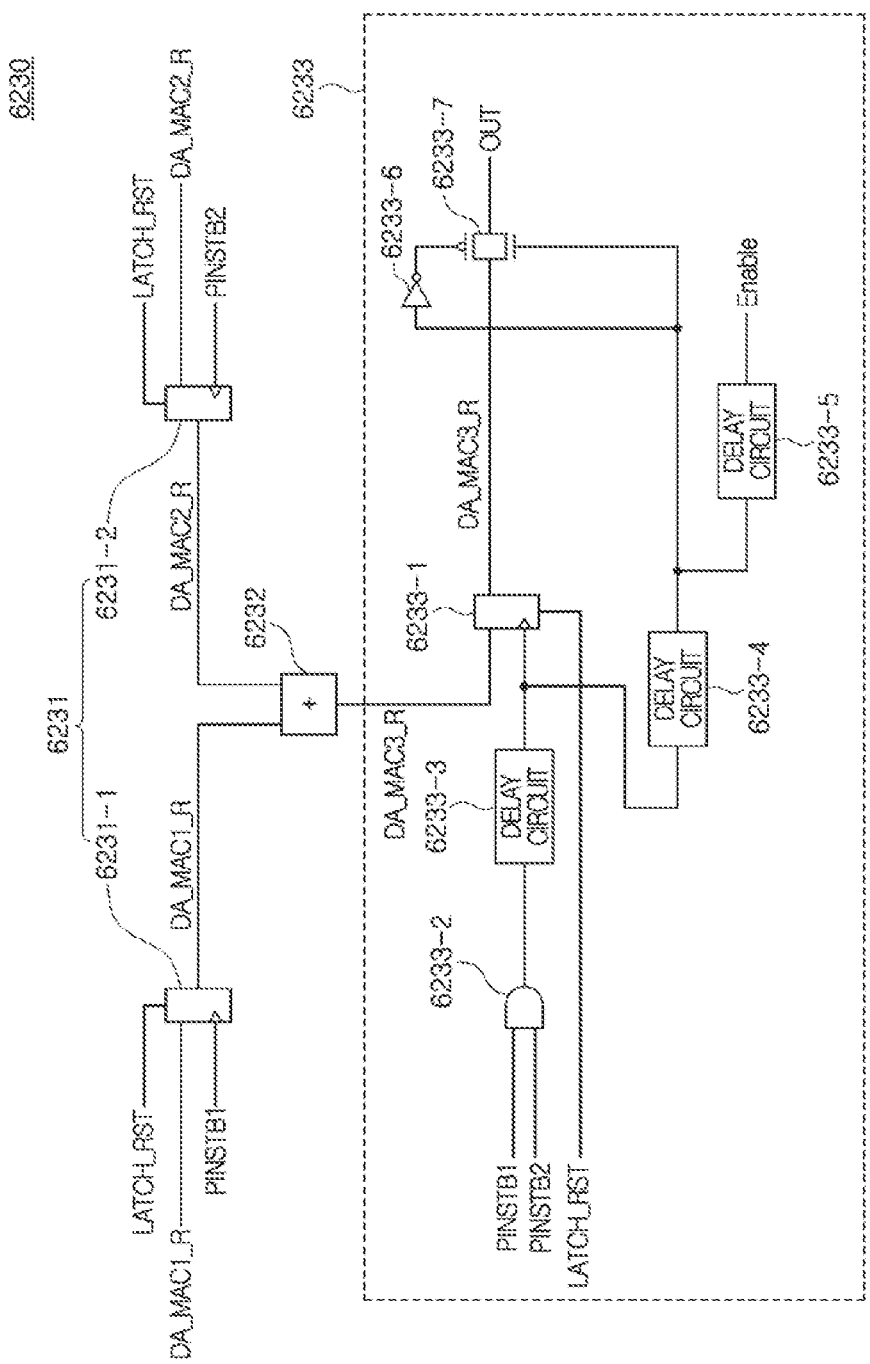

FIGS. 45 to 47 illustrate an example of detailed configurations of sub-elements of the arithmetic circuit 6200 of FIG. 44. For example, FIG. 45 illustrates an example of the detailed configuration of the first MAC operator 6210. FIG. 46 illustrates an example of the detailed configuration of the second MAC operator 6220. FIG. 47 illustrates an example of the detailed configuration of the addition circuit 6230.

Referring to FIG. 45, the first MAC operator 6210 may include a first calculation block 6211, a first accumulating adder 6212, and a first latch circuit 6213. The first calculation block 6211 may include a first multiplication logic circuit 6211-1 including a plurality of first multipliers 6211-11, and a first addition logic circuit 6211-2 including a plurality of first adders 6211-21. Each of the first multiplication logic circuit 6211-1 and the first addition logic circuit 6211-2 of the first calculation block 6211 may be configured substantially the same as the first multiplication logic circuit (1211 of FIG. 35) and the first addition logic circuit (1212 of FIG. 35) of the first multiplication-addition circuit (1210 of FIG. 35) described above with reference to FIG. 35. Accordingly, the description of the corresponding components will be omitted.

The first accumulating adder 6212 may add first feedback data DA_F1 to a first multiplication-addition data DA_MA1 transmitted from the first calculation block 6211 to output first MAC result data DA_MAC1_F. The first latch circuit 6213 may receive and latch the first MAC result data DA_MAC1_F transmitted from the first accumulating adder 6212, in which the first feedback data DA_F has been added. Thereafter, the first latch circuit 6213 may transmit the first MAC result data DA_MAC1_F transmitted from the first accumulating adder 6212, in which the first feedback data DA_F1 has been added to the first accumulating adder 6212 as first feedback data DA_F1.

The MAC operation process of the first MAC operator 6210 described above may be repeated. Accordingly, when all operations on the first portion DW1-1 of the first data DW1 and the first portion DV2-1 of the second data DV2 are finished, final first MAC result data DA_MAC1_R of the first portion DW1-1 of the first data DW1 and the first portion DV2-1 of the second data DV2 may be output from the first latch circuit 6213.

Referring to FIG. 46, the second MAC operator 6220 may include a second calculation block 6221, a second accumulating adder 6222, and a second latch circuit 6223. The second calculation block 6221 may include a second multiplication logic circuit 6221-1 including a plurality of second multipliers 6221-11, and a second addition logic circuit 6221-2 including a plurality of second adders 6221-21. Each of the second multiplication logic circuit 6221-1 and the second addition logic circuit 6221-2 of the second calculation block 6221 may be configured substantially the same as the second multiplication logic circuit (1221 of FIG. 36) and the second addition logic circuit (1222 of FIG. 36) of the second multiplication-addition circuit (1220 of FIG. 36) described above with reference to FIG. 36. Accordingly, the description of the corresponding components will be omitted.

The second accumulating adder 6222 may add second feedback data DA_F2 to second multiplication-addition data DA_MA2 transmitted from the second calculation block 6221 to output second MAC result data DA_MAC2_F. The second latch circuit 6223 may receive and latch the second MAC result data DA_MAC2_F transmitted from the second accumulating adder 6222, in which the second feedback data DA_F2 has been added. Thereafter, the second latch circuit 6223 may transmit the second MAC result data DA_MAC2_F transmitted from the second accumulating adder 6222, in which the second feedback data DA_F2 has been added to the second accumulating adder 6222 as second feedback data DA_F2.

The MAC operation process of the second MAC operator 6220 described above may be repeated. Accordingly, when all operations on the second portion DW1-2 of the first data DW1 and the second portion DV2-2 of the second data DV2 are finished, final second MAC result data DA_MAC2_R of the second portion DW1-2 of the first data DW1 and the second portion DV2-2 of the second data DV2 may be output from the second latch circuit 6223.

Referring to FIG. 47, the addition circuit 6230 may include a data input unit 6231, an adder 6232, and a data output unit 6233. The data input unit 6231 may include a first latch 62314 and a second latch 6231-2. The first latch 6231-1 may receive and latch the first MAC result data DA_MAC1_R. The first latch 6231-1 may output the received first MAC result data DA_MAC1_R in synchronization with a first latch control signal PINSTB1. The second latch 6231-2 may receive and latch the second MAC result data DA_MAC2_R. The second latch 6231-2 may output the received second MAC result data DA_MAC2_R in synchronization with a second latch control signal PINSTB2. The adder 6232 may sum the first MAC result data DA_MAC1_R transmitted from the first latch 6231-1 and the second MAC result data DA_MAC2_R transmitted from the second latch 6231-2 to output third MAC result data DA_MAC3_R.

The data output unit 6233 may include a third latch 6233-1, an AND gate 6233-2, first to third delay circuits 6233-3, 6233-4, and 6233-5, an inversion gate 6233-6, and a transfer gate 6233-7. The third latch 6233-1 may receive and latch the third MAC result data DA_MAC3_R output from the adder 6232. The AND gate 6233-3 may receive the first latch control signal PINSTB1 and the second latch control signal PINSTB2, and may perform an AND operation to output.

The first to third delay circuits 6233-3, 6233-4, and 6233-5 may delay the received signal for a certain time to output the same. The first delay circuit 6233-3 may receive a signal output from the AND gate 6233-2, and may delay the received signal for a certain time to output the same. The signal output from the first delay circuit 6233-3 may be inputted to the third latch 6233-1 and the second delay circuit 6233-2. The third latch 6233-1 may output the received third MAC result data DA_MAC3_R in synchronization with a signal output from the first delay circuit 6233-3. The signal output from the second delay circuit 6233-4 may be inputted to the third delay circuit 6233-5 and the inversion gate 6233-6. The inversion gate 6233-6 may perform inversion buffering of the received signal to output the inversion-buffered signal to the transfer gate 6233-7. The third delay circuit 6233-5 may delay the received signal for a certain time and output an activation signal Enable. In response to the activation signal Enable, the first latch control signal PINSTB1 and the second latch control signal PINSTB2 may be generated.

The transfer gate 6233-7 may output the third MAC result data DA_MAC3_R transmitted from the third latch 6233-1 to the outside OUT in response to the signal output from the inversion gate 6233-6. Thereafter, a latch reset signal LATCH_RST generated inside or outside the PIM device 6000 of FIG. 44 may be inputted to each of the first to third latches 621-1, 6231-2, and 6233-1. Accordingly, the first to third latches 621-1, 6231-2, and 6233-1 may be initialized, and all data stored in the first to third latches 621-1, 6231-2, and 6233-1 may be removed.

Figure 48:
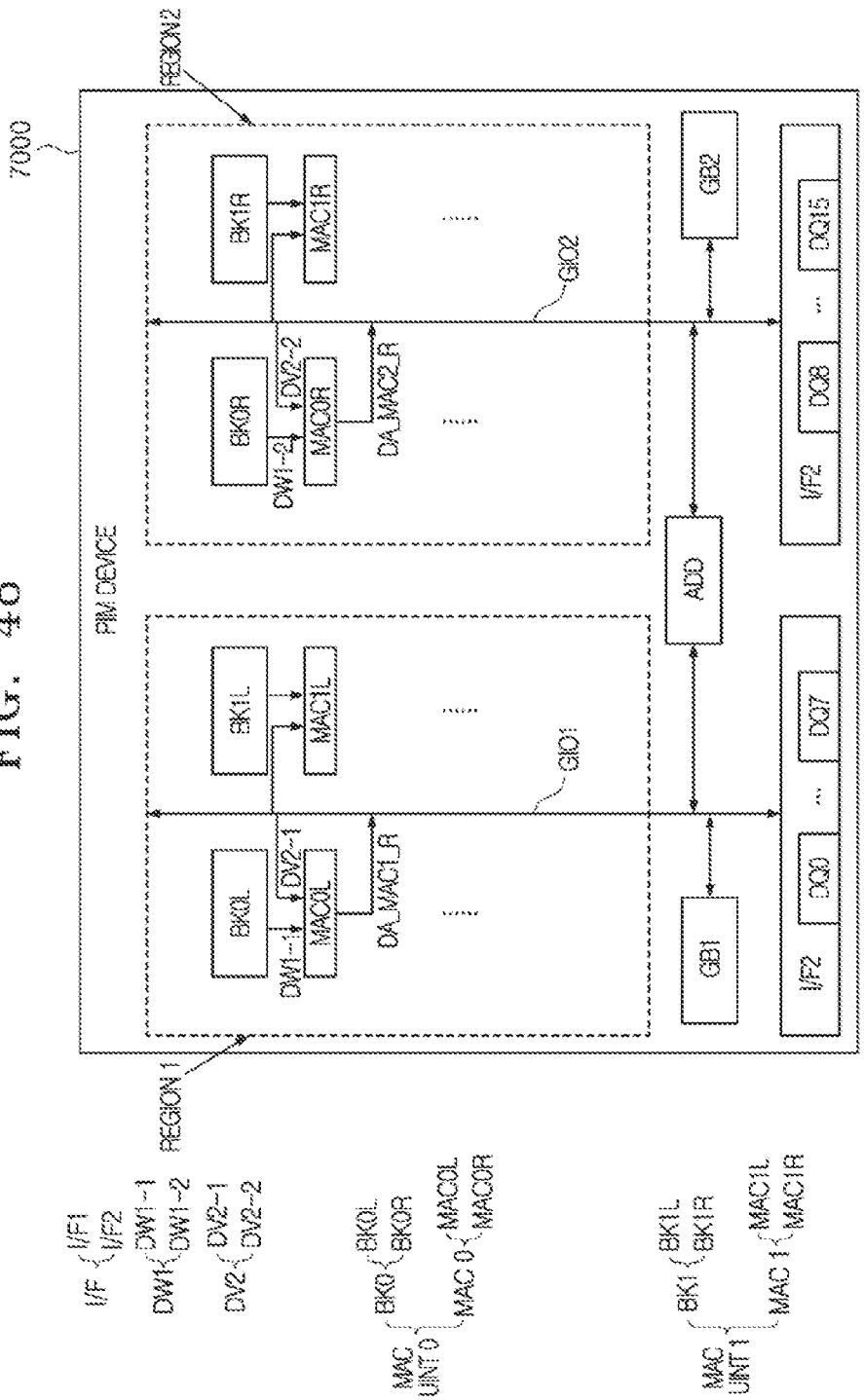
FIG. 48 illustrates an arrangement structure of memory banks and operation circuits in a PIM device according to another embodiment of the present disclosure.

FIG. 48 illustrates a disposal structure of memory banks and calculation circuits in a PIM device 7000 according to still yet another embodiment of the present disclosure. Referring to FIG. 48, the PIM device 7000 may include a plurality of memory banks BK1 and BK1, a first global buffer GB1, a second global buffer GB2, a plurality of MAC operators MAC0 and MAC1, a first global input/output line GIO1, a second global input/output line GIO2, an addition circuit ADD, and an interface I/F. The number of the memory banks included in the PIM device 7000 may be variously set.

A first memory bank BK0 and a first MAC operator MAC0 may constitute a first MAC unit MAC UNIT 0. Likewise, a second memory bank BK1 and a second MAC operator MAC1 may constitute a second MAC unit MAC UNIT 1. The description of the first MAC unit MAC UNIT 0 may be equally applied to the other MAC unit. The first MAC unit MAC UNIT 0 will be described in more detail below with reference to FIG. 49.

The interface I/F may include a first interface I/F1 allocated to a first region REGION 1and a second interface I/F2 allocated to a second region REGION 2. The first interface I/F1 may include a plurality of data input/output circuits DQ0, . . . , and DQ7 performing data transmission between the outside and left banks BK0L and BK1L of the memory banks BK0 and BK1, respectively. The second interface I/F2 may include a plurality of data input/output circuits DQ8, . . . , and DQ15 performing data transmission between the outside and right banks BK0R and BK1R of the memory banks BK0 and BK1, respectively. Previously, the description of the data input/output circuits (DQ0, . . . , and DQ15 in FIG. 37) described with reference to FIG. 37 may be equally applied to the data input/output circuits DQ0, . . . , and DQ15 illustrated in FIG. 48.

Like the PIM device (3000 of FIG. 38) described above with reference to FIG. 38, the PIM device 7000 may also include the first region REGION 1 and the second region REGION 2 that are separated within the PIM device 7000. The left banks BK0L and BK1L may be disposed in the first region REGION 1, and the right banks BK0R and BK1R may be disposed in the second region REGION 2. The data input/output circuits DQ0, . . . , and DQ7 included in the left banks BK0L and BK1L may be disposed adjacent to the first region REGION 1, and the data input/output circuits D80, . . . , and DQ15 included in the right banks BK0R and BK1R may be disposed adjacent to the second region REGION 2.

The first global buffer GB1 may transmit data to a first MAC circuit MAC0L of the first MAC operator MAC0 through the first global input/output line GIO1 allocated in the first region REGION 1. The second global buffer GB2 may transmit data to a second MAC circuit MAC0R of the second MAC operator MAC1 through the second global input/output line GIO2 allocated in the second region REGION 2. In an embodiment, the first global buffer GB1 may be disposed adjacent to the first region REGION 1, and the second global buffer GB2 may be disposed adjacent to the second region REGION 2.

Figure 49:
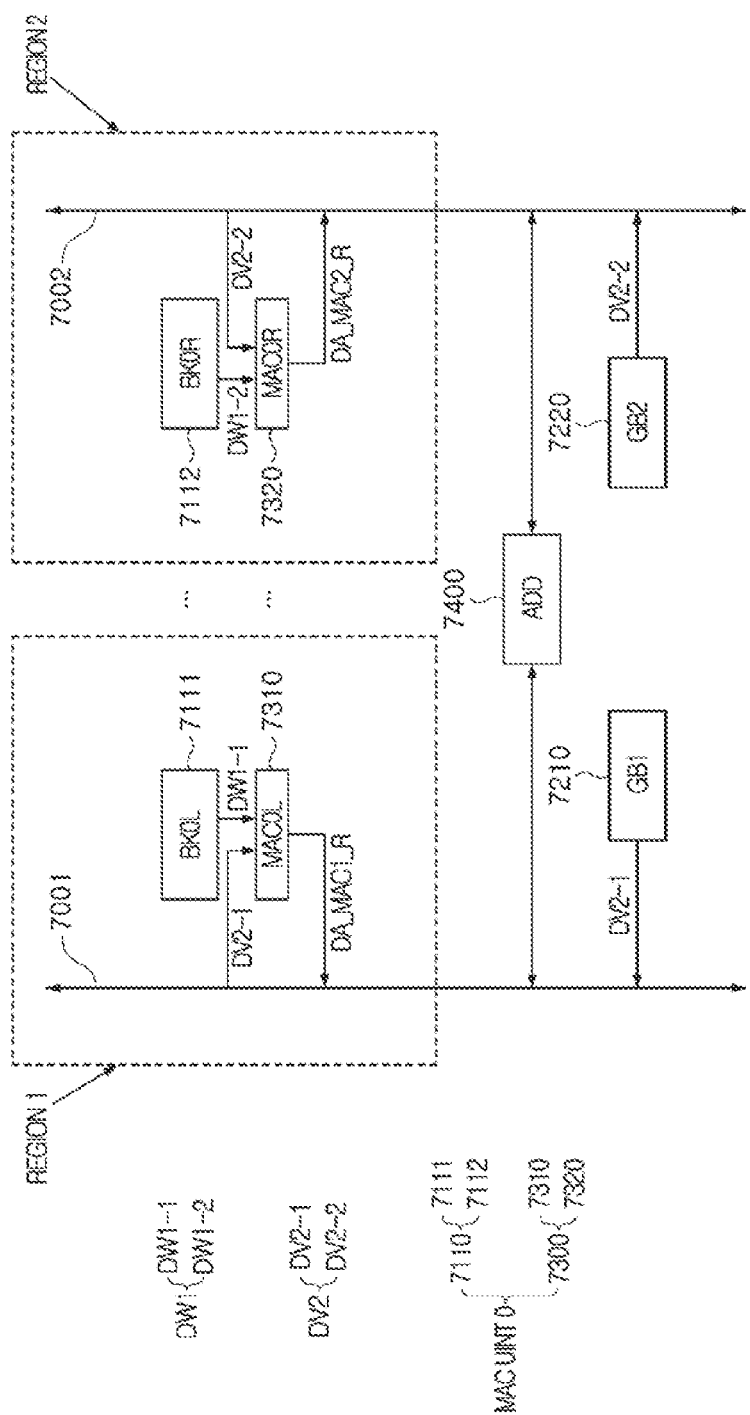
FIG. 49 illustrates an example of a configuration of a MAC unit included in the PIM device illustrated in FIG. 48.

The addition circuit ADD may receive output data DA_MAC1_R of the first MAC circuit MAC0L of the first MAC operator MAC0 through the first global input/output line GIO1, and may receive output data DA_MAC2_R of the second MAC circuit MAC0R of the first MAC operator MAC0 through the second global input/output line GIO2, FIG. 49 illustrates an example of a configuration of the first MAC unit MAC UNIT 0 included in the PIM device 7000 of FIG. 48. A first memory bank (BK0) 7110 may include a left bank (BK0L) 7111 that stores a first portion DW1-1 of first data DW1 composed of the first portion DW1-1 and a second portion DW1-2, and a right bank (BK0R) 7112 that stores the second portion DW1-2 of the first data DW1. A first global buffer (GB1) 7210 may store a first portion DV2-1 of second data DV2 composed of the first portion DV2-1 and a second portion DV2-2. A second global buffer (GB2) 7220 may store the second portion DV2-2 of the second data DV2.

A first MAC operator 7300 may include the first MAC circuit (MAC0L) 7310 and the second MAC circuit (MAC0R) 7320. The first MAC circuit (MAC0L) 7310 may output first MAC result data DATA_MAC1_R generated by performing a first MAC operation on the first portion DW1-1 of the first data DW1 and the first portion DV2-1 of the second data DV2. The second MAC circuit (MAC0R) 7320 may output second MAC result data DATA_MAC2_R generated by performing a second MAC operation on the second portion DW1-2 of the first data DW1 and the second portion DV2-2 of the second data DV2. The addition circuit (ADD) 7400 may receive the first MAC result data DA_MAC0_R from the first MAC circuit (MAC0L) 7310 through a first global input/output line 7001, and may receive the second MAC result data DA_MAC1_R from the second MAC circuit (MAC0R) 7320 through a second global input/output line 7002. The addition circuit (ADD) 7400 may sum the first MAC result data DA_MAC1_R and the second MAC result data DA_MAC2_R to output third MAC result data DA_MAC3_R, which is final MAC result data for the first data DW1 and the second data DV2.

The first MAC circuit (MAC0L) 7310, the second MAC circuit (MAC0R) 7320, and the addition circuit (ADD) 7400 may have substantially the same configurations as the first MAC operator (6210 of FIG. 45), the second MAC operator (6220 of FIG. 46), and the addition circuit (6230 of FIG. 47) described above with reference to FIGS. 45 to 47. Accordingly, the detailed descriptions for the configurations of the first MAC circuit (MAC0L) 7310, the second MAC circuit (MAC0R) 7320, and the addition circuit (ADD) 7400 will be omitted.

A limited number of possible embodiments for the present teachings have been presented above for illustrative purposes. Those of ordinary skill in the art will appreciate that various modifications, additions, and substitutions are possible. While this patent document contains many specifics, these should not be construed as limitations on the scope of the present teachings or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A processing-in-memory (PIM) device comprising:
 a data storage region including a first memory bank configured to store first data divided into a first portion and a second portion, and a second memory bank configured to store second data divided into a first portion and a second portion; and
 an arithmetic circuit configured to perform multiplication and accumulation (multiplication/accumulation) (MAC) operations on the first data and the second data and output final MAC result data,
 wherein the arithmetic circuit includes:
 a first multiplication-addition circuit configured to perform a first multiplication-addition operation on the first portion of the first data and the first portion of the second data to output first multiplication addition data;

a second multiplication-addition circuit configured to perform a second multiplication-addition operation on the second portion of the first data and the second portion of the second data to output second multiplication addition data; and an adder configured to add the first multiplication addition data from the first multiplication-addition circuit and the second multiplication addition data from the second multiplication-addition circuit to output third multiplication addition data, wherein the first portion of first data and the second portion of first data correspond to elements of a row of a weight matrix, and the first portion of second data and the second portion of second data correspond to elements of a column of a vector matrix.

2. The PIM device of claim 1, wherein the first memory bank includes a first left bank configured to store the first portion of the first data, and a first right bank configured to store the second portion of the first data, and wherein the second memory bank includes a second left bank configured to store the first portion of the second data, and a second right bank configured to store the second portion of the second data.

3. The PIM device of claim 1, wherein the first multiplication-addition circuit includes:

a first multiplication logic circuit including a plurality of first multipliers configured to perform a multiplication operation on the first portion of the first data and the first portion of the second data; and a first addition logic circuit including a plurality of first adders configured to perform an addition operation on data output from the plurality of first multipliers.

4. The PIM device of claim 1, wherein the second multiplication-addition circuit includes:

a second multiplication logic circuit including a plurality of second multipliers configured to perform a multiplication operation on the second portion of the first data and the second portion of the second data; and a second addition logic circuit including a plurality of second adders configured to perform an addition operation on data output from the plurality of second multipliers.

5. The PIM device of claim 1, wherein the arithmetic circuit includes:

an accumulating adder configured to add feedback data to the third multiplication addition data transmitted from the adder to output MAC result data; and a latch circuit configured to receive and latch the MAC Result data from the accumulating adder, and provide the final MAC result data to the accumulating adder as the feedback data.

6. A processing-in-memory (PIM) device comprising:

a plurality of storage regions including a first group of storage regions configured to provide first data and a second group of storage regions configured to provide second data; and a plurality of multiplication and accumulation (multiplication/accumulation) (MAC) operators configured to perform MAC operations on the first data and the second data, wherein a first storage region that is one of the first group of storage regions, a second storage region that is one of the second group of storage regions, and a first MAC operator that is one of the plurality of MAC operators constitute a MAC unit, wherein the first storage region includes a first left bank storing a first portion of the first data composed of the first portion and a second portion, and a first right bank storing the second portion of the first data, wherein the second storage region includes a second left bank storing a first portion of the second data composed of the first portion and a second portion, and a second right bank storing the second portion of the second data, and wherein the first MAC operator includes:

a first multiplication-addition circuit configured to perform a first multiplication-addition operation on the first portion of the first data and the first portion of the second data to output first multiplication addition data;

a second multiplication-addition circuit configured to perform a second multiplication-addition operation on the second portion of the first data and the second portion of the second data to output second multiplication addition data;

an adder configured to add the first output data from the first multiplication-addition circuit and the second output data from the multiplication-addition to output third multiplication addition data; and an accumulator configured to accumulate and add the third multiplication addition data from the adder to output final MAC result data, and wherein the first portion of first data and the second portion of first data correspond to elements of a row of a weight matrix, and the first portion of second data and the second portion of second data correspond to elements of a column of a vector matrix.

7. The PIM device of claim 6, further comprising interfaces including a plurality of data input and output (input/output) circuits performing data transmission between an external device and the plurality of storage regions, wherein the first left bank and the second left bank are configured to perform data transmission with the external device through a half of the plurality of data input/output circuits, and wherein the first right bank and the second right bank are configured to perform data transmission with the outside through the other half of the data input/output circuits except for the data input/output circuits allocated to the first left bank and the second left bank among the plurality of data input/output circuits.

8. A processing-in-memory (PIM) device comprising:

a plurality of storage regions including a first group of storage regions configured to provide first data and a second group of storage regions configured to provide second data; and a plurality of multiplication and accumulation (multiplication/accumulation) (MAC) operators configured to perform MAC operations on the first data and the second data, wherein a first storage region that is one of the first group of storage regions, a second storage region that is one of the second group of storage regions, and a first MAC operator that is one of the MAC operators constitute a MAC unit, wherein the first storage region includes a first left bank configured to store a first portion of the first data composed of the first portion and a second portion, and a first right bank configured to store the second portion of the first data, wherein the second storage region includes a second left bank configured to store a first portion of the second data composed of the first portion and a second portion, and a second right bank configured to store the second portion of the second data, wherein the first left bank and the second left bank are positioned in a first region, and the first right bank and the second right bank are positioned in a second region separated from the first region, and wherein the first MAC operator includes:

a first multiplication-addition circuit positioned in the first region and configured to output first multiplication addition data generated by performing a first multiplication-addition operation on the first portion of the first data and the first portion of the second data;

a second multiplication-addition circuit positioned in the second region and configured to output second multiplication addition data generated by performing a second multiplication-addition operation on the second portion of the first data and the second portion of the second data;

an adder positioned in the first region and configured to add the first multiplication addition data from the first multiplication-addition circuit and the second multiplication addition data from the second multiplication-addition circuit to output third multiplication addition data; and an accumulator positioned in the first region and configured to accumulate and add the third multiplication addition data from the adder to output final MAC result data, and wherein the first portion of first data and the second portion of first data correspond to elements of a row of a weight matrix, and the first portion of second data and the second portion of second data correspond to elements of a column of a vector matrix.

9. The PIM device of claim 8, wherein the first MAC operator further includes a data transmission line configured to connect the second multiplication-addition circuit positioned in the second region to the adder positioned in the first region.

10. The PIM device of claim 8, further comprising interfaces performing data transmission between the outside and the plurality of storage regions, wherein the interfaces include:

a first interface allocated to the first region and including a data input and output (input/output) circuit configured to perform data transmission with the first left bank and the second left bank; and a second interface allocated to the second region and including a data input/output circuit configured to perform data transmission with the first right bank and the second right bank.

11. A processing-in-memory (PIM) device comprising:

a data storage region including a memory bank including a left bank configured to store a first portion of first data composed of the first portion and a second portion and a right bank configured to store the second portion of the first data, a first global buffer configured to store a first portion of second data composed of the first portion and a second portion, and a second global buffer configured to store the second portion of the second data; and an arithmetic circuit configured to perform a multiplication and accumulation (multiplication/accumulation) (MAC) operation on the first data and the second data to output a final MAC operation result, wherein the arithmetic circuit is configured to include:

a first multiplication-addition circuit configured to perform a first multiplication-addition operation on the first portion of the first data and the first portion of the second data to output first multiplication addition data;

a second multiplication-addition circuit configured to perform a second multiplication-addition operation on the second portion of the first data and the second portion of the second data to output second multiplication addition data;

an adder configured to add the first multiplication addition data and the second multiplication addition data to output third multiplication addition data; and an accumulator configured to accumulate and add the third multiplication addition data from the adder to output the final MAC operation result, and wherein the first portion of first data and the second portion of first data correspond to elements of a row of a weight matrix, and the first portion of second data and the second portion of second data correspond to elements of a column of a vector matrix.

12. A processing-in-memory (PIM) device comprising:

a plurality of memory banks including a left bank configured to store a first portion of first data composed of the first portion and a second portion and a right bank configured to store the second portion of the first data;

a first global buffer configured to store a first portion of second data composed of the first portion and a second portion;

a second global buffer configured to store the second portion of the second data; and a plurality of multiplication and accumulation (multiplication/accumulation) (MAC) operators configured to perform a MAC operation on the first data and the second data, wherein a first memory bank that is one of the memory banks and a first MAC operator that is one of the MAC operators constitute a MAC unit, wherein the left bank is positioned in a first region, and the right bank is positioned in a second region separated from the first region; and wherein the first MAC operator is configured to include:

a first multiplication-addition circuit configured to perform a first multiplication-addition operation on the first portion of the first data and the first portion of the second data to output first multiplication addition data;

a second multiplication-addition circuit configured to perform a second multiplication-addition operation on the second portion of the first data and the second portion of the second data to output second multiplication addition data;

an adder configured to add the first multiplication addition data and the second multiplication addition data to output third multiplication addition data; and an accumulator configured to accumulate and add the third multiplication addition data to output final MAC result data, and wherein the first portion of first data and the second portion of first data correspond to elements of a row of a weight matrix, and the first portion of second data and the second portion of second data correspond to elements of a column of a vector matrix.

13. The PIM device of claim 12, further comprising a data transmission line configured to connect the second multiplication-addition circuit positioned in the second region to the adder positioned in the first region.

14. The PIM device of claim 12,
wherein the first global buffer is configured to transmit the first portion of the second data to the first multiplication-addition circuit through a first global input and output (input/output) line allocated in the first region, and
wherein the second global buffer is configured to transmit the second portion of the second data to the second multiplication-addition circuit through a second global input/output line allocated in the second region.

15. The PIM device of claim 14,
further comprising interfaces configured to perform data transmission between an external device and the storage regions,
wherein the interfaces include:
a first interface allocated in the first region and including a data input/output circuit configured to perform data transmission between the left bank and the external device; and
a second interface allocated in the second region and including a data input/output circuit configured to perform data transmission between the right bank and the external device.

16. A processing-in-memory (PIM) device comprising:
a data storage region including a memory bank configured to store first and second data, the first data and the second data are separated into a first portion and a second portion, respectively, the memory bank including a left bank storing the first portion of the first data and a right bank storing the second portion of the first data; and
an arithmetic circuit configured to perform multiplication and accumulation (multiplication/accumulation) (MAC) operations on the first data and the second data,
wherein the arithmetic circuit includes:
a first MAC operator configured to perform a first MAC operation on the first portion of the first data and the first portion of the second data to output first MAC result data;
a second MAC operator configured to perform a second MAC operation on the second portion of the first data and the second portion of the second data to output second MAC result data; and
an addition circuit configured to sum the first MAC result data from the first MAC operator and the second MAC result data from the second MAC operator to output third MAC result data, and
wherein the first portion of first data and the second portion of first data correspond to elements of a row of a weight matrix, and the first portion of second data and the second portion of second data correspond to elements of a column of a vector matrix.

17. The PIM device of claim 16,
wherein the data storage region further includes, a first global buffer and a second global buffer,
wherein the first global buffer stores the first portion of the second data, and
wherein the second global buffer stores the second portion of the second data.

18. The PIM device of claim 16,
wherein the first MAC operator is configured to include:
a first operation block configured to perform a first multiplication-addition operation on the first portion of the first data and the first portion of the second data to output first multiplication addition data;
a first accumulating adder configured to output first MAC result data generated by adding first feedback data to the first output data from the first operation block; and
a first latch circuit configured to receive and latch the first MAC result data from the first accumulating adder, and configured to provide the MAC result data to the first accumulating adder as the first feedback data.

19. The PIM device of claim 16,
wherein the second MAC operator is configured to include:
a second operation block configured to perform a second multiplication-addition operation on the second portion of the first data and the second portion of the second data to output second multiplication addition data;
a second accumulating adder configured to output second MAC result data generated by adding second feedback data to the second output data from the second operation block; and
a second latch circuit configured to receive and latch the second MAC result data from the second accumulating adder, and configured to provide the MAC result data to the second accumulating adder as the second feedback data.

20. The PIM device of claim 16,
further comprising first and second global input and output (input/output) lines,
wherein the addition circuit is configured to receive the first MAC result data from the first MAC operator through the first global input/output line, and receive the second MAC result data from the second MAC operator through the second global input/output line.

21. The PIM device of claim 16,
wherein the addition circuit is configured to include:
a data input unit including a first latch configured to receive and latch the first MAC result data from the first MAC operator, and a second latch configured to receive and latch the second MAC result data from the second MAC operator;
an adder configured to receive the first MAC result data transmitted from the first latch and the second MAC result data transmitted from the second latch, and configured to perform an addition operation to output the third MAC result data; and
a data output unit including a third latch configured to receive and latch the third MAC result data transmitted from the adder.

* * * * *